United States Patent
Fukagai

(10) Patent No.: US 6,647,044 B2
(45) Date of Patent: Nov. 11, 2003

(54) SEMICONDUCTOR LIGHT-EMITTING DEVICE WITH AN IMPROVED RIDGE WAVEGUIDE STRUCTURE AND METHOD OF FORMING THE SAME

(75) Inventor: Kazuo Fukagai, Tokyo (JP)

(73) Assignee: NEC Corporation, Tokyo (JP)

(*) Notice: Subject to any disclaimer, the term of this patent is extended or adjusted under 35 U.S.C. 154(b) by 247 days.

(21) Appl. No.: 09/928,446

(22) Filed: Aug. 14, 2001

(65) Prior Publication Data

US 2002/0037022 A1 Mar. 28, 2002

(30) Foreign Application Priority Data

Aug. 14, 2000 (JP) .......................... 2000-245834

(51) Int. Cl.[7] .............................. H01S 5/00; H01L 21/00
(52) U.S. Cl. ................................ 372/46; 372/45; 438/22
(58) Field of Search ...................... 372/46, 45; 438/22

(56) References Cited

U.S. PATENT DOCUMENTS 5,151,913 A * 9/1992 Ueno ........................... 372/46
6,373,875 B1 * 4/2002 Yu et al. ...................... 372/46

FOREIGN PATENT DOCUMENTS

| JP | A 4-37083 | 2/1992 |
| JP | A 6-152063 | 5/1994 |
| JP | A 7-30198 | 1/1995 |

* cited by examiner

Primary Examiner—Quyen Leung
(74) Attorney, Agent, or Firm—Young & Thompson

(57) ABSTRACT

The present invention provides a ridge waveguide structure of a cladding layer in a semiconductor light emitting device. The ridge waveguide structure comprises: at least a current injection region; and current non-injection regions adjacent to facets and separating the current injection region from the facets, wherein the current non-injection regions are smaller in height than the at least current injection region, and wherein the at least current injection region and the current non-injection regions have a uniform width at least at a lower level than an intermediate level of the ridge waveguide structure.

53 Claims, 33 Drawing Sheets

SEMICONDUCTOR LIGHT-EMITTING DEVICE WITH AN IMPROVED RIDGE WAVEGUIDE STRUCTURE AND METHOD OF FORMING THE SAME

BACKGROUND OF THE INVENTION

1. Field of the Invention

The present invention relates to a semiconductor light-emitting device and a method of forming the same, and more particularly to a semiconductor laser device with a stripe-shaped mesa structure including a current injection center region and current non-injection side regions adjacent to facets and a method of forming the same.

2. Description of the Related Art

There has been known a semiconductor laser device with a stripe-shaped mesa structure including a current injection center region and current non-injection side regions adjacent to facets, wherein the current non-injection side regions are provided in order to avoid optical damages at the facets. The semiconductor device of this type will hereinafter be referred to as a facet non-injection type semiconductor laser.

FIG. 1 is a fragmentary schematic perspective view with a partially recessed view illustrative of a typical conventional internal structure of a facet non-injection type semiconductor laser. The semiconductor laser has an optical cavity which has a stripe-shaped ridge waveguide structure. The semiconductor laser is provided over an n-type semiconductor substrate 1.

An n-type cladding layer 2 overlies the n-type semiconductor substrate 1. An n-type etching stopper layer 3 overlies the n-type cladding layer 2. An n-type inner cladding layer 4 overlies the n-type etching stopper layer 3. An SCH-structure 5 including an active layer is provided over the n-type inner cladding layer 4. A p-type inner cladding layer 6 overlies the SCH-structure 5. A p-type etching stopper layer 7 overlies the p-type inner cladding layer 6. A stripe-shaped ridge optical waveguide of a p-type cladding; layer 8 is selectively provided on a stripe-shaped selected region of an upper surface of the p-type etching stopper layer 7. The stripe-shaped ridge optical waveguide extends in a longitudinal direction of the semiconductor laser.

A p-type cap layer 9 is selectively provided on a selected center region, except on both side regions adjacent to both facets, of the stripe-shaped ridge optical waveguide of the p-type cladding layer 8. A first current blocking layer 10 of n-type is provided over the both side regions of the stripe-shaped ridge optical waveguide, and over the p-type etching stopper layer 7 as well as in contact with side walls of the stripe-shaped ridge optical waveguide of the p-type cladding layer 8. The first current blocking layer 10 extends except over the p-type cap layer 9 selectively provided on the upper surface of the selected center region of the stripe-shaped ridge optical waveguide. A second current blocking layer 11 of n-type overlies the first current blocking layer 10.

A p-type contact layer 12 overlies the second current blocking layer 11 and the p-type cap layer 9. An n-electrode 13 is provided in contact width a bottom surface of the n-type semiconductor substrate 1. A p-electrode 14 is provided in contact with a top surface of the p-type contact layer 12. A current or carrier is injected through the p-type cap layer 9 and the selected center region of the stripe-shaped ridge optical waveguide 8 into the active layer of the SCH-structure 5. The first and second current blocking layers 10 and 11 prevent current injections directly into the both side regions of the stripe-shaped ridge optical waveguide 8 adjacent to the bot facets.

The selected center region of the stripe-shaped ridge optical waveguide 8 may be regarded as a current injection region. The side regions of the stripe-shaped ridge optical waveguide 8 covered by the first and second current blocking layers 10 and 11 may be regarded as current non-injection regions. The current is directly injected through the p-type cap layer 9 into the current injection region, and the injected current is then diffused into the current non-injection regions underlying laminations of the first and second current blocking layers 10 and 11.

Parts of the diffusion currents in in-plane directions through the current non-injection regions are supplied to the both facets. Namely, parts of the diffusion currents in parallel to the longitudinal direction reach the opposite facets. The stripe-shaped ridge optical waveguide 8 has a sheet resistance to currents in parallel to the longitudinal direction toward the opposite facets, wherein the longitudinal direction is parallel to a traveling direction of the stripe-shaped ridge optical waveguide 8. As this sheet resistance is high, then a density of the injection current to the facet is low. As the density of the injection current to the facet is low, then a Joule heat generated per a unit time is low. The generated heat is low, then a temperature increase at the facets is low. This contributes to delay a deterioration of the facets due to optical damages upon a high output operation.

Meanwhile, it has also been known that in order to obtain a high output of the semiconductor laser, the ridged waveguide is designed to increase, the thickness for obtaining a large spot size. In order to avoid the increase in resistance of the device upon the increase in thickness of the ridged waveguide, the ridged waveguide is also designed to increase a doping concentration for reducing a resistivity of the ridged waveguide. The increase in doping concentration of the ridged waveguide decreases a sheet resistance of the current non-injection regions of the ridged waveguide. The decreased sheet resistance of the current non-injection regions increases the density of the current through the to the current non-injection regions toward the facets, whereby the Joule heat generated per a unit time is increased and the temperature increase at the facets is high. This promotes the deterioration of the facets due to optical damages upon a high output operation.

It has also been proposed to counter-measure this problem, wherein the current non-injection regions are decreased in height, whilst the current injection region is increased in height. FIG. 2 is a fragmentary schematic perspective view with a partially recessed view illustrative of a conventionally modified internal structure of the facet non-injection type semiconductor laser. A structural difference of the semiconductor laser shown in FIG. 2 from that shown in FIG. 1 is only in that the ridged waveguide 8 is modified height, so that the current injection region is larger in height or thickness than the current non-injection regions.

The modified ridged waveguide 8 of FIG. 2 may be formed by selective etching to the cladding layer only on the current non-injection regions prior to shaping the ridged waveguide. FIGS. 3A through 3E are fragmentary schematic views of semiconductor laser devices in sequential steps involved in the conventional fabrication method for the semiconductor laser device of FIG. 2.

With reference to FIG. 3A, an n-type cladding layer 2 is formed over the n-type semiconductor substrate 1. An n-type etching stopper layer 3 is formed over the n-type cladding layer 2, An n-type inner cladding layer 4 is formed over the n-typo etching stopper layer 3. An SCH-layer 5 including an active layer is formed over the n-type inner cladding layer 4, A p-type inner cladding layer 6 is formed over the SCH-layer 5. A p-type etching stopper layer 7 is formed over the p-type inner cladding layer 6. A p-type cladding layer 8 is formed over the p-type etching stopper layer 7. A p-type cap layer 9 is formed over the p-type cladding layer 8.

A silicon dioxide film 15 is selectively formed on a selected center region of an upper surface of the p-type cap layer 9 except on both side regions separated from each other by the selected center region in the longitudinal direction. The silicon dioxide film 15 is used as a mask for carrying out a selective etching to the p-type cap layer 9 and an upper region of the p-type cladding layer 8. A depth of the etching is an intermediate level of the p-type cladding layer 8, so that the p-type etching stopper layer 7 is covered by the p-type cladding layer 8.

With reference to FIG. 3B, an additional silicon dioxide film is formed entirely which covers the etched surfaces on the side regions of the p-type cladding layer 8, and the etched side walls of the upper region of the p-type cladding layer 8 and the p-type cap layer 9 as well as on the original silicon dioxide film 15. The silicon dioxide film is then selectively etched by a lithography technique to form a stripe-shaped silicon dioxide mask 15 which extends along a longitudinal center line and has a constant width. The stripe-shaped silicon dioxide mask 15 thus includes a center region 15a and side regions 15b which are separated from each other by the center region in the longitudinal direction. The center region 15a extends over the upper surface of the p-type cap layer 9. The side regions 15b extends over the etched surfaces on the side regions of the p-type cladding layer 8. The center region 15a has a higher level than the side regions 15b.

With reference to FIG. 3C, the p-type cap layer 9 is selectively etched by a wet etching process, so that the p-type cap layer 9 remains only under the center region 15a of the stripe-shaped silicon dioxide mask 15, and the top surface of the p-type cladding layer 8 is exposed, except under the remaining p-type cap layer 9 under the center region 15a of the stripe-shaped silicon dioxide mask 15. The wet etching process may be carried out by use of a first etchant which includes a mixture of a citric acid solution and a hydrogen peroxide at low mixing ratio. The remaining p-type cap layer 9 has a mesa stripe shape.

With reference to FIG. 3D, the p-type cladding layer 8 is selectively etched by a wet etching process, so that the p-type cladding layer 8 remains only under the center region 15a and the side regions 15b of the stripe-shaped silicon dioxide mask 15, and the top surface of the p-type etching stopper layer 7 is exposed, except under the remaining p-type cladding layer 8 under the stripe-shaped silicon dioxide mask 15. The wet etching process may be carried out by use of a second etchant which includes a mixture of a citric acid solution and a hydrogen peroxide at high mixing ratio. The remaining p-type cladding layer 8 also has a mesa stripe shape. The remaining p-type cap layer 9 receives a side etch by the second etchant. The mesa stripe shaped p-type cladding layer 8 forms a waveguide mesa structure.

With reference to FIG. 3E, the silicon dioxide film 15 is selectively removed so that the center region 15a remains over the remaining p-type cap layer 9.

As well illustrated in FIG. 3D, the mesa stripe shaped p-type cladding layer 8 comprises a center region 8a and side regions 8b separated from each other by the center region 8a. The center region 8a of the mesa stripe shaped p-type cladding layer 8 underlies the mesa-striped p-type cap layer 9 tinder the center region 15a of the stripe-shaped silicon dioxide mask 15. The side regions 8b of the mesa stripe shaped p-type cladding layer 8 underlie the side regions 15b of the stripe-shaped silicon dioxide mask 15. Not only, the center region 8a is larger in height than the side regions 8b, but also the center region 8a is wider in bottom width than the side regions 8b for the following reasons.

Before the second wet etching process, the p-type cladding layer 8 has different thicknesses as illustrated in FIG. 3C. The center region 8a of the p-type cladding layer 8 is thicker than the side regions 8b thereof, for which reason the center region 8a is larger in height than the side regions 8b. Further, the difference in height between the center region 8a and the side regions 8b results in that the side regions 8b are earlier removed to expose the top surface of the p-type etching stopper layer 7 on the center region, before the center region 8a is then removed to expose the top surface of the p-type etching stopper layer 7 on the side regions. Namely, on the side regions, the wet etching depth earlier reaches the top surface of the p-type etching stopper layer 7. After the wet etching depth has reached the top surface of the p-type etching stopper layer 7, then the side etching rate is increased. Therefore, the side regions 8b receive a larger side etch than the center region 8a. The side regions 8b become narrow as compared to the center region 8a.

Accordingly, the center region 8a is wider in width than the side regions 8b. The mesa stripe shaped p-type cladding layer 8 serving as the ridged waveguide has discontinuations in height and width at boundaries between the center region 8a and the side regions 8b. The center region 8a corresponds to a current injection region of the ridged waveguide. The side regions 8b correspond to current non-injection regions of the ridged waveguide.

The discontinuation in width at boundaries between the current injection center region 8a and the current non-injection side regions 8b causes a coupling loss at the boundaries in a horizontal waveguide mode. This coupling loss causes some disadvantages in high output operation of the laser device, for example, the increase of the oscillation threshold current and the drop of the slope efficiency.

Further, the discontinuation in height or height at boundaries between the current injection center region 8a and the current non-injection side regions 8b causes another coupling loss at the boundaries in a vertical waveguide mode. Notwithstanding, the reduction in height of the current non-injection side regions 8b reduces a Joule heat generation at the facets. In view of suppressing any excess coupling loss at the boundaries in a vertical waveguide mode, however, it is necessary to avoid any excess reduction in height of the current non-injection side regions 8b.

Furthermore, the discontinuations in both thickness or height and width at boundaries between the current injection center region 8a and the current non-injection side regions 8b cause that a difference in effective refractive index between inside and outside of the mesa structure of the waveguide 8 is different between on the current injection center region 8a and on the current non-injection side regions 8b. This difference causes the coupling loss at the boundaries in the horizontal waveguide mode. In view of suppressing any excess coupling loss at the boundaries in the horizontal waveguide mode, however, it is necessary to avoid any excess reduction in height of the current non-injection side regions 8b.

For the above-described reasons, there is a limitation to reduce the height of the current non-injection side regions 8b, although the reduction in the height of the current non-injection side regions 8b would be effective to suppress the Joule heat generation at the facets.

As long as the laser device has the above-described conventional waveguide structure, the emphasis of suppressing the Joule heat generation at the facets causes the coupling losses in the horizontal and vertical waveguide modes, and the disadvantages in high output operation of the laser device, for example, the increase of the oscillation threshold current and the drop of the slope efficiency.

In the above circumstances, the development of a novel semiconductor light emitting device free from the above problems is desirable.

SUMMARY OF THE INVENTION

Accordingly, it is an, object of the present invention to provide a novel semiconductor light emitting device free from the above problems.

It is a further object of the present invention to provide a novel semiconductor light emitting device having a ridge waveguide structure which comprises a current injection center region and current non-injection side regions which are smaller in height than the current injection center region, wherein the semiconductor light emitting device is free from the above problems.

It is a still further object of the present invention to provide a novel semiconductor light emitting device having a ridge waveguide structure which comprises a current injection center region and current non-injection side regions which are smaller in height than the current injection center region, wherein the ridge waveguide structure is capable of highly suppressing Joule beat generation at facets.

It is yet a further object of the present invention to provide a novel semiconductor light emitting device having a ridge waveguide structure which comprises a current injection center region and current non-injection side regions which are smaller in height than the current injection center region, wherein the ridge waveguide structure is capable of avoiding a substantial reduction in coupling loss in horizontal waveguide mode.

It is further more object of the present invention to provide a novel semiconductor light emitting device having a ridge waveguide structure which comprises a current injection center region and current non-injection side regions which are smaller in height than the current injection center region, wherein the ridge waveguide structure is capable of avoiding a substantial reduction in another coupling loss in vertical waveguide mode.

It is more over object of the present invention to provide a novel semiconductor light emitting device having a ridge waveguide structure which comprises a current injection center region and current non-injection side regions which are smaller in height than the current injection center region, wherein the ridge waveguide structure is capable of suppressing the oscillation threshold current.

It is still more object of the present invention to provide a novel semiconductor light emitting device having a ridge waveguide structure which comprises a current injection center region and current non-injection side regions which are smaller in height than the current injection center region, wherein the ridge waveguide structure is capable of suppressing the drop of the slope efficiency.

It is an additional object of the present invention to provide a novel method of forming a semiconductor light emitting device free from the above problems.

It is further additional object of the present invention to provide a novel method of forming a semiconductor light emitting device having a ridge waveguide structure which comprises a current injection center region and current non-injection side regions which are smaller in height than the current injection center region, wherein the semiconductor light emitting device is free from the above problems.

It is still further additional object of the present invention to provide a novel method of forming a semiconductor light emitting device having a ridge waveguide structure which comprises a current injection center region and current non-injection side regions which are smaller in height than the current injection center region, wherein the ridge waveguide structure is capable of highly suppressing Joule beat generation at facets.

It is yet further additional object of the present invention to provide a novel method of forming a semiconductor light emitting device having a ridge waveguide structure which comprises a current injection center region and current non-injection side regions which are smaller in height than the current injection center region, wherein the ridge waveguide structure is capable of avoiding a substantial reduction in coupling loss in horizontal waveguide mode.

It is further more additional object of the present invention to provide a novel method of forming a semiconductor light emitting device having a ridge waveguide structure which comprises a current injection center region and current non-injection side regions which are smaller in height than the current injection center region, wherein the ridge waveguide structure is capable of avoiding a substantial reduction in another coupling loss in vertical waveguide mode.

It is more over additional object of the present invention to provide a novel method of forming a semiconductor light emitting device having a ridge waveguide structure which comprises a current injection center region and current non-injection side regions which are smaller in height than the current injection center region, wherein the ridge waveguide structure is capable of suppressing the oscillation threshold current.

It is still more additional object of the present invention to provide a novel method of forming a semiconductor light emitting device having a ridge waveguide structure which comprises a current injection center region and current non-injection side regions which are smaller in height than the current injection center region, wherein the ridge waveguide structure is capable of suppressing the drop of the slope efficiency.

The present invention provides a ridge waveguide structure of a cladding layer in a semiconductor light emitting device. The ridge waveguide structure comprises: at least a current injection region; and current non-injection regions adjacent to facets and separating the current injection region from the facets, wherein the current non-injection regions are smaller in height than the at least current injection region, and wherein the at least current injection region and the current non-injection regions have a uniform width at least at a lower level than an intermediate level of the ridge waveguide structure.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTIONS OF THE PRESENT INVENTION

Figure 1:
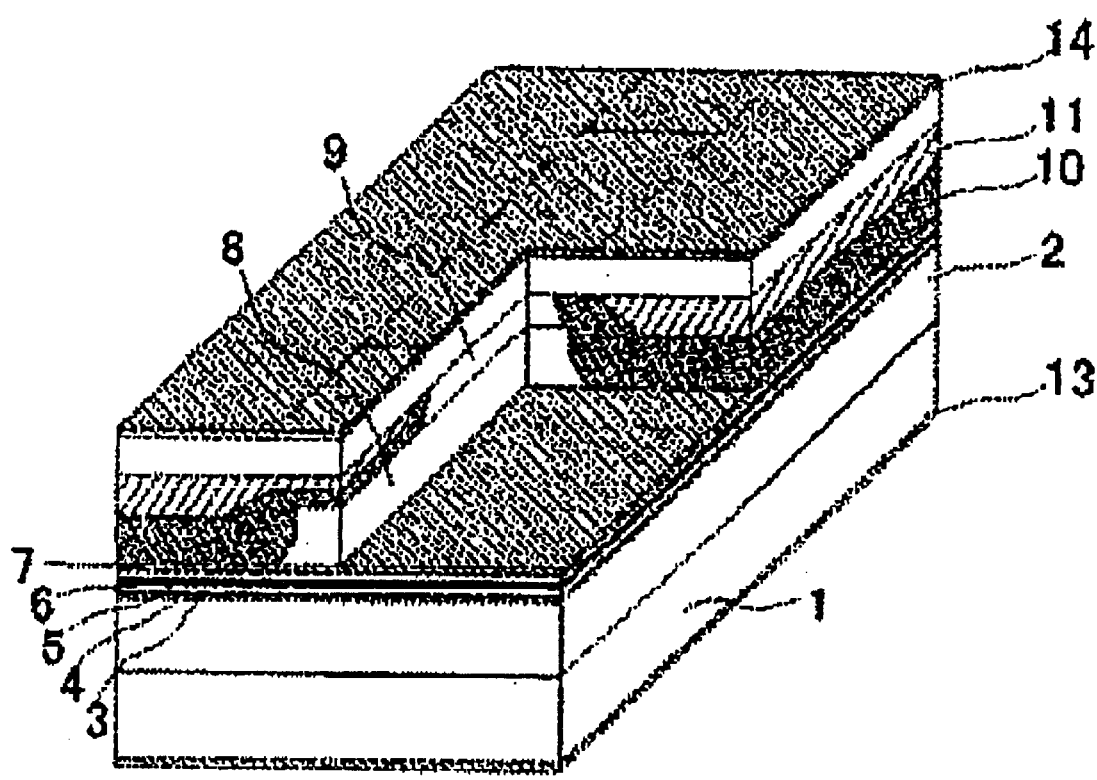
FIG. 1 is a fragmentary schematic perspective view with a partially recessed view illustrative of a typical conventional internal structure of a facet non-injection type semiconductor laser.
Figure 2:
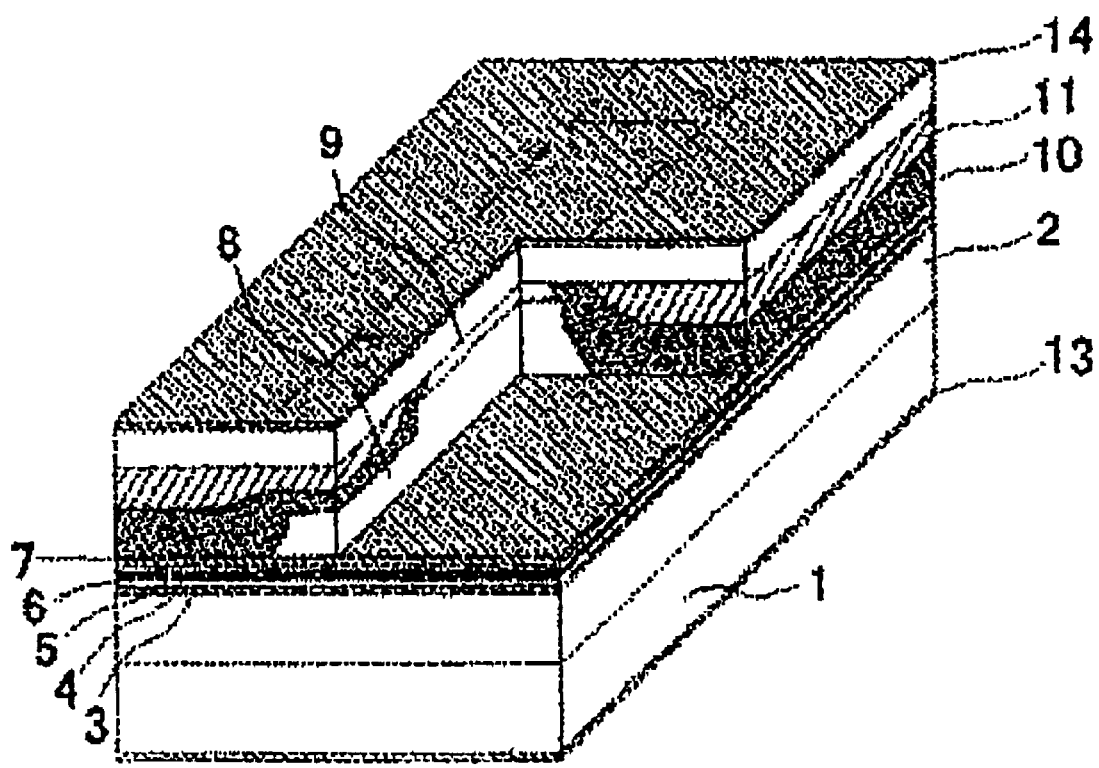
FIG. 2 is a fragmentary schematic perspective view with a partially recessed view illustrative of a conventionally modified internal structure of the facet non-injection type semiconductor laser.
Figure 3A:
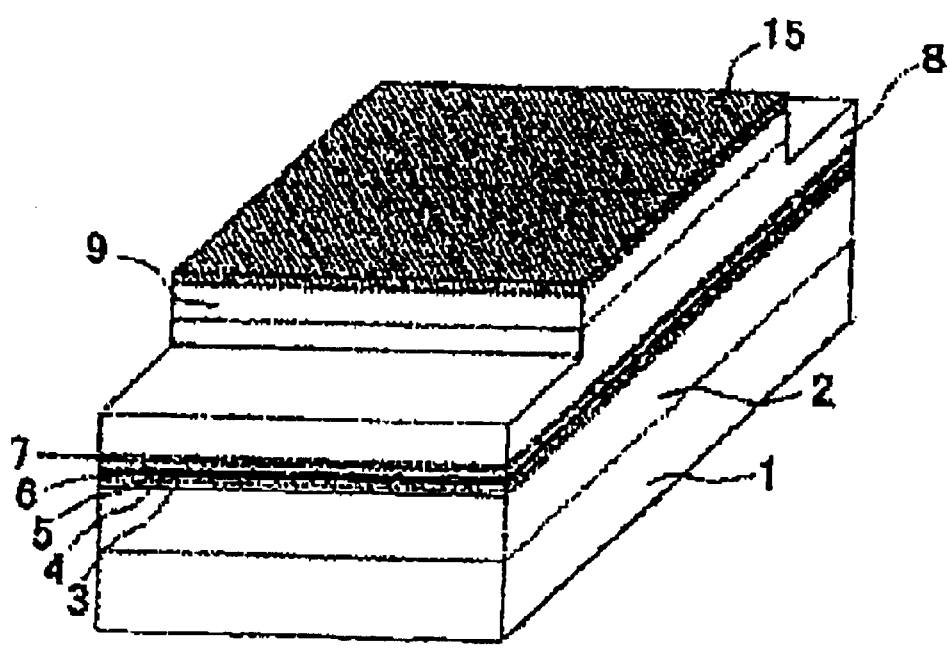
FIGS. 3A through 3E are fragmentary schematic views of semiconductor laser devices in sequential steps involved in the conventional fabrication method for the semiconductor laser device of FIG. 2.
Figure 3B:
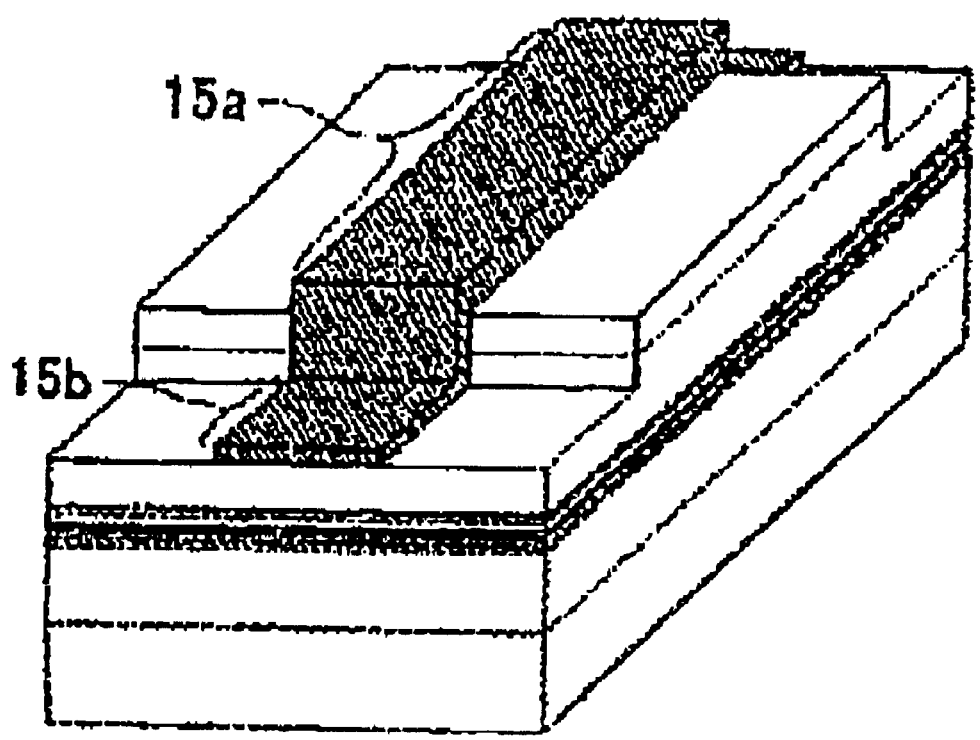
Figure 3C:
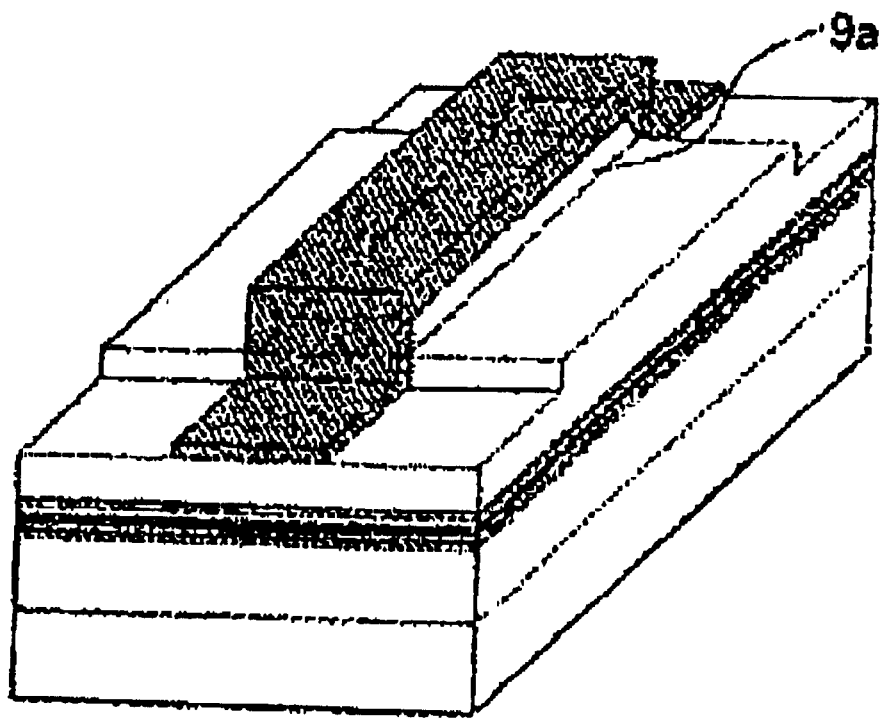
Figure 3D:
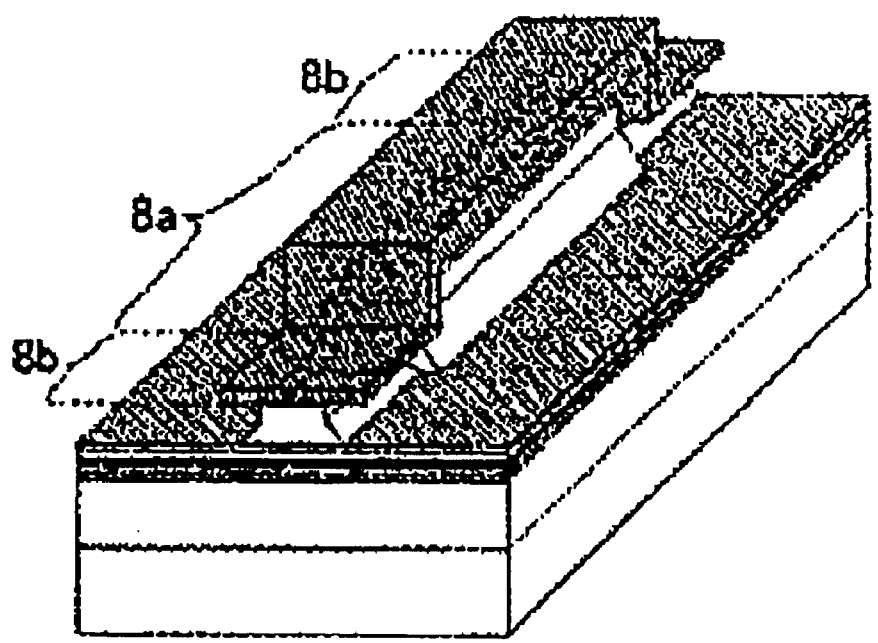
Figure 3E:
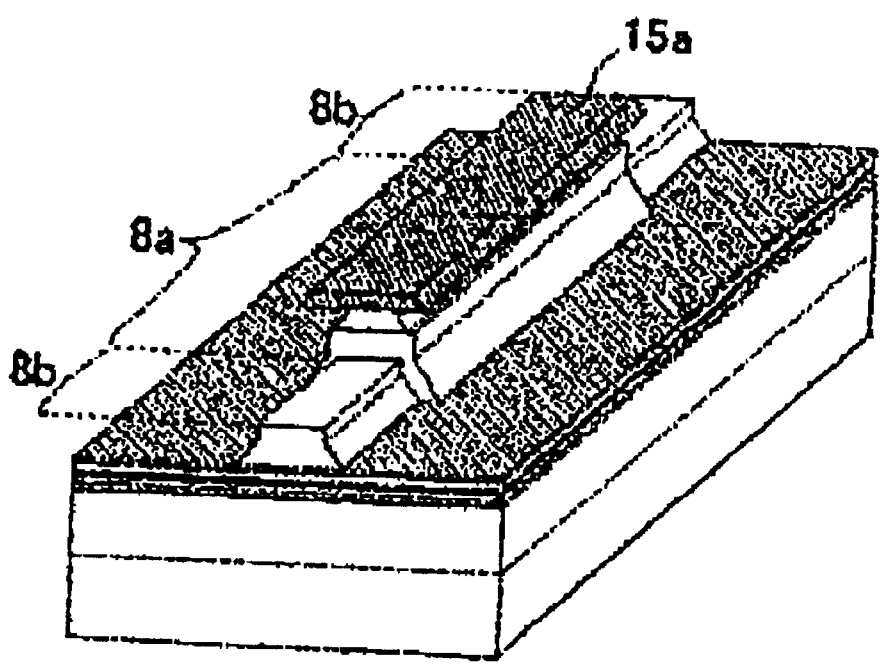

The present invention is to provide a ridge waveguide structure of a cladding layer in a semiconductor light emitting device. The ridge waveguide structure comprises: at least a current injection region; and current non-injection regions adjacent to facets and separating the current injection region from the facets, wherein the current non-injection regions are smaller in height than the at least current injection region, and wherein the at least current injection region and the current non-injection regions have a uniform width at least at a lower level than an intermediate level of the ridge waveguide structure, It is preferable that the lower level is a bottom level.

It is further preferable that the at least current injection region and the current non-injection side regions are substantially identical with each other in width from a bottom level to the intermediate level of the ridge waveguide structure.

It is further more preferable that the at least current injection region and the current non-injection side regions are substantially identical with each other in width from a bottom level to a top level of the ridge waveguide structure.

The above novel ridge waveguide structure has no difference in width between the current injection region and the current non-injection side regions. No difference in width causes no coupling loss at the boundaries in a horizontal waveguide mode. This no coupling loss does not cause any disadvantages in high output operation of the laser device. For example, no increase of the oscillation threshold current nor drop of the slope efficiency are caused.

Further, the above novel ridge waveguide structure has a difference in thickness or height at boundaries between the current injection region anti the current non-injection regions, wherein the current non-injection regions are smaller in thickness or height than the current injection region. The reduction in height of the current non-injection regions adjacent to the facets reduces a Joule heat generation at the facets. This structure is suitable for high output operation of the semiconductor light emitting device. This difference in thickness or height, however, causes another coupling loss in a vertical waveguide mode.

Notwithstanding, an undesirable influence of the coupling loss in the vertical waveguide mode due to the desired reduction in height of the current non-injection regions adjacent to the facets is much smaller than a desired effect of no coupling loss in the horizontal waveguide mode due to no difference in width at the bottom level between the current injection region and the current non-injection side regions.

The lower portion of the ridged waveguide structure is positioned closer to an active layer than the upper portion of the ridged waveguide structure, for which reason the undesirable influence to the coupling loss due to difference in at least one of width and level of the upper portion of the ridged waveguide structure is much smaller than the undesirable influence to the coupling loss due to difference in at least one of width and level of the lower portion of the ridged waveguide structure. In view of suppressing any excess coupling loss at the boundaries in a vertical waveguide mode, however, it is desirable to avoid any excess reduction in height of the current non-injection regions.

Therefore, the current non-injection side regions are smaller in height than the at least current injection region. This first structural definition provides a large desirable effect of reducing the Joule heat generation at the facets for allowing the semiconductor light emitting device to perform a desired high output operation. This first structural definition also provides an extremely small undesirable influence of causing an extremely small coupling loss in the horizontal waveguide mode.

Further, the at least current injection region and the current non-injection side regions are substantially identical with each other in width at least at a lower level than an intermediate level of the ridge waveguide structure. This second structural definition provides another large desirable effect of causing no coupling loss in the horizontal waveguide mode. Since the desirable effect of causing no coupling loss in the horizontal waveguide mode is much larger than the undesirable influence of causing an extremely small coupling loss in the horizontal waveguide mode, an increase in internal coupling loss of the ridge waveguide structure is extremely small.

In total, the above-described novel ridge waveguide structure provides the great effect of suppressing the Joule heat generation at the facets without any large increase in internal coupling loss, resulting in an effective suppression of the increase of the oscillation threshold current and another effective suppression of the drop of the slope efficiency.

It is preferable to apply the above-described novel ridge waveguide structure to a semiconductor light emitting device with a long cavity length, which performs a desired high output operation. If the semiconductor light emitting device is used as a laser device for optical writing operation, it is preferable that at least an active layer of the semiconductor light emitting device may comprise AlGaAs/GaAs based compound semiconductors. If the semiconductor light emitting device is used as a laser device for exciting an Er-doped fiber amplifier, it is preferable that at least an active layer of the semiconductor light emitting device may comprise a strained quantum well structure of InGaAs/GaAs based compound semiconductors.

In consideration of quantum efficiency in laser emission, the sizes of the ridge waveguide structure is preferably decided. If the laser device is of a single stripe type and a maximum optical output at 500 mW is desired, a stripe width of the ridge waveguide structure may be in the range of 1.5 micrometers to 4 micrometers, and more preferably in the range of 2 micrometers to 3.5 micrometers. A cavity length may be decided depending on the stripe width, for example, in the range of 700 micrometers to 1500 micrometers, and preferably in the range of 900 micrometers to 1200 micrometers.

The facets of the cavity may generally be formed by cleaving a wafer. A front facet, from which a laser beam is emitted, is coated with a low reflectance coat, so that the front facet may have a low reflection in the range of 1–5% and preferably 2–4%. A rear facet opposite to the front facet is coated with a high reflectance coat, so that the rear facet may have a high reflection in the range of 90–99% and preferably 95–99%.

The prevention of optical damages at the facets is one of the important issues for the high output semiconductor light emitting device. The optical damage is caused by a potentiating effect of a heat generation due to a non-radiative recombination at the facets and another heat generation due to an optical absorption at the facets. The former heat generation due to the non-radiative recombination is accelerated by increasing a junction temperature. To avoid the acceleration of the former beat generation, it is effective to suppress heat generation, for example, the Joule heat generation. In order to suppress the Joule heat generation, current non-injection regions are provided adjacent to the facets for suppressing current density at positions adjacent to the facets. The later heat generation due to the optical absorption at the facets is proportional to the optical absorption rate of the current non-injection regions adjacent to the facets. It is effective to control the current density in the current non-injection regions for preventing the contribution by the optical absorption between energy bands.

For realizing the high optical output, the current non-injection regions has a minority carrier density which is not largely below a threshold minority carrier density for obtaining a substantive gain at a high photon density under a condition of a sufficiently high current density of the current injection region separated by the current non-injection regions from the facets.

The ridge waveguide structure is provided over the active layer. The ridge waveguide structure comprises a striped mesa of a cladding layer. Current blocking layers are provided in both sides of the ridge waveguide structure and over the current non-injection regions of the ridge waveguide structure, so that the current is injected into only the current injection region. The injected current is then diffused to the current non-injection regions. Since both sides of the ridge waveguide structure are bounded with the current blocking layers, the both sides of the ridge waveguide structure have discontinuity in refractive index. Namely, there is a difference in refractive index between the ridge waveguide structure and the current blocking layers.

In addition, as described above, the current non-injection regions of the ridge waveguide structure are lower in height than the current injection region thereof, so that the current non-injection regions are higher in sheet resistance than the current injection region, thereby to limit diffused currents from the current injection region through the current non-injection regions to the facets.

The width of the ridge waveguide structure, particularly the bottom width thereof is uniform between the current injection region and the current non-injection regions. Namely, there is no difference in width, particularly bottom width between the current injection region and the current non-injection regions. Thus, there is no discontinuity in width, particularly bottom width at boundaries between the current injection region and the current non-injection regions. For those reasons, the ridge waveguide structure has substantially no coupling loss in the horizontal waveguide mode, even the difference in height or thickness between the current injection region and the current non-injection regions causes an extremely small coupling loss at the boundaries in the vertical waveguide mode.

The current non-injection regions, adjacent to the facets and lower in height than the current injection region, provide the effect of reducing the current density at the facets. Increasing the difference in height between the current non-injection regions and the current injection region emphasizes not only the desired effect of reducing the current density at the facets but also the undesired increase in the coupling loss in the vertical waveguide mode. It is, therefore, preferable to adjust the difference in height between the current non-injection regions and the current injection region in view of both emphasizing the desired effect of reducing the current density at the facets and suppressing the undesired increase in the coupling loss in the vertical waveguide mode.

There is a limitation to the ratio in length of the current non-injection regions adjacent to the facets to the total cavity length. Thus, under the acceptable range in the ratio in length of the current non-injection regions adjacent to the facets to the total cavity length, the difference in height between the current non-injection regions and the current injection region may preferably be decided in view of both emphasizing the desired effect of reducing the current density at the facets and suppressing the undesired increase in the coupling loss in the vertical waveguide mode.

Under the condition of fixing the difference in height between the current non-injection regions and the current injection region, the increase in resistivity of the ridge waveguide structure emphasizes the desired effect of reducing the current density at the facets, with the same effect of suppressing the undesired increase in the coupling loss in the vertical waveguide mode.

Under the other condition of obtaining the same magnitude of reducing the current density at the facets, the increase in resistivity of the ridge waveguide structure allows the reduction in the difference in height between the current non-injection regions and the current injection region with further increase in the effect of suppressing the undesired increase in the coupling loss in the vertical waveguide mode.

There is a large drift mobility between holes and electrons. Under the condition of a fixed doping concentration, the use of a p-type semiconductor is much larger in resistivity than an n-type semiconductor. For this reason, the use of a p-type semiconductor for the ridge waveguide structure allows the reduction in the height difference between the current non-injection regions and the current injection region with suppressing the undesired increase in the coupling loss in the vertical waveguide mode even under the other condition of obtaining the same magnitude of reducing the current density at the facets.

Preferably, the ridge waveguide structure may comprise a p-type cladding layer. Of course, the ridge waveguide structure may comprise an n-type cladding layer.

The ridge waveguide structure may comprise a singe cladding layer. It is also preferable that the ridge waveguide structure may comprise laminations of plural cladding layers, for example, double layered structures.

For example, the ridge waveguide structure may comprise laminations of lower and upper cladding layers, wherein the lower cladding layer is lower in doping concentration than the upper cladding layer, so that the lower cladding layer has a uniform thickness and the upper cladding layer is different in thickness between the current injection region, and the current non-injection regions, so as to increase the resistivity of the current non-injection regions of the ridge waveguide structure for reducing the current density at the facets, under the condition of fixing the difference in height between the current non-injection regions and the current injection region, with the same effect of suppressing the undesired increase in the coupling loss in the vertical waveguide mode.

For example, the ridge waveguide structure may comprise laminations of lower and upper cladding layers, wherein the lower cladding layer is higher in refractive index than the upper cladding layer, so that the lower cladding layer has a uniform thickness and the upper cladding layer is different in thickness between the current injection region and the current non-injection regions. The higher refractive index of the lower cladding layer dominates the lower refractive index of the upper cladding layer, for which reason the difference in effective refractive index between the current injection region and the current non-injection regions is reduced. As a result, under the other condition of obtaining the same magnitude of reducing the current density at the facets, the difference in effective refractive index between the current injection region and the current non-injection regions is reduced for suppressing the undesired increase in the coupling loss in the horizontal waveguide mode, thereby suppressing the increase in the oscillation threshold current and the drop of the slope efficiency.

A first aspect of the present invention is a ridge waveguide structure of a cladding layer in a semiconductor light emitting device. The ridge waveguide structure comprises: at least a current injection region; and current non-injection regions adjacent to facets and separating the current injection region from the facets, wherein the current non-injection regions are smaller in height than the at least current injection region, and wherein the at least current injection region and the current non-injection regions have a uniform width at least at a lower level than an intermediate level of the ridge waveguide structure.

It is preferable that the lower level is a bottom level. It is further preferable that the at least current injection region and the current non-injection regions are substantially identical with each other in width from a bottom level to the intermediate level of the ridge waveguide structure. It is further more preferable that the at least current injection region and the current non-injection regions are substantially identical with each other in width from a bottom level to a top level of the ridge waveguide structure.

It is also preferable that the ridge waveguide structure comprises laminations of lower and upper cladding layers, and the lower cladding layer is lower in doping concentration than the upper cladding layer, so that the lower cladding layer has a uniform thickness and the upper cladding layer on the current non-injection regions is smaller in thickness than the upper cladding layer on the current injection region.

It is also preferable that the current injection region of the ridge waveguide structure comprises laminations of lower and upper cladding layers, and the current non-injection regions of the ridge waveguide structure comprise the lower cladding layer, and the lower cladding layer is lower in doping concentration than the upper cladding layer.

It is also preferable that the ridge waveguide structure comprises laminations of lower and upper cladding layers, and the lower cladding layer is higher in refractive index than the upper cladding layer, so that the lower cladding layer has a uniform thickness and the upper cladding layer on the current non-injection regions is smaller in thickness than the upper cladding layer on the current injection region.

It is also preferable that the current injection region of the ridge waveguide structure comprises laminations of lower and upper cladding layers, and the current non-injection regions comprise the lower cladding layer, and the lower cladding layer is higher in refractive index than the upper cladding layer.

It is also preferable that the ridge waveguide structure comprises a single cladding layer.

It is also preferable that a height of the current non-injection regions is in a range of 40% to 70% of a height of the current injection region.

It is also preferable that a total length of the current non-injection regions is not more than 10% of a longitudinal length of the ridge waveguide structure.

It is also preferable to further comprises: a cap layer in contact with an upper surface of the at least current injection region; and a current blocking layer in contact with side walls of the ridge waveguide structure and also in contact with upper surfaces of the current non-injection regions.

It is also preferable that side walls of the ridge waveguide structure comprise non-flat surfaces with a curvature in a direction from a bottom to a top of the ridge waveguide structure. It is further preferable that the non-flat surfaces with the curvature are obtained by an isotropic etching.

It is also preferable that the ridge waveguide structure extends directly over a stripe-shaped selective region of an upper surface of an etching stopper layer.

This first aspect of the present invention has the same characteristics described above.

A second aspect of the present invention is a ridge waveguide structure of a cladding layer in a semiconductor light emitting device. The ridge waveguide structure extends directly over a stripe-shaped selective region of an upper surface of an etching stopper layer. The ridge waveguide structure comprises: at least a current injection region; and current non-injection regions adjacent to facets and separating the current injection region from the facets, wherein the current non-injection regions are smaller in height than the at least current injection region, and wherein the at least current injection region and the current non-injection regions are uniform in width from a bottom level to a top level of the ridge waveguide structure, so that side walls of the ridge waveguide structure are continuous and smooth at boundaries between the at least current injection region and the current non-injection side regions.

It is also preferable that the ridge waveguide structure comprises laminations of lower and upper cladding layers, and the lower cladding layer is lower in doping concentration than the upper cladding layer, so that the lower cladding layer has a uniform thickness and the upper cladding layer on the current non-injection regions is smaller in thickness than the upper cladding layer on the current injection region.

It is also preferable that the current injection region of the ridge waveguide structure comprises laminations of lower and upper cladding layers, and the current non-injection regions of the ridge waveguide structure comprise the lower cladding layer, and the lower cladding layer is lower in doping concentration than the upper cladding layer.

It is also preferable that the ridge waveguide structure comprises laminations of lower and upper cladding layers, and the lower cladding layer is higher in refractive index than the upper cladding layer, so that the lower cladding layer has a uniform thickness and the upper cladding layer on the current non-injection regions is smaller in thickness than the upper cladding layer on the current injection region.

It is also preferable that the current injection region of the ridge waveguide structure comprises laminations of lower and upper cladding layers, and the current non-injection regions comprise the lower cladding layer, and the lower cladding layer is higher in refractive index than the upper cladding layer.

It is also preferable that the ridge waveguide structure comprises a single cladding layer.

It is also preferable that a height of the current non-injection regions is in a range of 40% to 70% of a height of the current injection region.

It is also preferable that a total length of the current non-injection regions is not more than 10% of a longitudinal length of the ridge waveguide structure.

It is also preferable to further comprise: a cap layer in contact with an upper surface of the at least current injection region; and a current blocking layer in contact with side walls of the ridge waveguide structure and also in contact with upper surfaces of the current non-injection regions.

It is also preferable that side walls of the ridge waveguide structure comprise non-flat surfaces with a curvature in a direction from a bottom to a top of the ridge waveguide structure.

It is further preferable that the non-flat surfaces with the curvature are obtained by an isotropic etching.

This second aspect of the present invention has the same characteristics described above.

A third aspect of the present invention is a semiconductor light-emitting device which comprises: a substrate; a first multi-layered structure of a first conductivity type overlying the substrate; an active region overlying the first multi-layered structure; a second multi-layered structure of a second conductivity type overlying the active region; and at least a ridge waveguide structure of the second conductivity type overlying at least a stripe-shaped selective region of an upper surface of the second multi-layered structure, the at least ridge waveguide structure further comprising: at least a current injection region; and current non-injection regions adjacent to facets and separating the current injection region from the facets, wherein the current non-injection regions are smaller in height than the at least current injection region, and wherein the at least current injection region and the current non-injection regions have a uniform width at least at a lower level than an intermediate level of the ridge waveguide structure.

It is also preferable that the lower level is a bottom level. It is further preferable that the at least current injection region and the current non-injection regions are substantially identical with each other in width from a bottom level to the intermediate level of the ridge waveguide structure. It is further more preferable that the at least current injection region and the current non-injection regions are substantially identical with each other in width from a bottom level to a top level of the ridge waveguide structure.

It is also preferable that the ridge waveguide structure comprises laminations of lower and upper cladding layers, and the lower cladding layer is lower in doping concentration than the upper cladding layer, so that the lower cladding layer has a uniform thickness and the upper cladding layer on the current non-injection regions is smaller in thickness than the upper cladding layer on the current injection region.

It is also preferable that the current injection region of the ridge waveguide structure comprises laminations of lower and upper cladding layers, and the current non-injection regions of the ridge waveguide structure comprise the lower cladding layer, and the lower cladding layer is lower in doping concentration than the upper cladding layer.

It is also preferable that the ridge waveguide structure comprises laminations of lower and upper cladding layers, and the lower cladding layer is higher in refractive index than the upper cladding layer, so that the lower cladding layer has a uniform thickness and the upper cladding layer on the current non-injection regions is smaller in thickness than the upper cladding layer on the current injection region.

It is also preferable that the current injection region of the ridge waveguide structure comprises laminations of lower and upper cladding layers, and the current non-injection regions comprise the lower cladding layer, and the lower cladding layer is higher in refractive index than the upper cladding layer.

It is also preferable that the ridge waveguide structure comprises a single cladding layer.

It is also preferable that a height of the current non-injection regions is in a range of 40% to 70% of a height of the current injection region.

It is also preferable that a total length of the current non-injection regions is not more than 10% of a longitudinal length of the ridge waveguide structure.

It is also preferable to further comprises: a cap layer in contact with an upper surface of the at least current injection region; and a current blocking layer in contact with side walls of the ridge waveguide structure and also in contact with upper surfaces of the current non-injection regions.

It is also preferable that side walls of the ridge waveguide structure comprise non-flat surfaces with a curvature in a direction from a bottom to a top of the ridge waveguide structure. It is further preferable that the non-flat surfaces with the curvature arc obtained by an isotropic etching.

It is also preferable that the ridge waveguide structure extends directly over a stripe-shaped selective region of an upper surface of an etching stopper layer.

This third aspect of the present invention has the same characteristics described above.

The following detailed descriptions are made by taking a p-type cladding layer as one preferable example for the ridge waveguide structure of the semiconductor laser device. Notwithstanding, the following detailed descriptions may generally be applicable to another type semiconductor laser device with the ridge waveguide structure of an n-type cladding layer, provided that the conductivity types are inverted.

The ridge waveguide structure may comprise a stripe and mesa shaped p-type cladding layer, which further comprises a current injection center region and current non-injection side regions adjacent to the facets, wherein the current injection center region are separated from the facets by the current non-injection side regions. The ridge waveguide structure has a difference in height between the current injection center region and the current non-injection side regions, wherein the current non-injection side regions are lower in height than the current injection center region. The ridge waveguide structure has a uniformity in width between the current injection center region and the current non-injection side regions.

A p-type clap layer may selectively be provided on the upper surface of the current injection center region of the ridge waveguide structure, so that a current injection is made through the p-type clap layer to the current injection center region of the ridge waveguide structure.

A pair of n-type current blocking layers may be provided in contact with the both sides of the ridge waveguide structure and also with the upper surfaces of the current non-injection side regions as well as another both sides of the p-type cap layer, so that the both sides of the ridge waveguide structure and the upper surfaces of the current non-injection side regions as well as the both sides of the p-type cap layer are covered by the n-type current blocking layers. Preferably, the n-type current blocking layers may comprise buried layers with upper surfaces leveled to the upper surface of the p-type cap layer, so as to provide a plane surface.

A p-type contact layer may be provided over the plane surface, for example, over the upper surfaces of the n-type current blocking layers and the p-type cap layer. A p-electrode may be provided on the p-type contact layer. Preferably, the p-electrode is in contact with an entire surface of the p-type contact layer in order to ensure a possible largest contact area and reduce a contact resistance.

The front and rear facets may be formed by cleaving the wafer. Side walls of the semiconductor laser device may also be formed by cleaving the wafer.

The active layer underlies the ridge waveguide structure. A thickness of the active layer may preferably be so thin as to cause that a light generated by the active layer penetrates into the p-type cladding layer of the ridge waveguide structure for obtaining a large optical spot size. Alternatively, a separate confinement hetero-structure is preferable for obtaining a large optical spot size.

In addition, a p-type inner cladding layer may preferably be provided between the active layer and the ridge waveguide structure of the p-type cladding layer, wherein the inner cladding layer is thin and a difference in refractive index between the active layer and the inner cladding layer is smaller than another difference in refractive index between the active region and the ridge waveguide structure of the p-type cladding layer for the purpose of adjusting a peak waveform in a propagation mode and an optical penetration to the ridge waveguide structure of the p-type cladding layer.

A double hetero-structure may also be preferable, wherein a first active region of the separation confinement hetero-structure is interposed between an n-type inner cladding layer and an n-type cladding layer, and a second active region of the separation confinement hetero-structure is interposed between a p-type inner cladding layer and the ridge waveguide structure of the p-type cladding layer.

The active region may comprise either a single quantum well structure or a multiple quantum well structure for obtaining a high internal quantum efficiency. Optionally, the active region may comprise a strained quantum well structure for obtaining a higher internal quantum efficiency. For example, InGaAs/GaAs based compound semiconductors are available for the strained quantum well structure.

The p-type cladding layer may be shaped by etching process in stripe and mesa to form the ridge waveguide structure. For precise control to the etching depth, it is also preferable to provide a p-type etching stopper layer which underlies the p-type cladding layer. The etching is stopped when the upper surface of the etching stopper layer is exposed. It may be often that the p-type etching stopper layer comprises a semiconductor layer having a refractive index lower than the p-type cladding layer. This provides an influence to the optical penetration to the p-type cladding layer, for which reason it is preferable that the refractive indexes of the p-type and n-type inner cladding layers arc slightly increased for adjusting the optical penetration to the p-type cladding layer.

Further, in view of ensuring a symmetry, in addition to the above p-type etching stopper layer between the p-type cladding layer and the p-type inner cladding layer, it is preferable to provide an n-type etching stopper layer between the n-type cladding layer and the n-type inner cladding layer.

The ridge waveguide structure may comprise a singe cladding layer. It is also preferable that the ridge waveguide structure may comprise laminations of plural cladding layers, for example, double layered structures.

As a first modification, the ridge waveguide structure may comprise laminations of lower and upper cladding layers, wherein the lower cladding layer is lower in doping concentration than the upper cladding layer, so that the lower cladding layer has a uniform thickness and the upper cladding layer is different in thickness between the current injection region and the current non-injection regions, so as to increase the sheet resistance of the current non-injection regions of the ridge waveguide structure for reducing the current density at the facets, under the condition of fixing the difference in height between the current non-injection regions and the current injection region, with the same effect of suppressing the undesired increase in the coupling loss in the vertical waveguide mode.

Namely, the above double layered ridge waveguide structure allows a further large reduction of the current density at the facets, without increase in the coupling loss in the vertical waveguide mode. Alternatively, the above double layered ridge waveguide structure allows a reduction in difference in height between the current non-injection regions and the current injection region for reducing the coupling loss in the vertical waveguide mode, without increase of the current density at the facets.

There is a slight difference in refractive index between the upper and lower layers. There is substantially no difference in refractive index between the current injection region and the current non-injection regions, for which reason the n-type cladding layer may have a uniform doping concentration. As a result, a large effect of suppressing the current density at the facets can be obtained, without increase in the threshold oscillation current and also without drop of the slope efficiency.

As a second modification, the ridge waveguide structure may comprise laminations of lower and upper cladding layers, wherein the lower cladding layer is higher in refractive index than the upper cladding layer, so that the lower cladding layer has a uniform thickness and the upper cladding layer is different in thickness between the current injection region and the current non-injection regions. The higher refractive index of the lower cladding layer dominates the lower refractive index of the upper cladding layer, for which reason the difference in effective refractive index between the current injection region and the current non-injection regions is reduced. As a result, under the other condition of obtaining the same magnitude of reducing the current density at the facets, the difference in effective refractive index between the current injection region and the current non-injection regions is reduced for suppressing the undesired increase in the coupling loss in the horizontal waveguide mode, thereby suppressing the increase in the oscillation threshold current and the drop of the slope efficiency. As a result, a large effect of suppressing the current density at the facets can be obtained, without increase in the threshold oscillation current and also without drop of the slope efficiency.

The higher refractive index of the lower cladding layer dominates the lower refractive index of the upper cladding layer. Namely, the effective refractive index of the ridge waveguide structure depends mainly on the higher refractive index of the lower cladding layer. The influence by the difference in thickness of the upper cladding layer is small. It is, however, preferable that the higher refractive index of the lower cladding layer is not higher than the refractive index of the p-type inner cladding layer, so that the effective refractive index of the ridge waveguide structure of the p-type cladding layer is lower than the refractive index of the p-type inner cladding layer. This does not present the formation of the LOC-structure.

In case of the second modification, in order to keep a symmetry, it is preferable that the n-type cladding layer may comprise a double layered structure, for example, upper and lower cladding layers, wherein the upper cladding layer is higher in refractive index than the lower cladding layer.

As a third modification, the ridge waveguide structure may comprise laminations of lower and upper cladding layers, wherein the lower cladding layer is higher in refractive index than the upper cladding layer, and the so that the lower cladding layer is lower in doping concentration than the upper cladding layer, lower cladding layer has a uniform thickness and the upper cladding layer is different in thickness between the current injection region and the current non-injection regions. In this case, the multiplying effects of the former effect given by the first modification and the later effect given by the second modification can be obtained. Namely, a very large effect of suppressing the current density at the facets can be obtained, without increase in the threshold oscillation current and also without drop of the slope efficiency.

The following further detailed description will focus on the difference in height between the current injection region and the current non-injection regions of the ridge waveguide structure.

The height of the current injection region of the ridge waveguide structure may be decided so that a quantity of light seeped out of the active layer is not less than about 15% of the total light quantity. It is preferable that a quantity of light penetrated into the current injection region of the ridge waveguide structure is in the range of 20–30% of the total light quantity, and a quantity of light confined in the active region is in the range of 60–40% of the total light quantity.

A lower limit of the height of the current injection region of the ridge waveguide structure depends on the thickness and refractive index of the active region, and the refractive index of the p-type cladding layer for the ridge waveguide structure, as well as on the difference in refractive index between the active region and the p-type cladding layer for the ridge waveguide structure. The height of the current injection region of the ridge waveguide structure may be increased in view of an acceptable range of a series resistance which depends on the height thereof, unless the height is below the lower limit. It is, of course, desirable for the high output operation to reduce the series resistance. In this viewpoint, it is preferable that the height of the current injection region of the ridge waveguide stricture may be set just on the lower limit or slightly larger than the lower limit.

An operation of the laser device generates a heat. This heat may be radiated from a p-electrode. An excess increase in the thickness or height of the current injection region of the ridge waveguide structure of the p-type cladding layer reduces a heat conductance efficiency or a heat radiation efficiency. In this viewpoint of heat radiation, it is preferable that the height of the current injection region of the ridge waveguide structure may be set just on the lower limit or slightly larger than the lower limit. If, for example, the active region comprises the single confinement hetero-structure including the quantum well structure and further the n-type inner cladding layer and the p-type inner cladding layer are provided, and further it if the p-type cladding layer for the ridge waveguide structure comprises $Al_{0.315}Ga_{0.685}As$, then it is preferable the height of the current injection region may be set in the range of 1.0 micrometer to 3.0 micrometers, so that the quantity of light penetrated into the current injection region of the ridge waveguide structure is in the range of 15–30% of the total light quantity.

For the following more general descriptions, the active region including the inner cladding layer is approximated to a single layer having a thickness of 0.5 micrometers and having a uniform refractive index for calculating a propagation light mode, wherein etching stopper layers and cladding layers are further provided symmetrically. The etching stopper layer has a refractive index which is lower than that of the cladding layer. A difference in refractive index between the etching stopper layer and the cladding layer is, for example, $7.8 \times 10^{-3}$. A difference in refractive index between the active region and the cladding layer is $3.6 \times 10^{-3}$. Under the above conditions, if the thickness of the cladding layer is not less than 2.6 micrometers, then 25% of the total light quantity penetrates into each of the cladding layers. A difference in refractive index between the active region and the cladding layer is $3.2 \times 10^{-3}$. Under the above conditions, if the thickness of the cladding layer is not less than 2.2 micrometers, then 25% of the total light quantity penetrates into each of the cladding layers. Accordingly, with reference to the lower limits to the thicknesses of the respective cladding layers, the height of the ridge waveguide structure or the thickness of the p-type cladding layer for the ridge waveguide structure may be decided.

In accordance with the present invention, as described above, the height of the current non-injection regions of the ridge waveguide structure is lower than the height of the current injection region thereof. If 15–30% of the total light quantity penetrate into the current injection region of the ridge waveguide structure, then the height of the current non-injection regions is preferably not less than 40%, and more preferably not less than 50% of the height of the current injection region for suppressing the coupling loss in the vertical waveguide mode into about 5%.

In view of suppressing the diffusion currents through the current non-injection regions to the facets, the height of the current non-injection regions is preferably not more than 70%, and more preferably not more than 60% of the height of the current injection region.

As described above, for suppressing the diffusion currents through the non-injection regions to the facets with fixing the difference in height between the non-injection regions and the current injection region in the above acceptable range, it is preferable that the ridge waveguide layer comprises the double layered structure of laminations of lower and tipper cladding layers, wherein the lower cladding layer is lower in doping concentration than the upper cladding layer, so that the lower cladding layer has a uniform thickness and the upper cladding layer is different in thickness between the current injection region and the current non-injection regions. The thickness of the lower cladding layer is preferably not more than 50%, and more preferably not more than 40% of the total thickness of the tipper and lower cladding layers.

The ridge waveguide structure may comprise laminations of lower and upper cladding layers, wherein the lower cladding layer is higher in refractive index than the upper cladding layer, so that a majority of the light as penetrated into the ridge waveguide is likely to be present in the lower cladding layer. Therefore, it is preferable that the lower cladding layer has a uniform thickness and the upper cladding layer is different in thickness between the current injection region and the current non-injection regions. The higher refractive index of the lower cladding layer dominates the lower refractive index of the upper cladding layer, for which reason the difference in effective refractive index between the current injection region and the current non-injection regions is reduced. The thickness of the lower cladding layer is preferably not more than 50%, and more preferably not more than 40% of the total thickness of the upper and lower cladding layers.

The longitudinal lengths of the current non-injection regions of the ridge waveguide structure may be decided so as to obtain a desired low current density at the facets. The longitudinal lengths of the current non-injection regions of the ridge waveguide structure may be decided depending on the ratio in height of the current non-injection regions to the current injection region. The current non-injection regions gave low current densities, for which reason the current non-injection regions provide slight gains. It is preferable that a total length of the current non-injection regions is not more than 10% of the total length of the cavity defined to be a distance between the facets. It is more preferable that the both current non-injection regions have the same length and the total length of the current non-injection regions is not more than 10% of the total length of the cavity. If the cavity length is 1000 micrometers, the length of each of the current non-injection regions is not more than 50 micrometers and not less than 10 micrometers.

The above semiconductor laser device with the improved ridge waveguide structure may be fabricated as follows. The fabrication method for the novel semiconductor laser device is generally similar to the conventional fabrication method for the conventional semiconductor laser device with the conventional ridge waveguide structure. A difference of the novel fabrication method for the novel semiconductor laser device from the conventional fabrication method for the conventional semiconductor laser device is in the novel process for forming the improved ridge waveguide structure.

Prior to forming the improved ridge waveguide structure, the lamination structures over the substrate have been formed in the conventional processes under the conventional conditions. The processes after having formed the improved ridge waveguide structure are the same as the conventional processes under the conventional conditions.

The following descriptions will focus on the novel process for forming the ridge waveguide structure.

A fourth aspect of the present invention is a method of forming a ridge waveguide structure. The method comprises the following steps. A first etching mask is formed selectively on a first selected region of an upper surface of a cap layer overlying at least a cladding layer. The first selected region is separated by side regions adjacent to opposite edges distanced in a cavity length direction. The cap layer is selectively removed by using the first etching mask, so that the cap layer remains only on the first selected region, and an upper surface of the at least cladding layer is partially exposed on the side regions adjacent to the opposite edges. A second etching mask is formed, which overlying a stripe-shaped longitudinal center region extending through the remaining cap layer and the at least cladding layer, so that the upper surfaces of the remaining cap layer and the at least cladding layer are partially exposed on other side regions adjacent to other opposite edges distanced in a lateral direction perpendicular to the cavity length direction. The remaining cap layer is selectively removed by using the second etching mask, so that the cap layer remains only on a first overlapping region of the first selected region and the stripe-shaped longitudinal center region. The at least cladding layer only on the other side regions is selectively removed by using the second etching mask, so that the at least cladding layer becomes comprising a mesa structure portion on the stripe-shaped longitudinal center region and flat thickness-reduced portions on the other side regions, the mesa structure portion having a first height higher than a second height of the flat thickness-reduced portions. A third etching mask is formed, which overlying on the first overlapping region, so that an upper surface of the mesa structure portion i exposed, except under the cap layer on the first overlapping region. The at least cladding layer is selectively removed by using the third etching mask, so that the at least cladding layer remains only on the stripe-shaped longitudinal center region, and the mesa structure portion is selectively reduced in thickness except under the cap layer, whereby the remaining cladding layer comprises a mesa structure having a uniform bottom width, and the mesa structure comprising a current injection region having the first height and current non-injection regions having a third height lower than the first height.

It is preferable that the at least cladding layer overlies an etching stopper layer, and the step of selectively removing the at least cladding layer by using the third etching mask comprises an isotropic etching to the at least cladding layer, and an etching depth of the isotropic etching is defined an upper surface of the etching stopper layer.

It is further preferable that the at least cladding layer comprises laminations of lower and upper cladding layers, and the lower cladding layer is lower in doping concentration than the upper cladding layer, and that the isotropic etching is stopped not to etch the lower layer on the stripe-shaped longitudinal center region, so that the lower cladding layer has a uniform thickness and the upper cladding layer on the current non-injection regions is smaller in thickness than the upper cladding layer on the current injection region.

It is also preferable that the at least cladding layer comprises laminations of lower and upper cladding layers, and the lower cladding layer is higher in refractive index than the upper cladding layer, and that the isotropic etching is stopped not to etch the lower layer on the stripe-shaped longitudinal center region, so that the lower cladding layer has a uniform thickness and the upper cladding layer on the current non-injection regions is smaller in thickness than the upper cladding layer on the current injection region.

A fifth aspect of the present invention is a method of forming a ridge waveguide structure. The method comprises the following steps. A first etching mask is formed on a stripe-shaped longitudinal center region of an upper surface of a cap layer overlying at least a cladding layer. The stripe-shaped longitudinal center region extends between first opposite edges distanced from each other in a cavity length direction, and the stripe-shaped longitudinal center region being separated by side regions adjacent to second opposite edges, which are parallel to a cavity length direction and which are distanced from each other in a lateral direction perpendicular to the cavity length direction. The cap layer and the at least cladding layer are selectively removed by using the first etching mask, so that the cap layer remains only on the stripe-shaped longitudinal center region, and a thickness of the at least cladding layer on the side regions is reduced, whereby the at least cladding layer becomes comprising a mesa structure portion on the stripe-shaped longitudinal center region and flat thickness-reduced portions on the side regions, the mesa structure portion having a first height higher than a second height of the flat thickness-reduced portions. A second etching mask is formed, which overlying a first overlapping region of the stripe-shaped longitudinal center region and a first selected region being separated by other side regions adjacent to the first opposite edges distanced in the cavity length direction. The remaining cap layer is selectively removed by using the second etching mask, so that the cap layer remains only on the first overlapping region. The at least cladding layer is selectively removed by using the second etching mask, so that the at least cladding layer remains only on the stripe-shaped longitudinal center region, and the mesa structure portion is selectively reduced in thickness except under the cap layer, whereby the remaining cladding layer comprises a mesa structure having a uniform bottom width, and the mesa structure comprising a current injection region having the first height and current non-injection regions having a third height lower than the first height.

It is preferable that the at least cladding layer overlies an etching stopper layer, and the step of selectively removing the at least cladding layer by using the third etching mask comprises an isotropic etching to the at least cladding layer, and an etching depth of the isotropic etching is defined an upper surface of the etching stopper layer.

It is also preferable that the at least cladding layer comprises laminations of lower and upper cladding layers, and the lower cladding layer is lower in doping concentration than the upper cladding layer, and that the isotropic etching is stopped not to etch the lower layer on the stripe-shaped longitudinal center region, so that the lower cladding layer has a uniform thickness and the upper cladding layer on the current non-injection regions is smaller in thickness than the upper cladding layer on the current injection region.

It is also preferable that the at least cladding layer comprises laminations of lower and upper cladding layers, and the lower cladding layer is higher in refractive index than the upper cladding layer, and that the isotropic etching is stopped not to etch the lower layer on the stripe-shaped longitudinal center region, so that the lower cladding layer has a uniform thickness and the upper cladding layer on the current non-injection regions is smaller in thickness than the upper cladding layer on the current injection region.

A sixth aspect of the present invention is a method of forming a ridge waveguide structure. The method comprises the following steps. A first etching mask is formed on a stripe-shaped longitudinal center region of an upper surface of a cap layer overlying at least a cladding layer. The stripe-shaped longitudinal center region extends between first opposite edges distanced from each other in a cavity length direction, and the stripe-shaped longitudinal center region is separated by side regions adjacent to second opposite edges, which are parallel to a cavity length direction and which are distanced from each other in a lateral direction perpendicular to the cavity length direction. The cap layer is selectively removed by using the first etching mask, so that the cap layer remains only on the stripe-shaped longitudinal center region. A second etching mask is formed, which overlying a first overlapping region of the stripe-shaped longitudinal center region and a first selected region being separated by other side regions adjacent to the first opposite edges distanced in the cavity length direction. The remaining cap layer and the at least cladding layer are selectively removed by using the second etching mask, so that the cap layer remains only on the first overlapping region, and a thickness of the at least cladding layer on the side regions is reduced, whereby the at least cladding layer becomes comprising a mesa structure portion on the stripe-shaped longitudinal center region and flat thickness-reduced portions on the side regions, the mesa structure portion having a first height higher than a second height of the flat thickness-reduced portions The at least cladding layer is further selectively removed by using the second etching mask, so that the at least cladding layer remains only on the stripe-shaped longitudinal center region, and the mesa structure portion is selectively reduced in thickness except under the cap layer, whereby the remaining cladding layer comprises a mesa structure having a uniform bottom width, and the mesa structure comprising a current injection region having the first height and current non-injection regions having a third height lower than the first height.

It is preferable that the at least cladding layer overlies an etching stopper layer, and the step of selectively removing the at least cladding layer by using the third etching mask comprises an isotropic etching to the at least cladding layer, and an etching depth of the isotropic etching is defined an upper surface of the etching stopper layer.

It is also preferable that the at least cladding layer comprises laminations of lower and upper cladding layers, and the lower cladding layer is lower in doping concentration than the upper cladding layer, and that the isotropic etching is stopped not to etch the lower layer on the stripe-shaped longitudinal center region, so that the lower cladding layer has a uniform thickness and the upper cladding layer on the current non-injection regions is smaller in thickness than the upper cladding layer the current injection region.

It is also preferable that the at least cladding layer comprises laminations of lower and upper cladding layers, and the lower cladding layer is higher in refractive index than the upper cladding layer, and that the isotropic etching is stopped not to etch the lower layer on the stripe-shaped longitudinal center region, so that the lower cladding layer has a uniform thickness and the upper cladding layer on the current non-injection regions is smaller in thickness than the upper cladding layer on the current injection region.

First Embodiment

Figure 4:
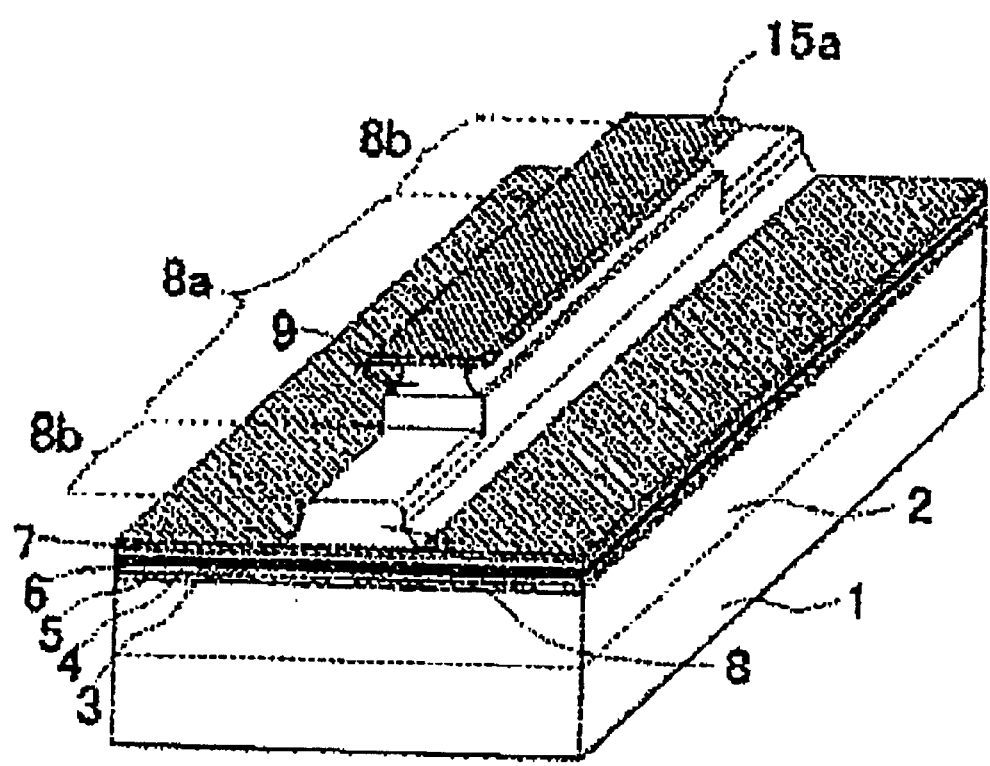
FIG. 4 is a fragmentary schematic perspective view of an improved ridge waveguide structure of a semiconductor laser device in a first embodiment according to the present invention.

A first embodiment according to the present invention will be described in detail with reference to the drawings. FIG. 4 is a fragmentary schematic perspective view of an improved ridge waveguide structure of a semiconductor laser device in a first embodiment according to the present invention.

A semiconductor laser device is provided over an n-GaAs substrate 1 doped with Si at a doping concentration of $1\times10^{18}$ cm$^{-3}$. An n-Al$_{0.315}$Ga$_{0.685}$As cladding layer 2 doped with Si at a doping concentration of $1\times10^{17}$ cm$^{-3}$ overlies an upper surface of the n-GaAs substrate 1. The n-Al$_{0.315}$Ga$_{0.685}$As cladding layer 2 has a thickness of 2.5 micrometers. An n-Al$_{0.045}$Ga$_{0.55}$As etching stopper layer 3 doped with Si at a doping concentration of $1\times10^{17}$ cm$^{-3}$ overlies an upper surface of the n-Al$_{0.315}$Ga$_{0.685}$As cladding layer 2. The n-Al$_{0.45}$Ga$_{0.55}$As etching stopper layer 3 has a thickness of 100 nanometers. An n-Al$_{0.3}$Ga$_{0.7}$As inner cladding layer 4 doped with Si at a doping concentration of $1\times10^{17}$ cm$^{-3}$ overlies an upper surface of the n-Al$_{0.45}$Ga$_{0.55}$As etching stopper layer 3. The n-Al$_{0.3}$Ga$_{0.7}$As inner cladding layer 4 has a thickness of 200 nanometers.

A separate confinement hetero-structure layer 5 overlies an upper surface of the n-Al$_{0.3}$Ga$_{0.7}$As inner cladding layer 4. The separate confinement hetero-structure layer 5 includes a strained double quantum well active layer. The strained double quantum well active layer comprises laminations of an Al$_{0.2}$Ga$_{0.8}$As layer having a thickness of 15 nanometers, an Al$_{0.1}$Ga$_{0.9}$As layer having a thickness of 15 nanometers, a GaAs layer having a thickness of 8 nanometers, an In$_{0.24}$Ga$_{0.76}$As layer having a thickness of 5 nanometers, a GaAs layer having a thickness of 8 nanometers, an In$_{0.24}$Ga$_{0.76}$As layer having a thickness of 5 nanometers, a GaAs layer having a thickness of 8 nanometers, an Al$_{0.1}$Ga$_{0.9}$As layer having a thickness of 15 nanometers, and an Al$_{0.2}$Ga$_{0.8}$As layer having a thickness of 15 nanometers, A p-Al$_{0.3}$Ga$_{0.7}$As inner cladding layer 6 doped with Mg at a doping concentration of $2\times10^{18}$ cm$^{-3}$ overlies an upper surface of the separate confinement hetero-structure layer 5. The p-Al$_{0.3}$Ga$_{0.7}$As inner cladding layer 6 has a thickness of 200 nanometers. A p-Al$_{0.45}$Ga$_{0.55}$As etching stopper layer 7 doped with Mg at a doping concentration of $2\times10^{18}$ cm$^{-3}$ overlies an upper surface of the p-Al$_{0.3}$Ga$_{0.7}$As inner cladding layer 6. The p-Al$_{0.45}$Ga$_{0.55}$As etching stopper layer 7 has a thickness of 100 nanometers.

A p-Al$_{0.315}$Ga$_{0.685}$As cladding layer 8 doped with Mg at a doping concentration of $2\times10^{18}$ cm$^{-3}$ overlies a stripe-shaped selective region of an upper surface of the p-Al0.45Ga$_{0.55}$As etching stopper layer 7. The p-Al$_{0.315}$Ga$_{0.685}$As cladding layer 8 forms a mesa structure. The p-Al$_{0.315}$Ga$_{0.685}$As cladding layer 8 serves as a ridge waveguide structure. The p-Al$_{0.315}$Ga$_{0.685}$As cladding layer 8 extends between front and rear facets and along a longitudinal center axis parallel to a cavity length. The p-Al$_{0.315}$Ga$_{0.685}$As cladding layer 8 comprises a current injection center region 8a and current non-injection side regions 8b adjacent to the facets, wherein the current injection center region 8a is separated by the current non-injection side regions 8b from the facets. The current injection center region 8a has a height of 2.5 micrometers. The current non-injection side regions 8b have a height of 1.5 micrometers, namely, the current non-injection side regions 8b are lower in height than the current injection center region 8a. The current injection center region 8a and the current non-injection side regions 8b have a uniform bottom width of 3 micrometers.

A p-GaAs cap layer 9 doped with Mg at a doping concentration of $5\times10^{18}$ cm$^{-3}$ overlies an upper surface of the current injection region 8a of the p-Al$_{0.315}$Ga$_{0.685}$As cladding layer 8.

Figure 9:
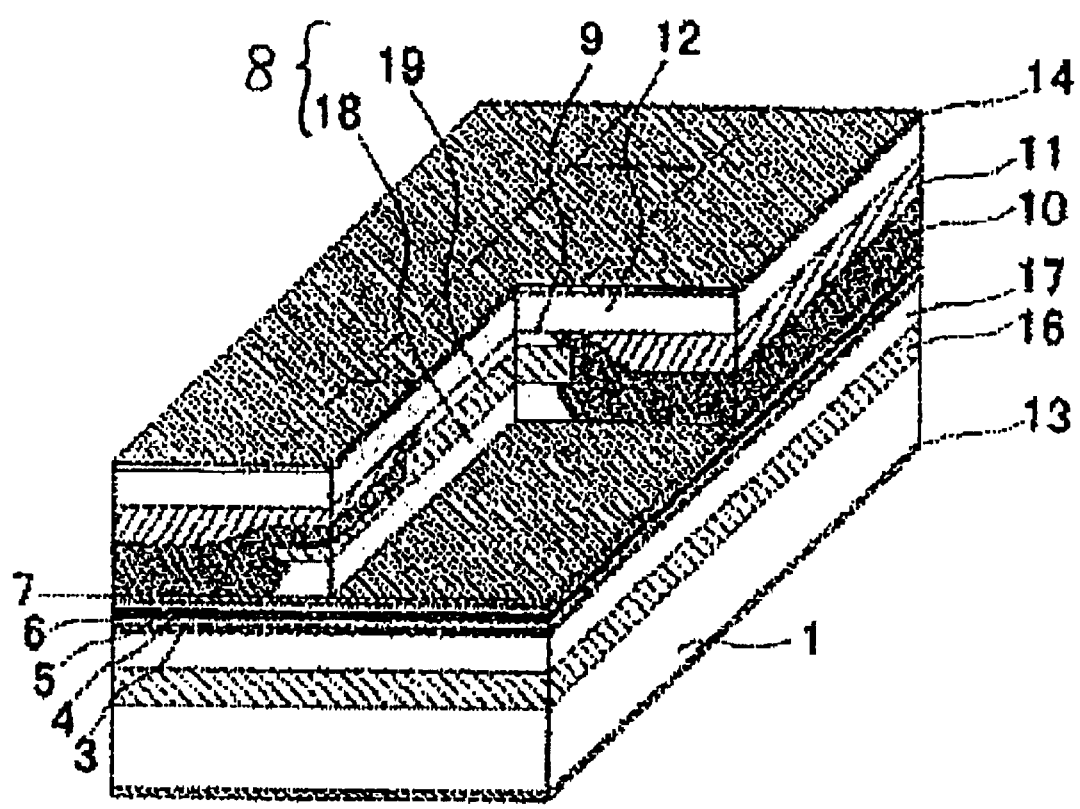
FIG. 9 is a fragmentary schematic perspective view of a semiconductor laser device with an improved ridge waveguide structure in a third embodiment according to the present invention.

Even FIG. 4 does not illustrate, the following structures are provided as shown in FIG. 9. An n-Al$_{0.45}$Ga$_{0.55}$As current clocking layer 10 doped with Si at a doping concentration of $5\times10^{17}$ cm$^{-3}$ overlies the upper surface of the p-Al$_{0.45}$Ga$_{0.55}$As etching stopper layer 7 except over the stripe-shaped selective region, so that the n-Al$_{0.45}$Ga$_{0.55}$As current clocking layer 10 is in contact with the both side walls of the mesa-structured p-Al$_{0.315}$Ga$_{0.685}$As cladding layer 8 and the p-GaAs cap layer 9 as well as in contact with the upper surfaces of the current non-injection regions 8b of the p-Al$_{0.315}$Ga$_{0.685}$As cladding layer 8. An n-GaAs current clocking layer 11 doped with Si at a doping concentration of $1\times10^{18}$ cm$^{-3}$ overlies the upper surface of the n-Al$_{0.45}$Ga$_{0.55}$As current clocking layer 10. An upper surface of the n-GaAs current clocking layer 11 is leveled to the upper surface of the p-GaAs cap layer 9, so as to form a flat upper surface. The above n-Al$_{0.45}$Ga$_{0.55}$As current clocking layer 10 and the n-GaAs current clocking layer 11 may be formed by a buried growth. A p-GaAs contact layer 12 doped with Mg at a doping concentration of $1\times10^{19}$ cm$^{-3}$ overlies the flat upper surface, for example, the upper surfaces of the n-GaAs current clocking layer 11 and the p-GaAs cap layer 9. A p-electrode 13 is provided on a bottom surface of the substrate 1. An n-electrode 14 is provided on an upper surface of the p-GaAs contact layer 12.

The facets of the cavity may generally be formed by cleaving a wafer. A front facet, from which a laser beam is emitted, is coated with a low reflectance coat, so that the front facet may have a low reflection in the range of 1–5% and preferably 2–4%. A rear facet opposite to the front facet is coated with a high reflectance coat, so that the rear facet may have a high reflection in the range of 90–99% and preferably 95–99%.

The above respective layers of the semiconductor laser device comprise group III–V compound semiconductors which may be formed by crystal growth by use of a metal organic vapor phase epitaxy method. Trimethyl-gallium (Ga(CH$_3$)$_3$) may be available as a source material for gallium. Trimethyl-aluminum (Al(CH$_3$)$_3$) may be available as a source material for aluminum. Trimethyl-indium (In (CH$_3$)$_3$) may be available as a source material for indium. Arsine (AsH$_3$) may be available as a source material for arsenic. Silane (SiH$_4$) may be available as a source material for silicon as an n-type impurity. Cyclopentadienyl magnesium (Cp$_2$Mg) may be available as a source material for magnesium as a p-type impurity. The source materials of Group III and the organic metals as p-type impurity may be evaporated by bobbling or sublimated and then supplied together with a carrier gas into a reaction chamber of the metal organic vapor phase epitaxy system, wherein the reaction chamber have been controlled at a predetermined pressure. Other source gases may also be supplied together with the carrier gas into the reaction chamber, so that respective group III–V compound semiconductor layers and amorphous layers are grown in the reaction chamber.

FIGS. 5A through 5E are fragmentary schematic perspective views of semiconductor laser devices in sequential steps involved in a first method of forming the novel ridge waveguide structure in the first embodiment in accordance with the present invention.

Figure 5A:
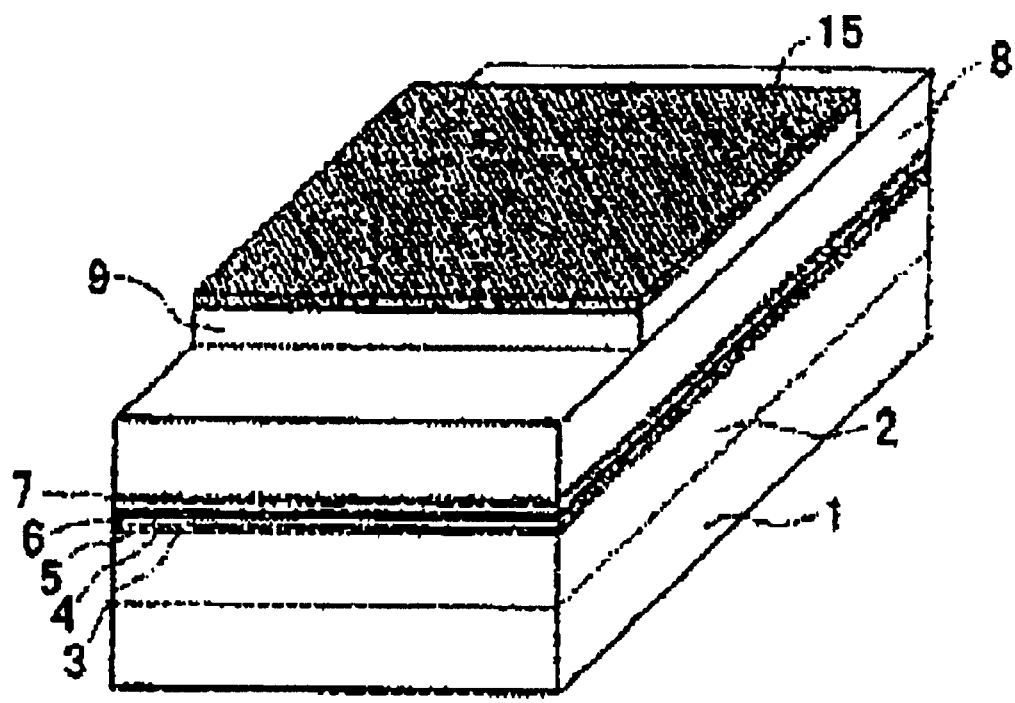
FIGS. 5A through 5E are fragmentary schematic perspective views of semiconductor laser devices in sequential steps involved in a first method of forming the novel ridge waveguide structure in the first embodiment in accordance with the present invention.

With reference to FIG. 5A, an n-$Al_{0.315}Ga_{0.685}As$ cladding layer 2 doped with Si at a doping concentration of $1\times10^{17}$ cm$^{-3}$ is formed on an upper surface of an n-GaAs substrate 1 doped with Si at a doping concentration of $1\times10^{18}$ cm$^{-3}$, so that the n-$Al_{0.315}Ga_{0.685}As$ cladding layer 2 has a thickness of 2.5 micrometers. An n-$Al_{0.45}Ga_{0.55}As$ etching stopper layer 3 doped with Si at a doping concentration of $1\times10^{17}$ cm$^{-3}$ is formed on an upper surface of the n-$Al_{0.315}Ga_{0.685}As$ cladding layer 2, so that the n-$Al_{0.45}Ga_{0.55}As$ etching stopper layer 3 has a thickness of 100 nanometers. An n-$Al_{0.3}Ga_{0.7}As$ inner cladding layer 4 doped with Si at a doping concentration of $1\times10^{17}$ cm$^{-3}$ is formed on an upper surface of the n-$Al_{0.45}Ga_{0.55}As$ etching stopper layer 3, so that the n-$Al_{0.3}Ga_{0.7}As$ inner cladding layer 4 has a thickness of 200 nanometers.

A separate confinement hetero-structure layer 5 is formed on an upper surface of the n-$Al_{0.3}Ga_{0.7}As$ inner cladding layer 4. The separate confinement hetero-structure layer 5 includes a strained double quantum well active layer. The strained double quantum well active layer comprises laminations of an $Al_{0.2}Ga_{0.8}As$ layer having a thickness of 15 nanometers, an $Al_{0.1}Ga_{0.9}As$ layer having a thickness of 15 nanometers, a GaAs layer having a thickness of 8 nanometers, an $In_{0.24}Ga_{0.76}As$ layer having a thickness of 5 nanometers, a GaAs layer having a thickness of 8 nanometers, an $In_{0.24}Ga_{0.76}As$ layer having a thickness of 5 nanometers, a GaAs layer having a thickness of 8 nanometers, an $Al_{0.1}Ga_{0.9}As$ layer having a thickness of 15 nanometers, and an $Al_{0.2}Ga_{0.8}As$ layer having a thickness of 15 nanometers.

A p-$Al_{0.3}Ga_{0.7}As$ inner cladding layer 6 doped with Mg at a doping concentration of $2\times10^{18}$ cm$^{-3}$ is formed on an upper surface of the separate confinement hetero-structure layer 5, so that the p-$Al_{0.3}Ga_{0.7}As$ inner cladding layer 6 has a thickness of 200 nanometers. A p-$Al_{0.45}Ga_{0.55}As$ etching stopper layer 7 doped with Mg at a doping concentration of $2\times10^{18}$ cm$^{-3}$ is formed on an upper surface of the p-$Al_{0.3}Ga_{0.7}As$ inner cladding layer 6, so that the p-$Al_{0.45}Ga_{0.55}As$ etching stopper layer 7 has a thickness of 100 nanometers.

A p-$Al_{0.315}Ga_{0.68}As$ cladding layer 8 doped with Mg at a doping concentration of $2\times10^{18}$ cm$^{-3}$ is formed on an upper surface of the p-$Al_{0.45}Ga_{0.55}As$ etching stopper layer 7. A p-GaAs cap layer 9 doped with Mg at a doping concentration of $5\times10^{18}$ cm$^{-3}$ is formed on an upper surface of the p-$Al_{0.315}Ga_{0.685}As$ cladding layer 8.

A silicon dioxide film is formed on an entire surface of the p-GaAs cap layer 9. The silicon dioxide film is selectively removed by use of a lithography technique to selectively form a silicon dioxide mask 15, wherein the silicon dioxide mask 15 overlies a predetermined center region which is separated by side regions from opposite facets which are distanced from each other in a cavity length direction.

The p-GaAs cap layer 9 is selectively removed by a wet etching process carried out by use of the silicon dioxide mask 15 and a composition-selective etchant which comprises a mixture of a citric acid solution and hydrogen peroxide at a low mixing ratio. The p-GaAs cap layer 9 remains only under the silicon dioxide mask 15, so that upper surfaces of the p-$Al_{0.315}Ga_{0.685}As$ cladding layer 8 are exposed on the side regions.

Figure 5B:
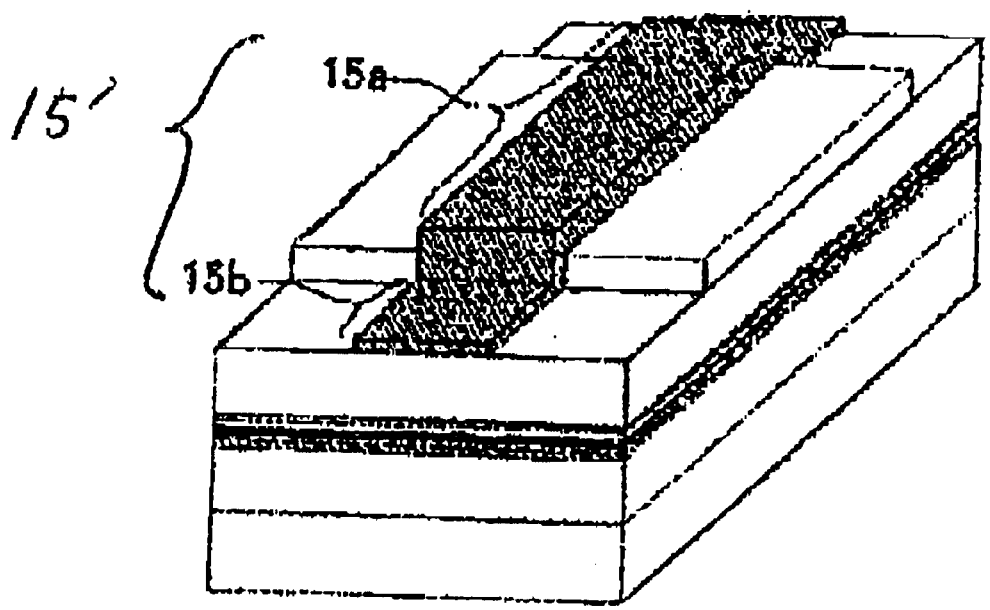

With reference to FIG. 5B, an additional silicon dioxide film is entirely formed over the silicon dioxide mask 15 and the exposed surfaces of the p-$Al_{0.315}Ga_{0.685}As$ cladding layer 8 on the side regions. The silicon dioxide film and the silicon dioxide mask 15 are selectively removed by a lithography technique to form a stripe-shaped silicon dioxide mask 15', which extends along a longitudinal center axis parallel to the cavity length direction, wherein the stripe-shaped silicon dioxide mask 15' comprises a center portion 15a on the p-GaAs cap layer 9 on the center region and side portions 15b on the exposed surfaces of the p-$Al_{0.315}Ga_{0.685}As$ cladding layer 8 on the side regions. The stripe-shaped silicon dioxide mask 15' has a uniform width of 3.5 micrometers. The center portion 15a comprises the lamination of the strip-shaped silicon dioxide mask 15 and the additional silicon dioxide film. The side portions 15b comprise the additional silicon dioxide film. The center portion 15a is thicker than the side portions 15b.

Figure 5C:
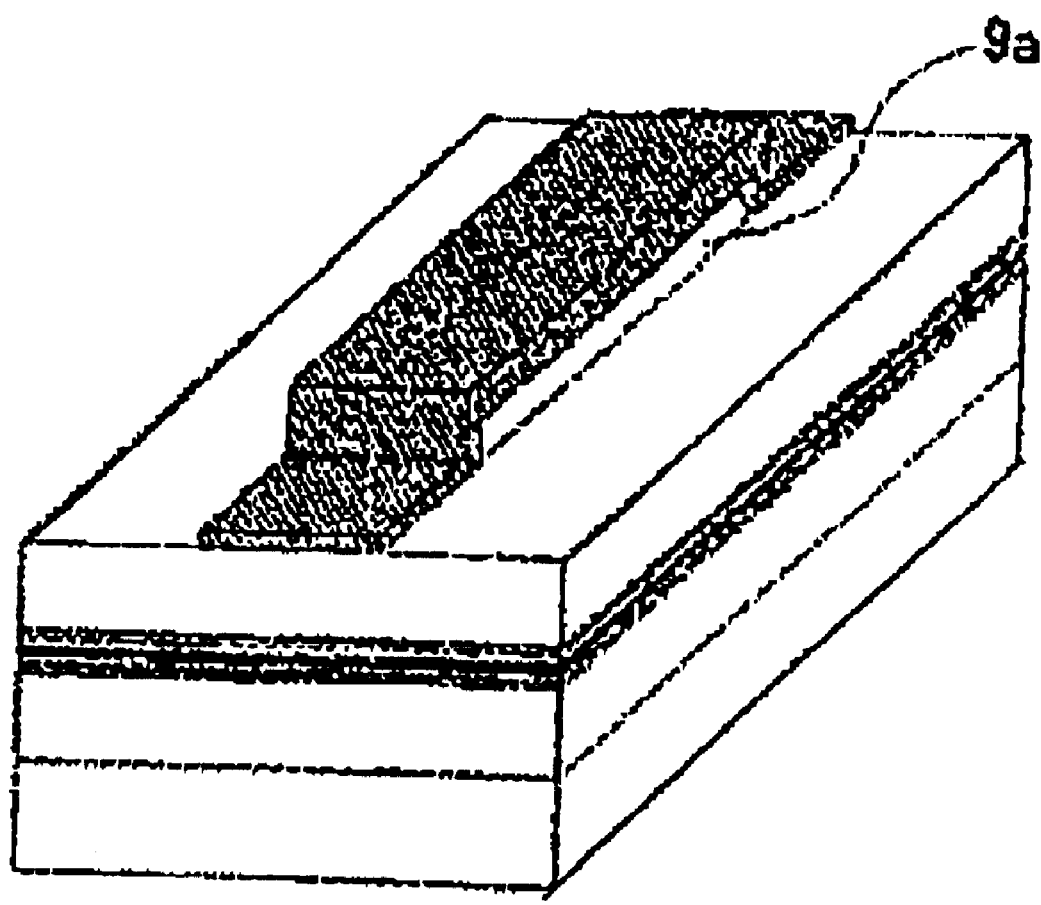

With reference to FIG. 5C, the p-GaAs cap layer 9 selectively removed by a wet etching process carried out by use of the strip-shaped silicon dioxide mask 15' and the composition-selective etchant which comprises a mixture of a citric acid solution and hydrogen peroxide at a low mixing ratio. The p-GaAs cap layer 9 remains only under the center portion 15a of the strip-shaped silicon dioxide mask 15', so that upper surfaces of the p-$Al_{0.315}Ga_{0.685}As$ cladding layer 8 are exposed on the both side regions of the strip-shaped silicon dioxide mask 15' throughout the center region and the side regions. The upper surfaces of the p-$Al_{0.315}Ga_{0.685}As$ cladding layer 8 are flat over the center region and the side regions. The p-$Al_{0.315}Ga_{0.685}As$ cladding layer 8 has a uniform thickness of 2.5 micrometers.

Figure 5D:
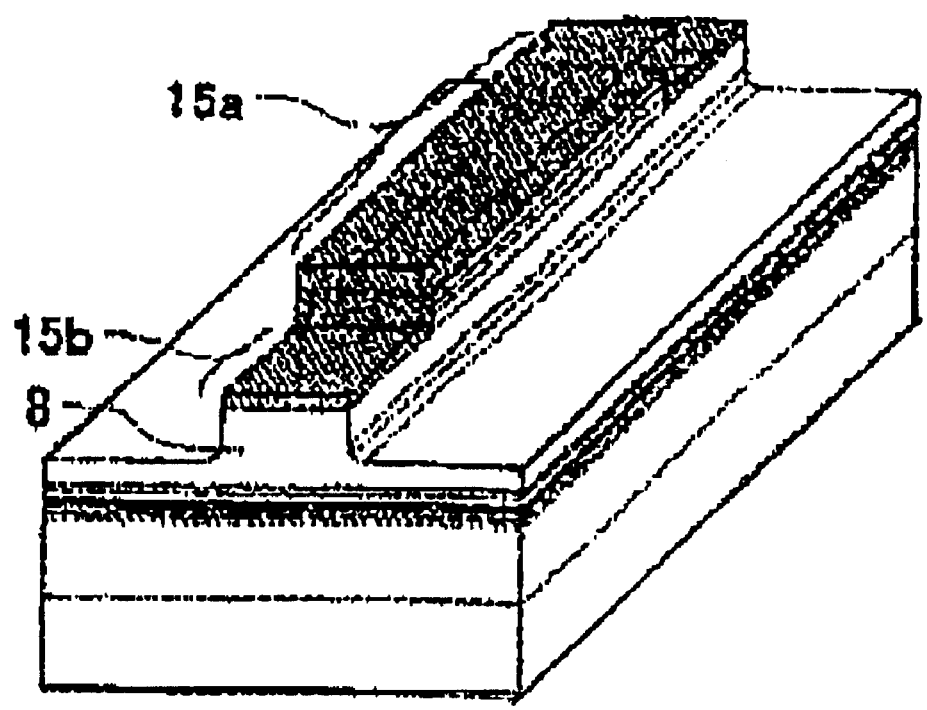

With reference to FIG. 5D, the p-$Al_{0.31}Ga_{0.685}As$ cladding layer 8 is selectively removed by a dry etching process by use of the strip-shaped silicon dioxide mask 15' at an etching depth of 2.0 micrometers, so that the p-$Al_{0.315}Ga_{0.685}As$ cladding layer 8 has a mesa portion and etched thin portions present on both sides of the mesa portion. The dry etching process is carried out under a condition of a large difference in etching rate between silicon dioxide and p-$Al_{0.315}Ga_{0.685}As$, so that p-$Al_{0.31}Ga_{0.685}As$ selectively etched. The mesa portion is positioned under the strip-shaped silicon dioxide mask 15'. The mesa portion has a height of 2 micrometers. The etched thin portions have a thickness of 0.5 micrometers. The height of the mesa portion is defined to be a difference in level between the upper surface level of the etched thin portions and the top surface of the mesa portion. The mesa portion has a uniform bottom width of 3 micrometers.

Figure 5E:
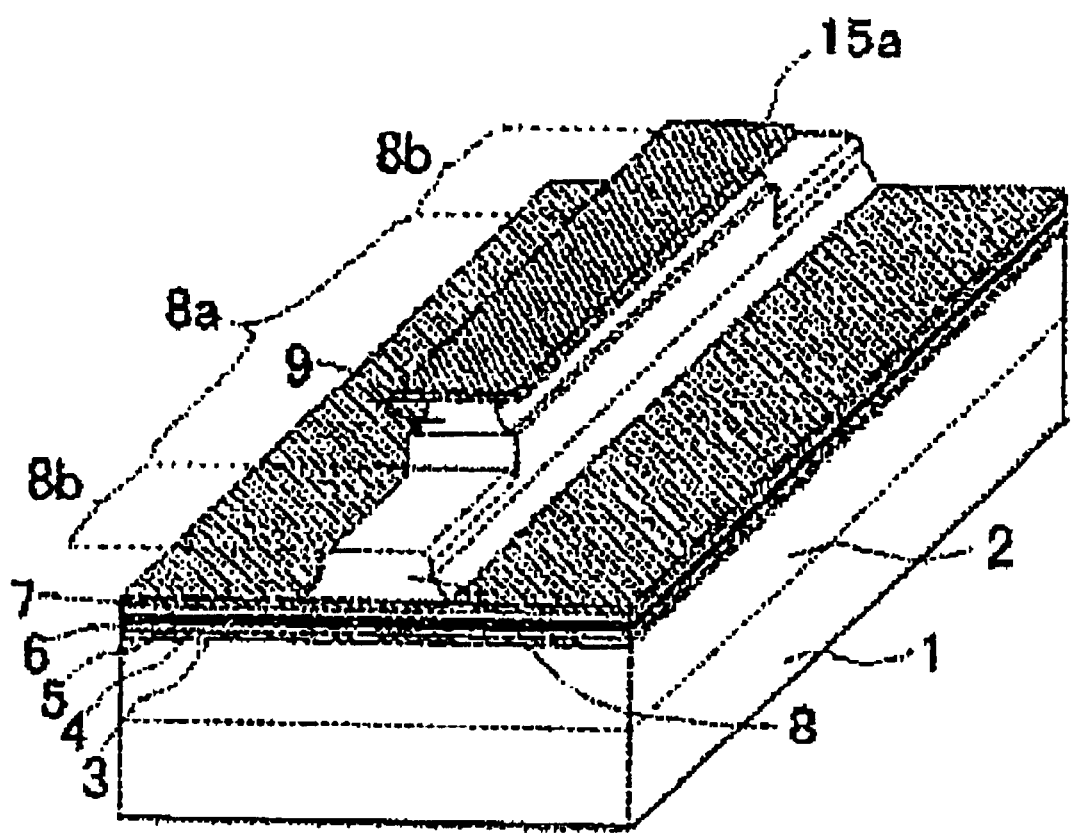

With reference to FIG. 5E, the strip-shaped silicon dioxide mask 15' is then selectively removed by use of a buffered fluorine acid solution, so that only the center portion 15a remains, whilst the side portions 15b are removed, whereby a stripe-shaped silicon dioxide mask 15a is formed on the center region. Before the selective etching to the strip-shaped silicon dioxide mask 15', the center portion 15a is thicker than the side portions 15b, for which reason the etching process is stopped when the side portions 15b are removed, whilst the center portion 15a remains even the center portion 15a becomes the thin stripe-shaped silicon dioxide mask 15a. As a result of removal of the side portions 15b, the mesa portion of the p-$Al_{0.31}Ga_{0.685}As$ cladding layer 8 is exposed on the side regions.

The p-$Al_{0.315}Ga_{0.685}As$ cladding layer 8 is further selectively removed by an additional wet etching process carried out by use of the strip-shaped silicon dioxide mask 15a and another composition-selective etchant which comprises a mixture of a citric acid solution and hydrogen peroxide at a high mixing ratio. The additional wet etching process is carried out at a time which corresponds to a necessary time for obtaining a 1 micrometer etching depth of the p-$Al_{0.31}Ga_{0.685}As$.

Since the thickness of the thin flat portions of the p-$Al_{0.315}Ga_{0.685}As$ cladding layer 8 prior to this etching process is 0.5 micrometers, then in the additional wet etching process, the upper surface of the p-$Al_{0.45}Ga_{0.55}As$ etching stopper layer 7 is exposed on both side regions of the mesa structure. After the upper surface of the p-$Al_{0.45}Ga_{0.55}As$ etching stopper layer 7 is exposed, then the etching in the vertical direction is stopped.

Since the mesa structure of the p-$Al_{0.315}Ga_{0.68}As$ cladding layer 8 prior to this etching process has a uniform thickness of 2.5 micrometers, the thickness of the mesa structure on the side regions becomes 1.5 micrometers.

As a result of this additional etching process using the strip-shaped silicon dioxide mask 15a, the p-$Al_{0.315}Ga_{0.685}As$ cladding layer 8 becomes the mesa structure which comprises a thick center region 8a, and thin side regions 8b. The thick center region 8a has a thickness of 2.5 micrometers. The thin side regions 8b have a thickness of 1.5 micrometers. A difference in height or thickness between the thick center region 8a and the thin side regions 8b is 1 micrometer. The mesa structure has a uniform bottom width of 3 micrometers. The mesa structure serves as the ridge waveguide structure. The thick center region 8a of the mesa structure serves as the current injection center region of the ridge waveguide structure. The thin side regions 8b of the mesa structure serve as the current non-injection side regions of the ridge waveguide structure.

The above first novel method of forming the ridge waveguide structure 8 is one example.

The following descriptions will focus on the second novel method of forming the ridge waveguide structure 8 as another example.

FIGS. 6A through 6D are fragmentary schematic perspective views of semiconductor laser devices in sequential steps involved in a second method of forming the novel ridge waveguide structure in the first embodiment in accordance with the present invention.

Figure 6:
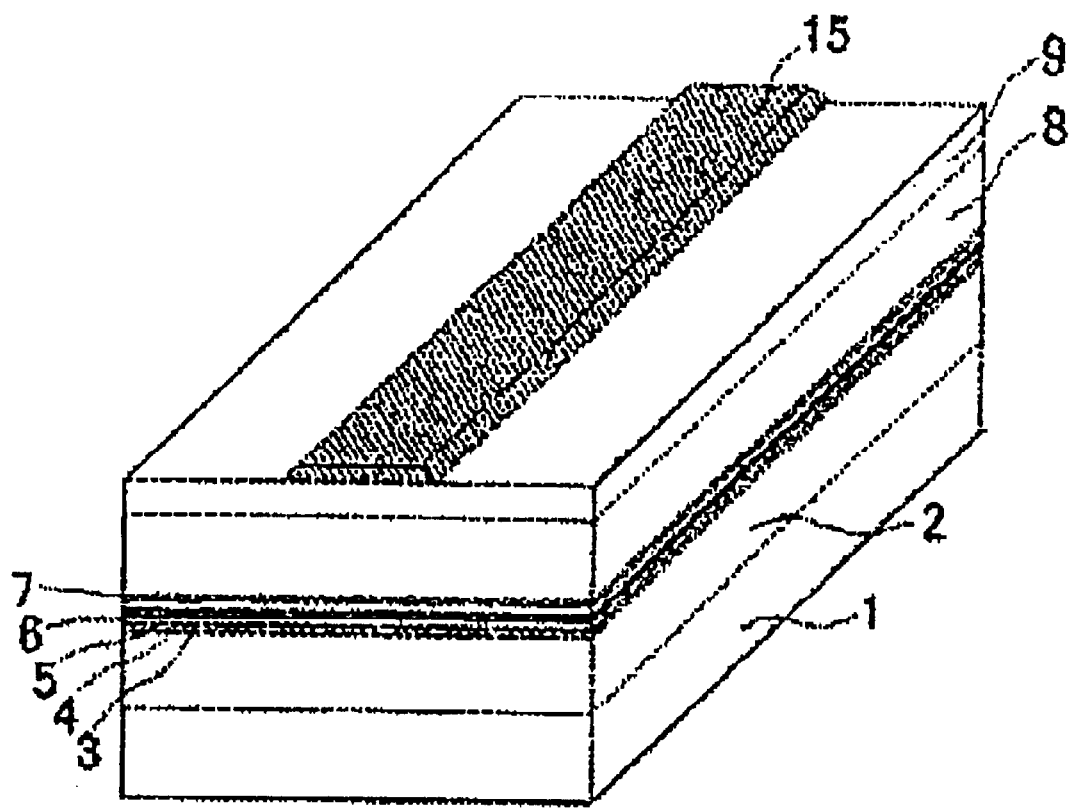
FIGS. 6A through 6D are fragmentary schematic perspective views of semiconductor laser devices in sequential steps involved in a second method of forming the novel ridge waveguide structure in the first embodiment in accordance with the present invention.

With reference to FIG. 6A, an n-$Al_{0.315}Ga_{0.685}As$ cladding layer 2 doped with Si at a doping concentration of $1\times10^{17}$ cm$^{-3}$ is formed on an upper surface of an n-GaAs substrate 1 doped with Si at a doping concentration of $1\times10^{18}$ cm$^{-3}$, so that the n-$Al_{0.315}Ga_{0.685}As$ cladding layer 2 has a thickness of 2.5 micrometers. An n-$Al_{0.45}Ga_{0.55}As$ etching stopper layer 3 doped with Si at a doping concentration of $1\times10^{17}$ cm$^{-3}$ is formed on an upper surface of the n-$Al_{0.315}Ga_{0.685}As$ cladding layer 2, so that the n-$Al_{0.45}Ga_{0.55}As$ etching stopper layer 3 has a thickness of 100 nanometers. An n-$Al_{0.3}Ga_{0.7}As$ inner cladding layer 4 doped with Si at a doping concentration of $1\times10^{17}$ cm$^{-3}$ is formed on an upper surface of the n-$Al_{0.45}Ga_{0.55}As$ etching stopper layer 3, so that the n-$Al_{0.3}Ga_{0.7}As$ inner cladding layer 4 has a thickness of 200 nanometers.

A separate confinement hetero-structure layer 5 is formed on an upper surface of the n-$Al_{0.3}Ga_{0.7}As$ inner cladding layer 4. The separate confinement hetero-structure layer 5 includes a strained double quantum well active layer. The strained double quantum well active layer comprises laminations of an $Al_{0.2}Ga_{0.8}As$ layer having a thickness of 15 nanometers, an $Al_{0.1}Ga_{0.9}As$ layer having a thickness of 15 nanometers, a GaAs layer having a thickness of 8 nanometers, an $In_{0.24}Ga_{0.76}As$ layer having a thickness of 5 nanometers, a GaAs layer having a thickness of 8 nanometers, an $In_{0.24}Ga_{0.76}As$ layer having a thickness of 5 nanometers, a GaAs layer having a thickness of 8 nanometers, an $Al_{0.1}Ga_{0.9}As$ layer having a thickness of 15 nanometers, and an $Al_{0.2}Ga_{0.8}As$ layer having a thickness of 15 nanometers, A p-$Al_{0.3}Ga_{0.7}As$ inner cladding layer 6 doped with Mg at a doping concentration of $2\times10^{18}$ cm$^{-3}$ is formed on an upper surface of the separate confinement hetero-structure layer 5, so that the p-$Al_{0.3}Ga_{0.7}As$ inner cladding layer 6 has a thickness of 200 nanometers. A p-$Al_{0.45}Ga_{0.55}As$ etching stopper layer 7 doped with Mg at a doping concentration of $2\times10^{18}$ cm$^{-3}$ is formed on an upper surface of the p-$Al_{0.3}Ga_{0.7}As$ inner cladding layer 6, so that the p-$Al_{0.45}Ga_{0.55}As$ etching stopper layer 7 has a thickness of 100 nanometers.

A p-$Al_{0.315}Ga_{0.685}As$ cladding layer 8 doped with Mg at a doping concentration of $2\times10^{18}$ cm$^{-3}$ is formed on an upper surface of the p-$Al_{0.45}Ga_{0.55}As$ etching stopper layer 7. A p-GaAs cap layer 9 doped with Mg at a doping concentration of $5\times10^{18}$ cm$^{-3}$ is formed on an upper surface of the p-$Al_{0.315}Ga_{0.685}As$ cladding layer 8.

A silicon dioxide film is formed on an entire surface of the p-GaAs cap layer 9. The silicon dioxide film is selectively removed by use of a lithography technique to selectively form a stripe-shaped silicon dioxide mask 15, wherein the stripe-shaped silicon dioxide mask 15 overlies a predetermined stripe-shaped region which extends along a longitudinal center axis which is in parallel to a cavity length direction, so that the stripe-shaped silicon dioxide mask 15 extends between opposite facets which are distanced from each other in the cavity length direction. The stripe-shaped silicon dioxide mask 15 has a uniform width of 3.5 micrometers.

Figure 6B:
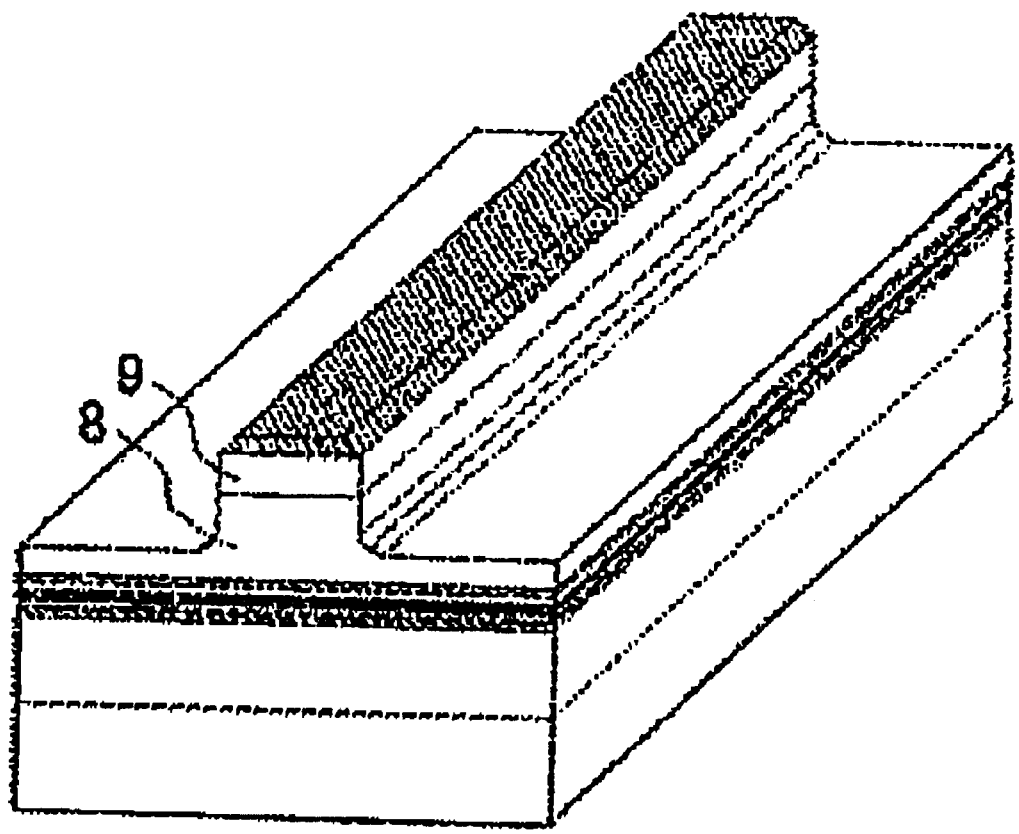

With reference to FIG. 6B, the p-GaAs cap layer 9 and the p-$Al_{0.315}Ga_{0.685}As$ cladding layer 8 are selectively removed by a dry etching process by use of the strip-shaped silicon dioxide mask 15 at an etching depth of 3.0 micrometers, so that the p-GaAs cap layer 9 having a thickness of 1 micrometer is removed except under the strip-shaped silicon dioxide mask 15. The p-$Al_{0.315}Ga_{0.685}As$ cladding layer 8 having a thickness of 2.5 micrometers is removed at an etching depth of 2.0 micrometers, so that the remaining p-$Al_{0.315}Ga_{0.685}As$ cladding layer 8 comprises a mesa portion and etched thin portions present on both sides of the mesa portion. The dry etching process is carried out under a condition of a large difference in etching rate between silicon dioxide and p-$Al_{0.315}Ga_{0.685}As$, so that p-$Al_{0.315}Ga_{0.685}As$ selectively etched. The mesa portion is positioned under the strip-shaped silicon dioxide mask 15. The mesa portion has a height of 2 micrometers. The etched thin portions have a thickness of 0.5 micrometers. The height of the mesa portion is defined to be a difference in level between the upper surface level of the etched thin portions and the top surface of the mesa portion. The mesa portion has a uniform bottom width of 3 micrometers.

Figure 6C:
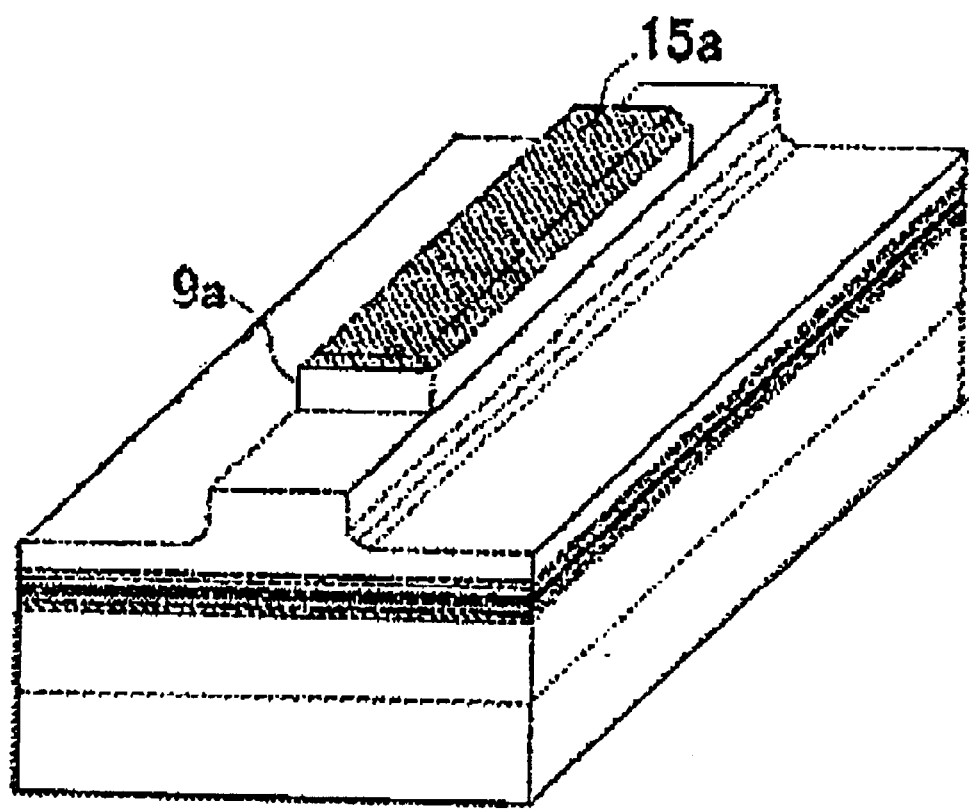

With reference to FIG. 6C, the strip-shaped silicon dioxide mask 15 is then selectively removed by a lithography technique to form a strip-shaped silicon dioxide mask 15a on a center region except on side regions adjacent to the facets. The center region is separated by the side regions from the facets. As a result of the selective removal of the strip-shaped silicon dioxide mask 15, the upper surface of the p-GaAs cap layer 9 is exposed on the side regions.

The p-GaAs cap layer 9 is further selectively removed by a wet etching process carried out by use of the strip-shaped silicon dioxide mask 15a and a composition-selective etchant which comprises a mixture of a citric acid solution and hydrogen peroxide at a low mixing ratio. As a result of this wet etching, the p-GaAs cap layer 9 remains only under the strip-shaped silicon dioxide mask 15a on the center region, and upper surfaces of the mesa structure of the p-$Al_{0.315}Ga_{0.685}As$ cladding layer 8 are exposed on the side regions adjacent to the facets. Since the composition-selective etchant is used, the mesa structure of the p-$Al_{0.315}Ga_{0.685}As$ cladding layer 8 is unchanged in size or width.

Figure 6D:
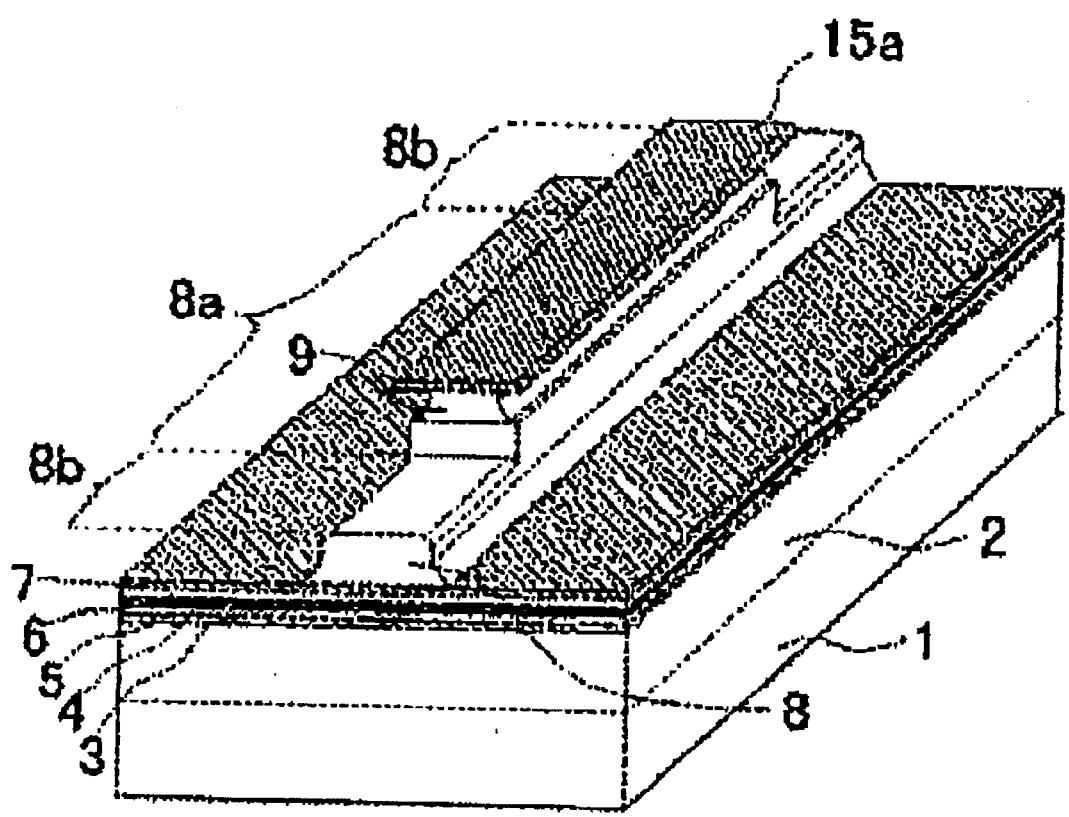

With reference to FIG. 6D, the p-$Al_{0.315}Ga_{0.685}As$ cladding layer 8 is further selectively removed by an additional wet etching process carried out by use of the strip-shaped silicon dioxide mask 15a and another composition-selective etchant which comprises a mixture of a citric acid solution and hydrogen peroxide at a high mixing ratio. The additional wet etching process is carried out at a time which corresponds to a necessary time for obtaining a 1 micrometer etching depth of the p-$Al_{0.315}Ga_{0.685}As$.

Since the thickness of the thin flat portions of the p-$Al_{0.315}Ga_{0.685}As$ cladding layer 8 prior to this etching process is 0.5 micrometers, then in the additional wet etching process, the upper surface of the p-$Al_{0.45}Ga_{0.55}As$ etching stopper layer 7 is exposed on both side regions of the mesa structure. After the upper surface of the p-$Al_{0.45}Ga_{0.55}As$ etching stopper layer 7 is exposed, then the etching in the vertical direction is stopped.

Since the mesa structure of the p-$Al_{0.315}Ga_{0.685}As$ cladding layer 8 prior to this etching process has the uniform thickness of 2.5 micrometers, the thickness of the mesa structure on the side regions becomes 1.5 micrometers.

As a result of this additional etching process using the strip-shaped silicon dioxide mask 15a, the p-$Al_{0.315}Ga_{0.685}As$ cladding layer 8 becomes the mesa structure which comprises a thick center region 8a, and thin side regions 8b. The thick center region 8a has a thickness of 2.5 micrometers. The thin side regions 8b have a thickness of 1.5 micrometers. A difference in height or thickness between the thick center region 8a and the thin side regions 8b is 1 micrometer. The mesa structure has a uniform bottom width of 3 micrometers. The mesa structure serves as the ridge waveguide structure. The thick center region 8a of the mesa structure serves as the current injection center region of the ridge waveguide structure. The thin side regions 8b of the mesa structure serve as the current non-injection side regions of the ridge waveguide structure.

The above second novel method of forming the ridge waveguide structure 8 is another example.

The following descriptions will focus on the third novel method of forming the ridge waveguide structure 8 as still another example.

FIGS. 7A through 7E are fragmentary schematic perspective views of semiconductor laser devices in sequential steps involved in a third method of forming the novel ridge waveguide structure in the first embodiment in accordance with the present invention.

Figure 7A:
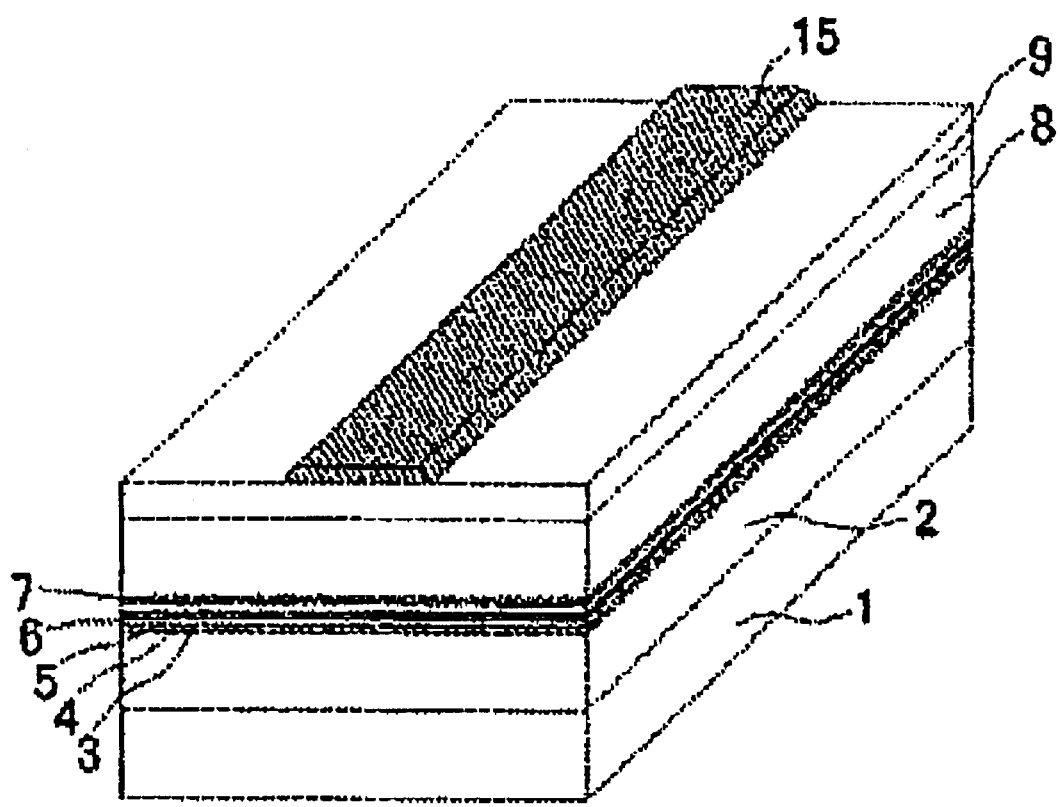
FIGS. 7A through 7E are fragmentary schematic perspective views of semiconductor laser devices in sequential steps involved in a third method of forming the novel ridge waveguide structure in the first embodiment in accordance with the present invention.

With reference to FIG. 7A, an n-$Al_{0.315}Ga_{0.685}As$ cladding layer 2 doped with Si at a doping concentration of $1\times10^{17}$ cm$^{-3}$ is formed on an upper surface of an n-GaAs substrate 1 doped with Si at a doping concentration of $1\times10^{18}$ cm$^{-3}$, so that the n-$Al_{0.315}Ga_{0.685}As$ cladding layer 2 has a thickness of 2.5 micrometers. An n-$Al_{0.45}Ga_{0.55}As$ etching stopper layer 3 doped with Si at a doping concentration of $1\times10^{17}$ cm$^{-3}$ is formed on an upper surface of the n-$Al_{0.315}Ga_{0.685}As$ cladding layer 2, so that the n-$Al_{0.45}Ga_{0.55}As$ etching stopper layer 3 has a thickness of 100 nanometers. An n-$Al_{0.3}Ga_{0.7}As$ inner cladding layer 4 doped with Si at a doping concentration of $1\times10^{17}$ cm$^{-3}$ is formed on an upper surface of the n-$Al_{0.45}Ga_{0.55}As$ etching stopper layer 3, so that the n-$Al_{0.3}Ga_{0.7}As$ inner cladding layer 4 has a thickness of 200 nanometers.

A separate confinement hetero-structure layer 5 is formed on an upper surface of the n-$Al_{0.3}Ga_{0.7}As$ inner cladding layer 4. The separate confinement hetero-structure layer 5 includes a strained double quantum well active layer. The strained double quantum well active layer comprises laminations of an $Al_{0.2}Ga_{0.8}As$ layer having a thickness of 15 nanometers, an $Al_{0.1}Ga_{0.9}As$ layer having a thickness of 15 nanometers, a GaAs layer having a thickness of 8 nanometers, an $In_{0.24}Ga_{0.76}As$ layer having a thickness of 5 nanometers, a GaAs layer having a thickness of 8 nanometers, an $In_{0.24}Ga_{0.76}As$ layer having a thickness of 5 nanometers, a GaAs layer having a thickness of 8 nanometers, an $Al_{0.1}Ga_{0.9}As$ layer having a thickness of 15 nanometers, and an $Al_{0.2}Ga_{0.8}AS$ layer having a thickness of 15 nanometers.

A p-$Al_{0.3}Ga_{0.7}As$ inner cladding layer 6 doped with Mg at a doping concentration of $2\times10^{18}$ cm$^{-3}$ is formed on an upper surface of the separate confinement hetero-structure layer 5, so that the p-$Al_{0.3}Ga_{0.7}As$ inner cladding layer 6 has a thickness of 200 nanometers. A p-$Al_{0.45}Ga_{0.55}As$ etching stopper layer 7 doped with Mg at a doping concentration of $2\times10^{18}$ cm$^{-3}$ is formed on an upper surface of the p-$Al_{0.3}Ga_{0.7}As$ inner cladding layer 6, so that the p-$Al_{0.45}Ga_{0.55}As$ etching stopper layer 7 has a thickness of 100 nanometers.

A p-$Al_{0.315}Ga_{0.685}As$ cladding layer 8 doped with Mg at a doping concentration of $2\times10^{18}$ cm$^{-3}$ is formed on an upper surface of the p-$Al_{0.45}Ga_{0.55}As$ etching stopper layer 7. A p-GaAs cap layer 9 doped with Mg at a doping concentration of $5\times10^{18}$ cm$^{-3}$ is formed on an upper surface of the p-$Al_{0.315}Ga_{0.685}As$ cladding layer 8, so that the p-GaAs cap layer 9 has a thickness of 2 micrometers.

A silicon dioxide film is formed on an entire surface of the p-GaAs cap layer 9. The silicon dioxide film is selectively removed by use of a lithography technique to selectively form a stripe-shaped silicon dioxide mask 15, wherein the stripe-shaped silicon dioxide mask 15 overlies a predetermined stripe-shaped region which extends along a longitudinal center axis which is in parallel to a cavity length direction, so that the stripe-shaped silicon dioxide mask 15 extends between opposite facets which are distanced from each other in the cavity length direction. The stripe-shaped silicon dioxide mask 15 has a uniform width of 3.5 micrometers.

Figure 7B:
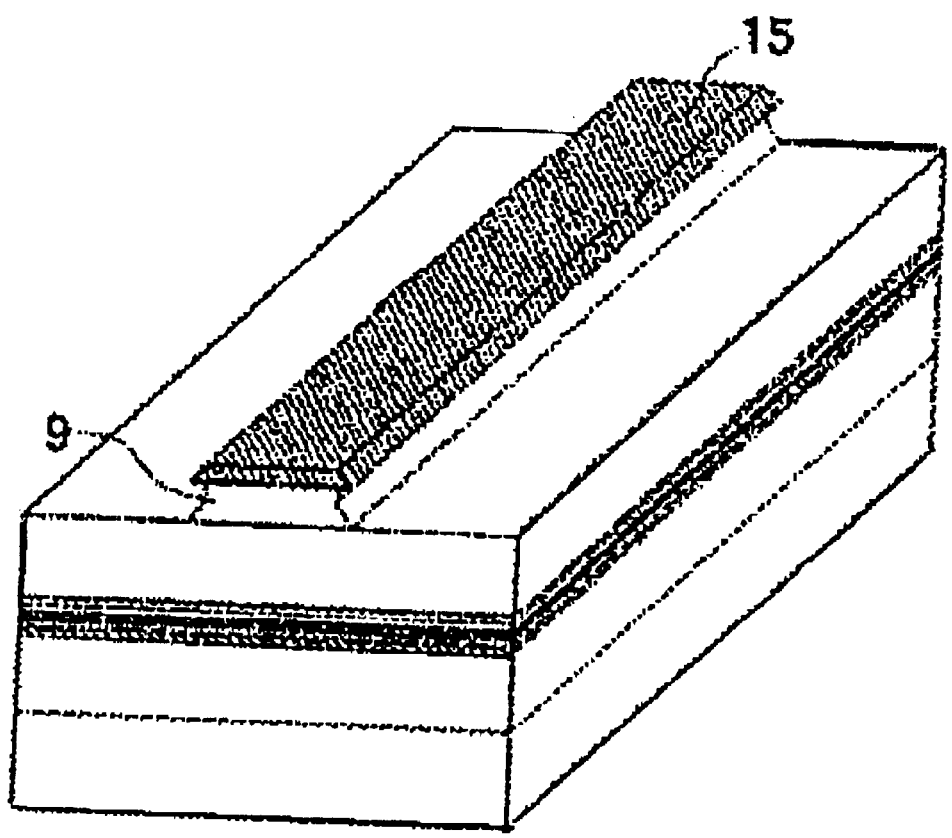

With reference to FIG. 7B, the p-GaAs cap layer 9 is selectively removed by a wet etching process carried out by use of the strip-shaped silicon dioxide mask 15 and a composition-selective etchant which comprises a mixture of a citric acid solution and hydrogen peroxide at a low mixing ratio. As a result of this wet etching, so that the p-GaAs cap layer 9 having a thickness of 2 micrometer is removed except under the strip-shaped silicon dioxide mask 15, and upper surfaces of the p-$Al_{0.315}Ga_{0.685}As$ cladding layer 8 are exposed on both sides of the strip-shaped silicon dioxide mask 15. Namely, the p-GaAs cap layer 9 becomes a mesa stripe p-GaAs cap layer 9. During the wet etching process, the p-GaAs cap layer 9 receives a side etching, so that the p-GaAs cap layer 9 is etched in a lateral direction, whereby side edges of the strip-shaped silicon dioxide mask 15 extends laterally from the sides of the mesa stripe p-GaAs cap layer 9.

Figure 7C:
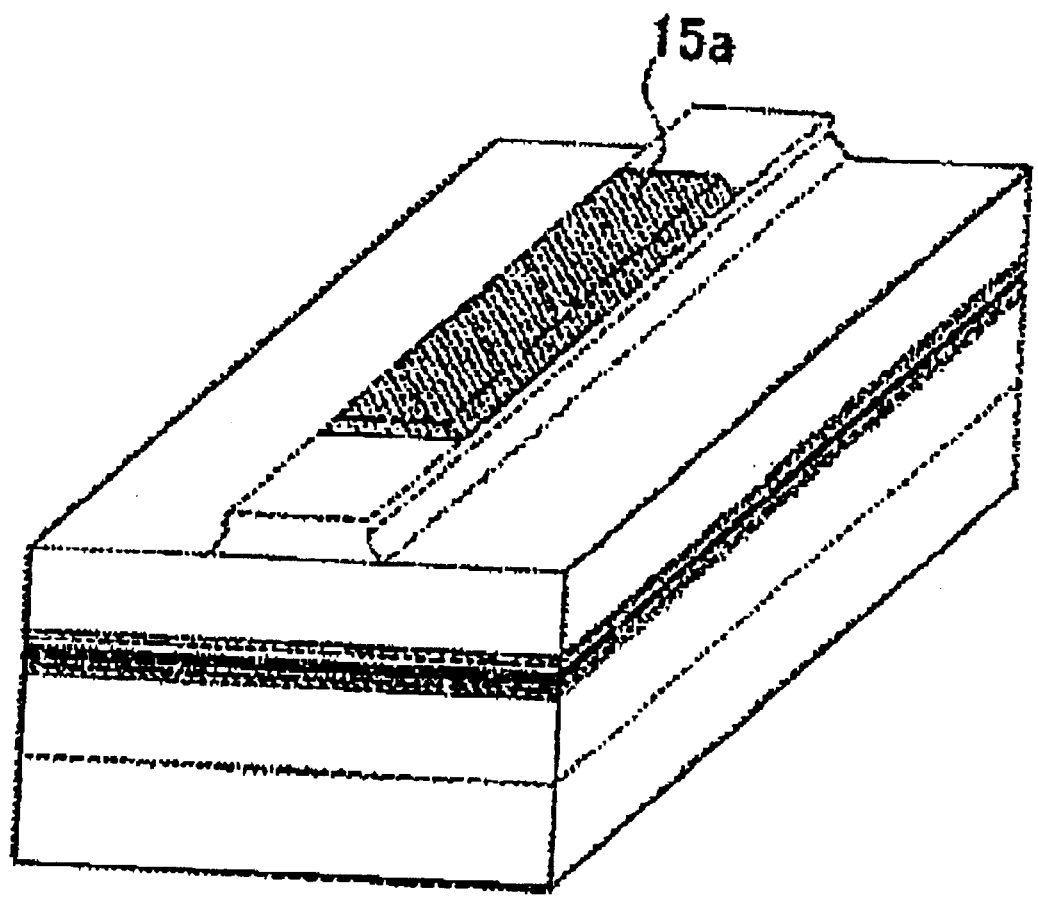

With reference to FIG. 7C, laterally extending side portions of the strip-shaped silicon dioxide mask 15 from the sides of the mesa striped p-GaAs cap layer 9 are removed by use of a buffered fluorine acid solution. Thereafter, the strip-shaped silicon dioxide mask 15 is then selectively removed by a lithography technique to form a strip-shaped silicon dioxide mask 15a on a center region except on side regions adjacent to the facets. The center region is separated by the side regions from the facets. As a result of the selective removal of the strip-shaped silicon dioxide mask 15, the upper surface of the mesa stripe p-GaAs cap layer 9 is exposed on the side regions.

Figure 7D:
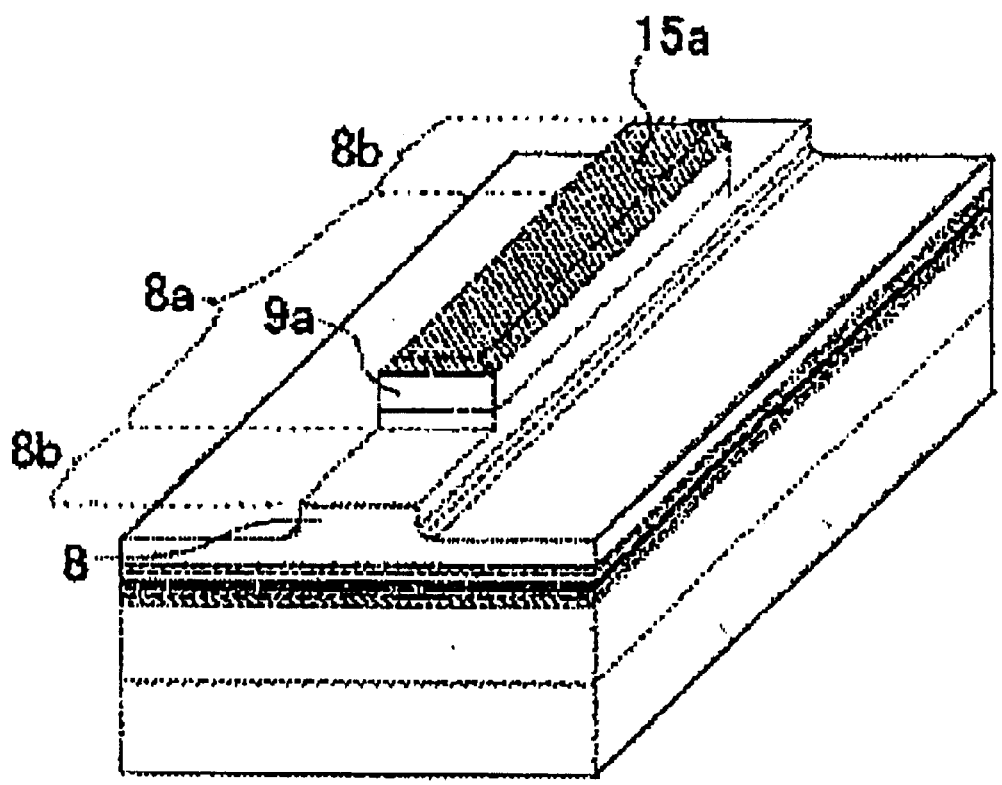

With reference to FIG. 7D, the p-GaAs cap layer 9 and the p-$Al_{0.315}Ga_{0.685}As$ cladding layer 8 are selectively removed by a dry etching process by use of the strip-shaped silicon dioxide mask 15a, so that the exposed parts of the mesa stripe p-GaAs cap layer 9 on the side regions are removed, whereby the upper surfaces of the p-$Al_{0.315}Ga_{0.615}As$ cladding layer 8 are exposed on side regions of the stripe-shaped selective region. Further, the p-$Al_{0.315}Ga_{0.685}As$ cladding layer 8 on the side regions of the mesa stripe p-GaAs cap layer 9 is removed at an etching depth of 2.0 micrometers, so that the p-$Al_{0.315}Ga_{0.685}As$ cladding layer 8 has a mesa portion and etched thin portions present on both sides of the mesa portion. The dry etching process is carried out under a condition of a large difference in etching rate between silicon dioxide and p-$Al_{0.315}Ga_{0.685}As$ and p-GaAs, so that p-$Al_{0.315}Ga_{0.685}As$ selectively etched. The mesa portion has a thickness of 2.5 micrometers.

The p-GaAs cap layer 9 remains only under the strip-shaped silicon dioxide mask 15a. The p-$Al_{0.315}Ga_{0.685}As$ cladding layer 8 becomes a mesa portion having a thickness of 2.5 micrometers and thin side portions having a thickness of 0.5 micrometers. A height of the mesa portion is 2 micrometers. The height of the mesa portion is defined to be a difference in level between the upper surface level of the etched thin portions and the top surface of the mesa portion. The mesa portion has a uniform bottom width of 3 micrometers.

Figure 7E:
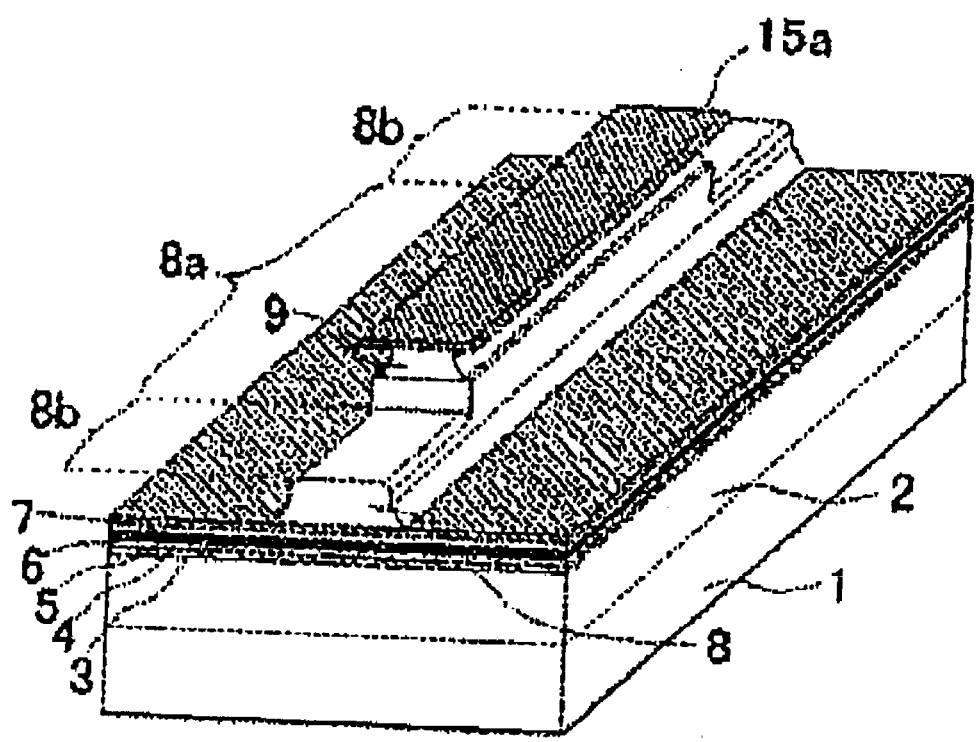

With reference to FIG. 7E, the p-$Al_{0.315}Ga_{0.685}As$ cladding layer 8 is further selectively removed by an additional wet etching process carried out by use of the strip-shaped silicon dioxide mask 15a and another composition-selective etchant which comprises a mixture of a citric acid solution and hydrogen peroxide at a high mixing ratio. The additional wet etching process is carried out at a time which corresponds to a necessary time for obtaining a 1 micrometer etching depth of the p-$Al_{0.315}Ga_{0.685}AS$, Since the thickness of the thin flat portions of the p-$Al_{0.315}Ga_{0.685}As$ cladding layer 8 prior to this etching process is 0.5 micrometers, then in the additional wet etching process, the upper surface of the p-$Al_{0.45}Ga_{0.55}As$ etching stopper layer 7 is exposed on both side regions of the mesa structure. After the upper surface of the p-$Al_{0.450}Ga_{0.55}As$ etching stopper layer 7 is exposed, then the etching in the vertical direction is stopped.

Since the mesa structure of the p-$Al_{0.315}Ga_{0.685}As$ cladding layer 8 prior to this etching process has the uniform thickness of 2.5 micrometers, the thickness of the mesa structure on the side regions becomes 1.5 micrometers.

As a result of this additional etching process using the strip-shaped silicon dioxide mask 15a, the p-$Al_{0.315}Ga_{0.685}As$ cladding layer 8 becomes the mesa structure which comprises a thick center region 8a, and thin side regions 8b. The thick center region 8a has a thickness of 2.5 micrometers. The thin side regions 8b have a thickness of 1.5 micrometers. A difference in height or thickness between the thick center region 8a and the thin side regions 8b is 1 micrometer. The mesa structure has a uniform bottom width of 3 micrometers. The mesa structure serves as the ridge waveguide structure. The thick center region 8a of the mesa structure serves as the current injection center region of the ridge waveguide structure. The thin side regions 8b of the mesa structure serve as the current non-injection side regions of the ridge waveguide structure.

Second Embodiment

Figure 8:
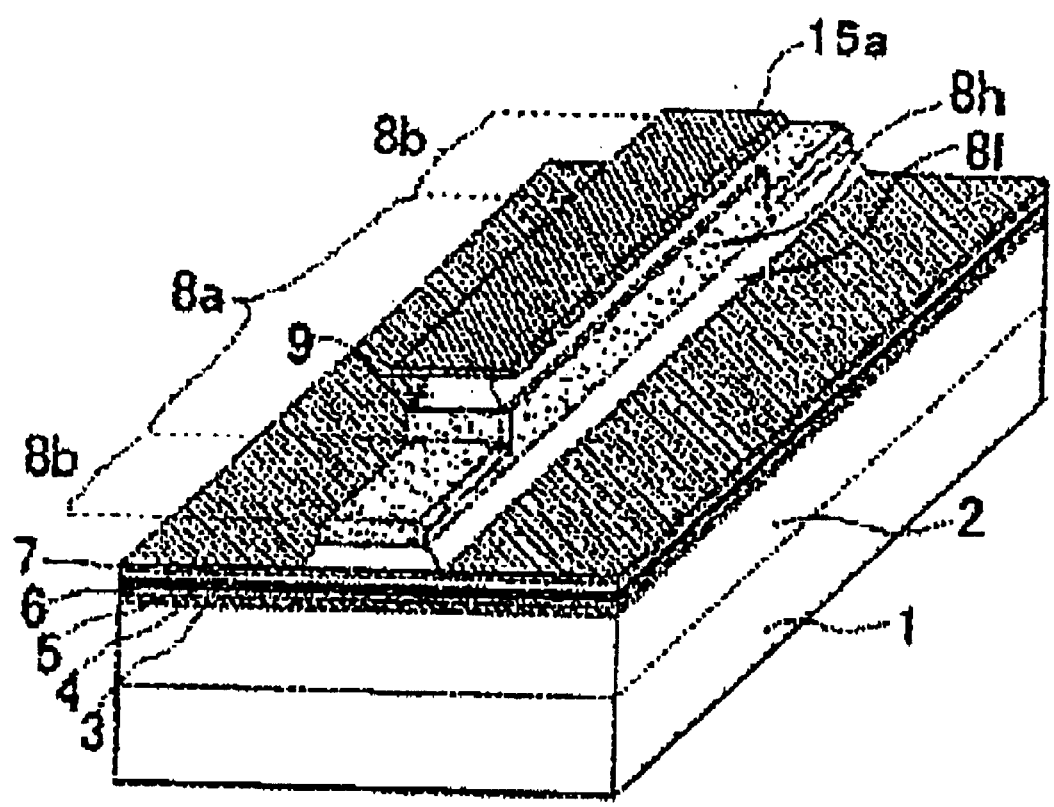
FIG. 8 is a fragmentary schematic perspective view of an improved ridge waveguide structure of a semiconductor laser device in a second embodiment according to the present invention.

A second embodiment according to the present invention will be described in detail with reference to the drawings. FIG. 8 is a fragmentary schematic perspective view of an improved ridge waveguide structure of a semiconductor laser device in a second embodiment according to the present invention.

A semiconductor laser device is provided over an n-GaAs substrate 1 doped with Si at a doping concentration of $1\times10^{18}$ cm$^{-3}$. An n-$Al_{0.315}Ga_{0.685}As$ cladding layer 2 doped with Si at a doping concentration of $1\times10^{17}$ cm$^{-3}$ overlies an upper surface of the n-GaAs substrate 1. The n-$Al_{0.315}Ga_{0.685}As$ cladding layer 2 has a thickness of 2.5 micrometers. An n-$Al_{0.45}Ga_{0.55}As$ etching stopper layer 3 doped with Si at a doping concentration of $1\times10^{17}$ cm$^{-3}$ overlies an upper surface of the n-$Al_{0.315}Ga_{0.685}As$ cladding layer 2. The n-$Al_{0.45}Ga_{0.55}As$ etching stopper layer 3 has a thickness of 100 nanometers. An n-$Al_{0.3}Ga_{0.7}As$ inner cladding layer 4 doped with Si at a doping concentration of $1\times10^{17}$ cm$^{-3}$ overlies an upper surface of the n-$Al_{0.45}Ga_{0.55}As$ etching stopper layer 3. The n-$Al_{0.3}Ga_{0.7}As$ inner cladding layer 4 has a thickness of 200 nanometers.

A separate confinement hetero-structure layer 5 overlies an upper surface of the n-$Al_{0.3}Ga_{0.7}As$ inner cladding layer 4. The separate confinement hetero-structure layer 5 includes a strained double quantum well active layer. The strained double quantum well active layer comprises laminations of an $Al_{0.2}Ga_{0.8}As$ layer having a thickness of 15 nanometers, an $Al_{0.1}Ga_{0.9}As$ layer having a thickness of 15 nanometers, a GaAs layer having a thickness of 8 nanometers, an $In_{0.24}Ga_{0.76}As$ layer having a thickness of 5 nanometers, a GaAs layer having a thickness of 8 nanometers, an $In_{0.24}Ga_{0.76}As$ layer having a thickness of 5 nanometers, a GaAs layer having a thickness of 8 nanometers, an $Al_{0.1}Ga_{0.9}As$ layer having a thickness of 15 nanometers, and an $Al_{0.2}Ga_{0.8}As$ layer having a thickness of 15 nanometers.

A p-$Al_{0.3}Ga_{0.7}As$ inner cladding layer 6 doped with Mg at a doping concentration of $1\times10^{18}$ cm$^{-3}$ overlies an upper surface of the separate confinement hetero-structure layer 5. The p-$Al_{0.3}Ga_{0.7}As$ inner cladding layer 6 has a thickness of 200 nanometers. A p-$Al_{0.45}Ga_{0.55}As$ etching stopper layer 7 doped with Mg at a doping concentration of $1\times10^{18}$ cm$^{-3}$ overlies an upper surface of the p-$Al_{0.3}Ga_{0.7}As$ inner cladding layer 6. The p-$Al_{0.45}Ga_{0.55}AS$ etching stopper layer 7 has a thickness of 100 nanometers.

A p-$Al_{0.315}Ga_{0.685}As$ cladding layer 8 overlies a stripe-shaped selective region of an upper surface of the p-$Al_{0.45}Ga_{0.55}As$ etching stopper layer 7. The p-$Al_{0.315}Ga_{0.685}As$ cladding layer 8 serves as a ridge waveguide structure. The p-$Al_{0.315}Ga_{0.685}As$ cladding layer 8 extends between front and rear facets and along a longitudinal center axis parallel to a cavity length. The p-$Al_{0.315}Ga_{0.685}As$ cladding layer 8 comprises a current injection center region 8a and current non-injection side regions $8b$ adjacent to the facets, wherein the current injection center region $8a$ is separated by the current non-injection side regions $8b$ from the facets. The current injection center region $8a$ has a height of 2.5 micrometers. The current non-injection side regions $8b$ have a height of 1.5 micrometers. Namely, the current non-injection side regions $8b$ are lower in height than the current injection center region $8a$. The current injection center region $8a$ and the current non-injection side regions $8b$ have a uniform bottom width of 3 micrometers.

The p-$Al_{0.315}Ga_{0.685}As$ cladding layer 8 has a double layered structure of laminations of lower and upper cladding layers $8l$ and $8h$. The lower cladding layer $8l$ is doped with Mg at a doping concentration of $1\times10^{18}$ cm$^{-3}$. The upper cladding layer $8h$ is doped with Mg at a doping concentration of $2\times10^{18}$ cm$^{-3}$. The lower cladding layer $8l$ is lower in doping concentration than the upper cladding layer $8h$. The lower cladding layer $8l$ has a uniform thickness of 1 micrometers throughout the current injection region $8a$ and the current non-injection regions $8b$. The upper cladding layer $8h$ has a thickness of 1.5 micrometers on the current injection region $8a$ and another thickness of 0.5 micrometers on the current non-injection regions $8b$.

A p-GaAs cap layer 9 doped with Mg at a doping concentration of $5\times10^{18}$ cm$^{-3}$ overlies an upper surface of the current injection region $8a$ of the p-$Al_{0.315}Ga_{0.685}As$ cladding layer 8.

Even FIG. 8 does not illustrate, the following structures are provided as shown in FIG 9. An n-$Al_{0.45}Ga_{0.55}As$ current clocking layer 10 doped with Si at a doping concentration of $5\times10^{17}$ cm$^{-3}$ overlies the upper surface of the p-$Al_{0.45}Ga_{0.55}As$ etching stopper layer 7 except over the stripe-shaped selective region, so that the n-$Al_{0.45}Ga_{0.55}AS$ current clocking layer 10 is in contact with the both side walls of the mesa-structured p-$Al_{0.315}Ga_{0.685}As$ cladding layer 8 and the p-GaAs cap layer 9 as well as in contact with the upper surfaces of the current non-injection regions $8b$ of the p-$Al_{0.315}Ga_{0.685}As$ cladding layer 8. An n-GaAs current clocking layer 11 doped with Si at a doping concentration of $1\times10^{18}$ cm$^{-3}$ overlies the upper surface of the n-$Al_{0.45}Ga_{0.55}As$ current clocking layer 10. An upper surface of the n-GaAs current clocking layer 11 is leveled to the upper surface of the p-GaAs cap layer 9, so as to form a flat upper surface. The above n-$Al_{0.45}Ga_{0.55}As$ current clocking layer 10 and the n-GaAs current clocking layer 11 may be formed by a buried growth. A p-GaAs contact layer 12 doped with Mg at a doping concentration of $1\times10^{19}$ cm$^{-3}$ overlies the flat upper surface, for example, the upper surfaces of the n-GaAs current clocking layer 11 and the p-GaAs cap layer 9. A p-electrode 13 is provided on a bottom surface of the substrate 1. An n-electrode 14 is provided on an upper surface of the p-GaAs contact layer 12.

The facets of the cavity may generally be formed by cleaving a wafer. A front facet, from which a laser beam is emitted, is coated with a low reflectance coat, so that the front facet may have a low reflection in the range of 1–5% and preferably 2–4%. A rear facet opposite to the front facet is coated with a high reflectance coat, so that the rear facet may have a high reflection in the range of 90–99% and preferably 95–99%.

The ridge waveguide structure 8 has a uniform bottom width throughout the current injection region $8a$ and the current non-injection regions $8b$. The height of the current non-injection regions $8b$ is lower by 1 micrometer than the height of the current injection region $8a$. The ridge waveguide structure 8 of the second embodiment has the same difference in height between the current injection region $8a$ and the current non-injection regions $8b$ as the ridge waveguide structure 8 of the above first embodiment.

The ridge waveguide structure 8 of the second embodiment is substantially identical in the coupling efficiency or the coupling loss to the ridge waveguide structure 8 of the above first embodiment. The lower cladding layer $8l$ has the lower doping concentration and the higher sheet resistance than the upper cladding layer $8h$. The lower cladding layer $8l$ has the uniform thickness throughout the current injection region $8a$ and the current non-injection regions $8b$. The upper cladding layer $8h$ has a difference in thickness, wherein the upper cladding layer $8h$ is thick at 1.5 micrometers on the current injection region $8a$ and is thin at 0.5 micrometers on the current non-injection regions $8b$. The sheet resistance of the current non-injection regions $8b$ of the ridge waveguide structure of the second embodiment is lower than the sheet resistance of the current non-injection regions $8b$ of the ridge waveguide structure of the first embodiment. The ridge waveguide structure 8 of the second embodiment may provide a higher effect of suppressing the diffusion current density at the facets as compared to the ridge waveguide structure 8 of the first embodiment.

The above ridge waveguide structure 8 of the second embodiment may be formed in substantially the same processes as in the first embodiment.

Third Embodiment

A third embodiment according to the present invention will be described in detail with reference to the drawings. FIG. 9 is a fragmentary schematic perspective view of a semiconductor laser device with an improved ridge waveguide structure in a third embodiment according to the present invention.

A semiconductor laser device is provided over an n-GaAs substrate 1 doped with Si at a doping concentration of $1\times10^{18}$ cm$^{-3}$. An n-$Al_{0.45}Ga_{0.55}As$ outer cladding layer 16 doped with Si at a doping concentration of $1\times10^{17}$ cm$^{-3}$ overlies an upper surface of the n-GaAs substrate 1. The n-$Al_{0.45}Ga_{0.55}As$ outer cladding layer 16 has a thickness of 1 micrometer. An n-$Al_{0.3}Ga_{0.7}As$ cladding layer 17 doped with Si at a doping concentration of $1\times10^{17}$ cm$^{-3}$ overlies an upper surface of the n-$Al_{0.45}Ga_{0.55}As$ outer cladding layer 16. The n-$Al_{0.3}Ga_{0.7}As$ cladding layer 17 has a thickness of 1 micrometer. An n-$Al_{0.45}Ga_{0.55}As$ etching stopper layer 3 doped with Si at a doping concentration of $1\times10^{17}$ cm$^{-3}$ overlies an upper surface of the n-$Al_{0.3}Ga_{0.7}As$ cladding layer 17. The n-$Al_{0.45}Ga_{0.55}As$ etching stopper layer 3 has a thickness of 100 nanometers. An n-$Al_{0.3}Ga_{0.7}As$ inner cladding layer 4 doped with Si at a doping concentration of $1\times10^{17}$ cm$^{-3}$ overlies an upper surface of the n-$Al_{0.45}Ga_{0.55}As$ etching stopper layer 3. The n-$Al_{0.3}Ga_{0.7}As$ inner cladding layer 4 has a thickness of 200 nanometers.

A separate confinement hetero-structure layer 5 overlies an upper surface of the n-$Al_{0.3}Ga_{0.7}As$ inner cladding layer 4. The separate confinement hetero-structure layer 5 includes a strained double quantum well active layer. The strained double quantum well active layer comprises laminations of an $Al_{0.2}Ga_{0.8}As$ layer having a thickness of 15 nanometers, an $Al_{0.1}Ga_{0.9}As$ layer having a thickness of 15 nanometers, a GaAs layer having a thickness of 8 nanometers, an $In_{0.24}Ga_{0.76}As$ layer having a thickness of 5 nanometers, a GaAs layer having a thickness of 8 nanometers, an $In_{0.24}Ga_{0.76}As$ layer having a thickness of 5 nanometers, a GaAs layer having a thickness of 8 nanometers, an $Al_{0.1}Ga_{0.9}As$ layer having a thickness of 15 nanometers, and an $Al_{0.2}Ga_{0.8}As$ layer having a thickness of 15 nanometers.

A p-$Al_{0.3}Ga_{0.7}As$ inner cladding layer 6 doped with Mg at a doping concentration of $1\times10^{18}$ cm$^{-3}$ overlies an upper surface of the separate confinement hetero-structure layer 5. The p-$Al_{0.3}Ga_{0.7}As$ inner cladding layer 6 has a thickness of 200 nanometers. A p-$Al_{0.45}Ga_{0.55}As$ etching stopper layer 7 doped with Mg at a doping concentration of $1\times10^{18}$ cm$^{-3}$ overlies an upper surface of the p-$Al_{0.3}Ga_{0.7}As$ inner cladding layer 6. The p-$Al_{0.45}Ga_{0.55}As$ etching stopper layer 7 has a thickness of 100 nanometers.

A ridge waveguide structure 8 overlies a stripe-shaped selective region of an upper surface of the p-$Al_{0.45}Ga_{0.55}As$ etching stopper layer 7. The ridge waveguide structure 8 forms a mesa structure. The ridge waveguide structure 8 extends between front and rear facets and along a longitudinal center axis parallel to a cavity length. The ridge waveguide structure 8 comprises a current injection center region 8a and current non-injection side regions 8b adjacent to the facets, wherein the current injection center region 8a is separated by the current non-injection side regions 8b from the facets. The current injection center region 8a has a height of 2 micrometers. The current non-injection side regions 8b have a height of 1.3 micrometers. Namely, the current non-injection side regions 8b are lower in height than the current injection center region 8a. The current injection center region 8a and the current non-injection side regions 8b have a uniform bottom width of 3 micrometers.

The ridge waveguide structure 8 has a double layered structure of laminations of lower and upper cladding layers 18 and 19, wherein the lower cladding layer 18 is higher in refractive index than the higher cladding layer 19.

The lower cladding layer 18 comprises a p-$Al_{0.3}Ga_{0.7}As$ cladding layer doped with Mg at a doping concentration of $1\times10^{18}$ cm$^{-3}$. The p-$Al_{0.3}Ga_{0.7}As$ lower cladding layer 18 has a uniform thickness of 1 micrometers throughout the current injection region 8a and the current non-injection regions 8b. The upper cladding layer 19 comprises a p-$Al_{0.45}Ga_{0.55}As$ cladding layer doped with Mg at a doping concentration of $2\times10^{18}$ cm$^{-3}$. The upper cladding layer 19 has a difference in thickness between the current injection region 8a and the current non-injection regions 8b, wherein the thickness of the upper cladding layer 19 on the current injection region 8a is 1 micrometer, and the thickness of the upper cladding layer 19 on the current non-injection regions 8b is 0.3 micrometers. A difference in height of the upper cladding layer 19 between the current injection region 8a and the current non-injection regions 8b is 0.7 micrometers.

The thickness of the ridge waveguide structure 8 on the current injection region 8a is 2 micrometers. The thickness of the ridge waveguide structure 8 on the current non-injection regions 8b is 1.3 micrometers. A difference in height of the ridge waveguide structure 8 between the current injection region 8a and the current non-injection regions 8b is 0.7 micrometers. The p-$Al_{0.3}Ga_{0.7}As$ lower cladding layer 18 is higher in refractive index than the p-$Al_{0.4}Ga_{0.55}As$ upper cladding layer 19.

A p-GaAs cap layer 9 doped with Mg at a doping concentration of $5\times10^{18}$ cm$^{-3}$ overlies an upper surface of the current injection region 8a of the upper cladding layer 19.

An n-$Al_{0.45}Ga_{0.55}As$ current clocking layer 10 doped with Si at a doping concentration of $5\times10^{17}$ cm$^{-3}$ overlies the upper surface of the p-$Al_{0.45}Ga_{0.55}As$ etching stopper layer 7 except over the stripe-shaped selective region, so that the n-$Al_{0.45}Ga_{0.55}As$ current clocking layer 10 is in contact with the both side walls of the ridge waveguide structure 8 and the p-GaAs cap layer 9 as well as in contact with the upper surfaces of the current non-injection regions 8b of the ridge waveguide structure 8. An n-GaAs current clocking layer 11 doped with Si at a doping concentration of $1\times10^{18}$ cm$^{-3}$ overlies the upper surface of the n-$Al_{0.45}Ga_{0.55}As$ current clocking layer 10. An upper surface of the n-GaAs current clocking layer 11 is leveled to the upper surface of the p-GaAs cap layer 9, so as to form a flat upper surface. The above n-$Al_{0.45}Ga_{0.55}As$ current clocking layer 10 and the n-GaAs current clocking layer 11 may be formed by a buried growth. A p-GaAs contact layer 12 doped with Mg at a doping concentration of $1\times10^{19}$ cm$^{-3}$ overlies the flat upper surface, for example, the upper surfaces of the n-GaAs current clocking layer 11 and the p-GaAs cap layer 9. A p-electrode 13 is provided on a bottom surface of the substrate 1. An n-electrode 14 is provided on an upper surface of the p-GaAs contact layer 12.

The facets of the cavity may generally be formed by cleaving a wafer. A front facet, from which a laser beam is emitted, is coated with a low reflectance coat, so that the front facet may have a low reflection in the range of 1–5% and preferably 2–4%. A rear facet opposite to the front facet is coated with a high reflectance coat, so that the rear facet may have a high reflection in the range of 90–99% and preferably 95–99%.

The ridge waveguide structure 8 has a uniform bottom width throughout the current injection region 8a and the current non-injection regions 8b. The height of the current non-injection regions 8b is lower by 0.7 micrometers than the height of the current injection region 8a. The ridge waveguide structure 8 of the third embodiment has a smaller difference in height between the current injection region 8a and the current non-injection regions 8b as the ridge waveguide structure 8 of the above first embodiment.

The ridge waveguide structure 8 of the third embodiment is smaller in the coupling efficiency or the coupling loss as compared to the ridge waveguide structure 8 of the above first embodiment. The lower cladding layer 18 has the higher refractive index, whilst the upper cladding layer 19 has the lower refractive index. The higher refractive index of the lower cladding layer 18 dominates the lower refractive index of the upper cladding layer 19, for which reason the difference in effective refractive index between the current injection region 8a and the current non-injection regions 8b is reduced. As a result, under the condition of obtaining the same magnitude of reducing the current density at the facets, the difference in effective refractive index between the current injection region 8a and the current non-injection regions 8b is reduced for suppressing the increase in the coupling loss in the horizontal waveguide mode, thereby suppressing the increase in the oscillation threshold current and the drop of the slope efficiency.

The following descriptions will focus on the novel method of forming the above novel semiconductor laser as one example.

FIGS. 10A through 10H are fragmentary schematic perspective views of semiconductor laser devices in sequential steps involved in a method of forming the novel ridge waveguide structure in the third embodiment in accordance with the present invention.

Figure 10A:
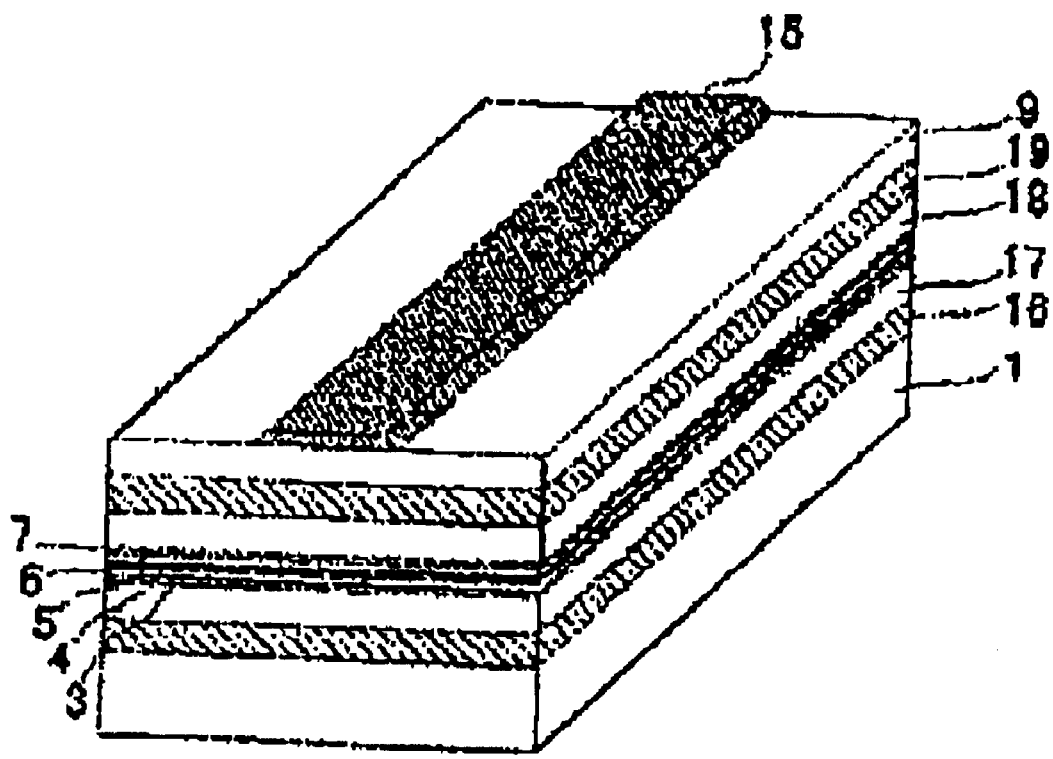
FIGS. 10A through 10H are fragmentary schematic perspective views of semiconductor laser devices in sequential steps involved in a method of forming the novel ridge waveguide structure in the third embodiment in accordance with the present invention.

With reference to FIG. 10A, an n-$Al_{0.45}Ga_{0.55}As$ outer cladding layer 16 doped with Si at a doping concentration of $1\times10^{17}$ cm$^{-3}$ is formed on an upper surface of an n-GaAs substrate 1 doped with Si at a doping concentration of $1 \times 10^{18}$ cm$^{-3}$, so that the n-Al$_{0.45}$Ga$_{0.55}$As outer cladding layer 16 has a thickness of 1 micrometer. An n-Al$_{0.3}$Ga$_{0.7}$As cladding layer 17 doped with Si at a doping concentration of $1 \times 10^{17}$ cm$^{-3}$ is formed on an upper surface of the n-Al$_{0.45}$Ga$_{0.55}$As outer cladding layer 16, so that the n-Al$_{0.3}$Ga$_{0.7}$As cladding layer 17 has a thickness of 1 micrometer An n-Al$_{0.45}$Ga$_{0.55}$As etching stopper layer 3 doped with Si at a doping concentration of $1 \times 10^{17}$ cm$^{-3}$ is formed on an upper surface of the n-Al$_{0.3}$Ga$_{0.7}$As cladding layer 17, so that the n-Al$_{0.45}$Ga$_{0.55}$As etching stopper layer 3 has a thickness of 100 nanometers, An n-Al$_{0.3}$Ga$_{0.7}$As inner cladding layer 4 doped with Si at a doping concentration of $1 \times 10^{17}$ cm$^{-3}$ is formed on an upper surface of the n-Al$_{0.45}$Ga$_{0.55}$As etching stopper layer 3, so that the n-Al$_{0.3}$Ga$_{0.7}$As inner cladding layer 4 has a thickness of 200 nanometers.

A separate confinement hetero-structure layer 5 is formed on an upper surface of the n-Al$_{0.3}$Ga$_{0.7}$As inner cladding layer 4. The separate confinement hetero-structure layer 5 includes a strained double quantum well active layer. The strained double quantum well active layer comprises laminations of an Al$_{0.2}$Ga$_{0.8}$As layer having a thickness of 15 nanometers, an Al$_{0.1}$Ga$_{0.9}$As layer having a thickness of 15 nanometers, a GaAs layer having a thickness of 8 nanometers, an In$_{0.24}$Ga$_{0.76}$As layer having a thickness of 5 nanometers, a GaAs layer having a thickness of 8 nanometers, an In$_{0.24}$Ga$_{0.76}$As layer having a thickness of 5 nanometers, a GaAs layer having a thickness of 8 nanometers, an Al$_{0.1}$Ga$_{0.9}$As layer having a thickness of 15 nanometers, and an Al$_{0.2}$Ga$_{0.8}$As layer having a thickness of 15 nanometers.

A p-Al$_{0.3}$Ga$_{0.7}$As inner cladding layer 6 doped with Mg at a doping concentration of $1 \times 10^{18}$ cm$^{-3}$ is formed on an upper surface of the separate confinement hetero-structure layer 5, so that the p-Al$_{0.3}$Ga$_{0.7}$As inner cladding layer 6 has a thickness of 200 nanometers. A p-Al$_{0.45}$Ga$_{0.55}$As etching stopper layer 7 doped with Mg at a doping concentration of $1 \times 10^{18}$ cm$^{-3}$ is formed on an upper surface of the p-Al$_{0.3}$Ga$_{0.7}$As inner cladding layer 6, so that the p-Al$_{0.45}$Ga$_{0.55}$As etching stopper layer 7 has a thickness of 100 nanometers.

A p-Al$_{0.3}$Ga$_{0.7}$As cladding layer 18 doped with Mg at a doping concentration of $1 \times 10^{18}$ cm$^{-3}$ is formed on an upper surface of the p-Al$_{0.45}$Ga$_{0.55}$As etching stopper layer 7, so that the p-Al$_{0.3}$Ga$_{0.7}$As cladding layer 18 has a thickness of 1 micrometer. A p-Al$_{0.45}$Ga$_{0.55}$As outer cladding layer 19 doped with Mg at a doping concentration of $2 \times 10^{18}$ cm$^{-3}$ is formed on an upper surface of the p-Al$_{0.3}$Ga$_{0.7}$As cladding layer 18, so that the p-Al$_{0.45}$Ga$_{0.55}$As outer cladding layer 19 has a thickness of 1 micrometer. A p-GaAs cap layer 9 doped with Mg at a doping concentration of $5 \times 10^{18}$ cm$^{-3}$ is formed on an upper surface of the p-Al$_{0.45}$Ga$_{0.55}$As outer cladding layer 19, so that the p-GaAs cap layer 9 has a thickness of 1 micrometer.

A silicon dioxide film is formed on an entire surface of the p-GaAs cap layer 9. The silicon dioxide film is selectively removed by use of a lithography technique to selectively form a stripe-shaped silicon dioxide mask 15, wherein the stripe-shaped silicon dioxide mask 15 overlies a predetermined stripe-shaped region which extends along a longitudinal center axis which is in parallel to a cavity length direction, so that the stripe-shaped silicon dioxide mask 15 extends between opposite facets which are distanced from each other in the cavity length direction. The stripe-shaped silicon dioxide mask 15 has a uniform width of 3.5 micrometers.

Figure 10B:
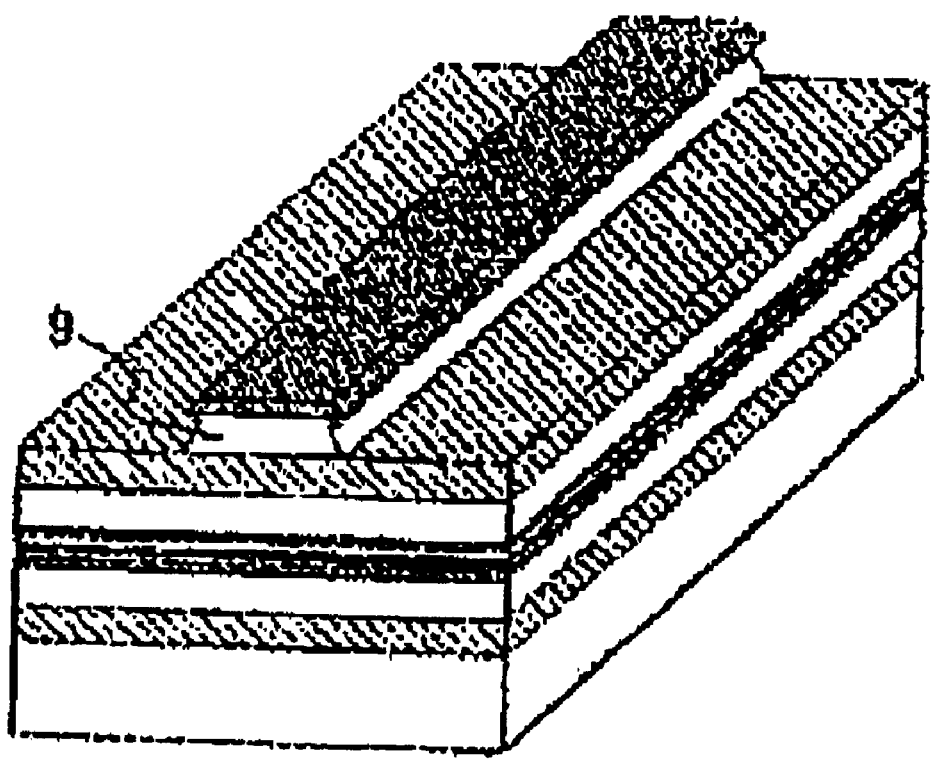

With reference to FIG. 10B, the p-GaAs cap layer 9 is selectively removed by a wet etching process carried out by use of the strip-shaped silicon dioxide mask 15 and a composition-selective etchant which comprises a mixture of a citric acid solution and hydrogen peroxide at a low mixing ratio. As a result of this wet etching, so that the p-GaAs cap layer 9 having a thickness of 2 micrometer is removed except under the strip-shaped silicon dioxide mask 15, and upper surfaces of the p-Al$_{0.315}$Ga$_{0.685}$As cladding layer 8 are exposed on both sides of the strip-shaped silicon dioxide mask 15. Namely, the p-GaAs cap layer 9 becomes a mesa stripe p-GaAs cap layer 9. During the wet etching process, the p-GaAs cap layer 9 receives a side etching, so that the p-GaAs cap layer 9 is etched in a lateral direction, whereby side edges of the strip-shaped silicon dioxide mask 15 extends laterally from the sides of the mesa stripe p-GaAs cap layer 9.

Figure 10C:
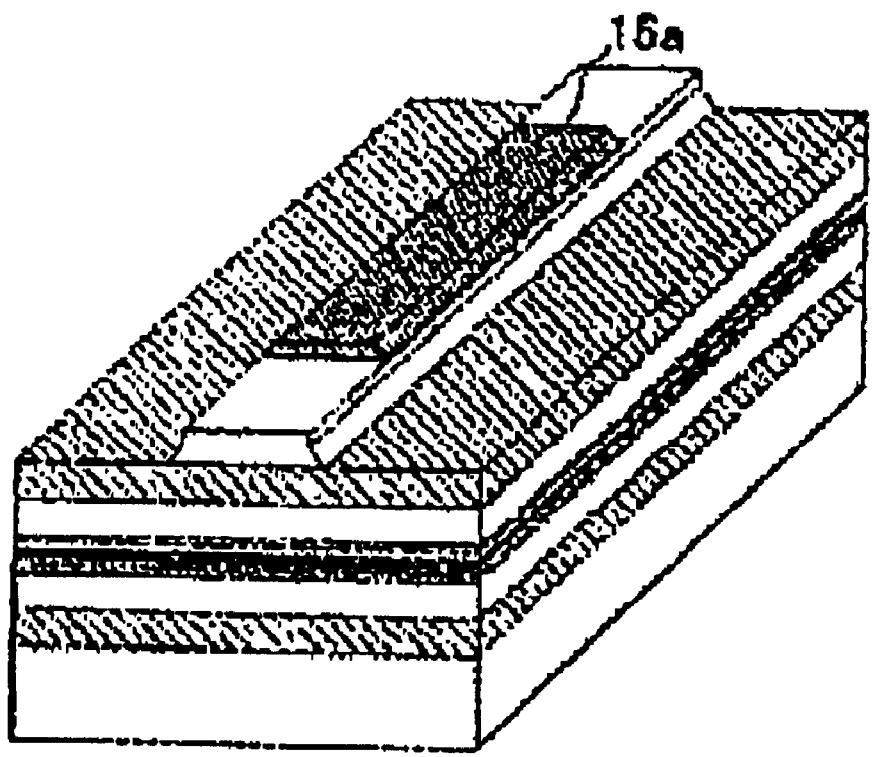

With reference to FIG. 10C, laterally extending side portions of the strip-shaped silicon dioxide mask 15 from the sides of the mesa striped p-GaAs cap layer 9 are removed by use of a buffered fluorine acid solution. Thereafter, the strip-shaped silicon dioxide mask 15 is then selectively removed by a lithography technique to form a strip-shaped silicon dioxide mask 15a on a center region except on side regions adjacent to the facets. The center region is separated by the side regions from the facets. As a result of the selective removal of the strip-shaped silicon dioxide mask 15, the upper surface of the mesa stripe p-GaAs cap layer 9 is exposed on the side regions.

Figure 10D:
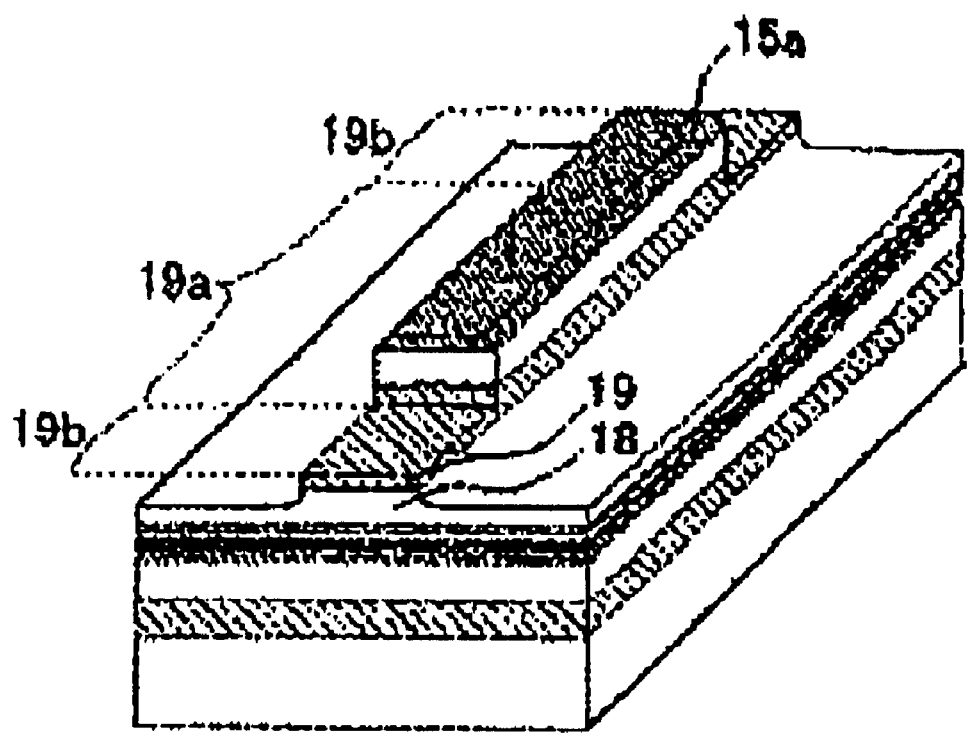

With reference to FIG. 10D, the p-GaAs cap layer 9, the p-Al$_{0.45}$Ga$_{0.55}$As cladding layer 19 and the p-Al$_{0.3}$Ga$_{0.7}$As cladding layer 18 are selectively removed by a dry etching process by use of the strip-shaped silicon dioxide mask 15a, so that the exposed parts of the mesa stripe p-GaAs cap layer 9 on the side regions arc removed. A thickness of the p-Al$_{0.45}$Ga$_{0.55}$As cladding layer 19 on the side regions of the stripe-shaped longitudinal center region is also reduced. The p-Al$_{0.45}$Ga$_{0.55}$As cladding layer 19 in both side regions of the stripe-shaped longitudinal center region are removed. The p-Al$_{0.3}$Ga$_{0.7}$As cladding layer 18 on the side regions of the stripe-shaped longitudinal center region is partially etched at an etching depth of 0.7 micrometers, so that the thickness of the p-Al$_{0.3}$Ga$_{0.7}$As cladding layer 18 on the side regions of the stripe-shaped longitudinal center region becomes 0.3 micrometers.

The p-GaAs cap layer 9 remains only under the strip-shaped silicon dioxide mask 15a. The p-Al$_{0.45}$Ga$_{0.55}$As cladding layer 19 remains only on the stripe-shaped longitudinal center region. The p-Al$_{0.3}$Ga$_{0.67}$As cladding layer 18 becomes a mesa portion having a thickness of 0.7 micrometers and thin side portions having a thickness of 0.3 micrometers. A mesa structure comprises the remaining p-Al$_{0.45}$Ga$_{0.55}$As cladding layer 19 and the mesa portion of the p-Al$_{0.3}$Ga$_{0.67}$As cladding layer 18. A height of the mesa structure is 1.7 micrometers. The height of the mesa structure is defined to be a difference in level between the upper surface level of the etched thin portions and the top surface of the mesa portion. The mesa structure has a uniform bottom width of 3 micrometers.

Figure 10E:
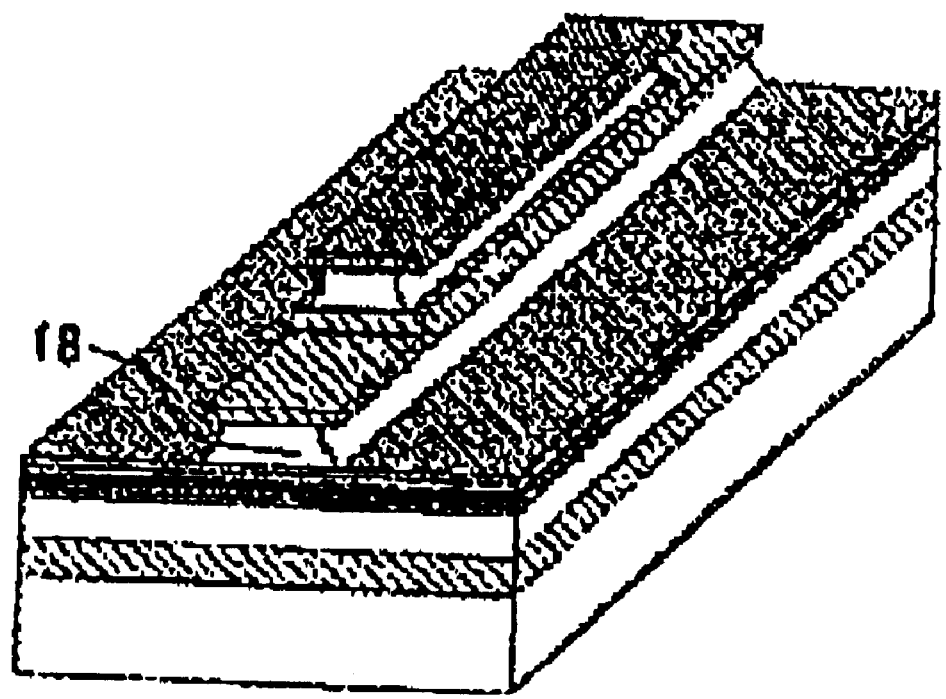

With reference to FIG. 10E, the p-Al$_{0.3}$Ga$_{0.7}$As cladding layer 18 is further selectively removed by an additional wet etching process carried out by use of the strip-shaped silicon dioxide mask 15a and another composition-selective etchant which comprises a mixture of a citric acid solution and hydrogen peroxide at a high mixing ratio. The additional wet etching process is carried out at a time which corresponds to a necessary time for obtaining a 0.5 micrometers etching depth of the p-Al$_{0.3}$Ga$_{0.7}$As. The p-Al$_{0.45}$Ga$_{0.55}$As cladding layer 19 and the p-Al$_{0.45}$Ga$_{0.55}$As etching stopper layer 7 are not etched.

Since the thickness of the thin flat portions of the p-Al$_{0.3}$Ga$_{0.7}$As cladding layer 18 prior to this etching process is 0.3 micrometers, then in the additional wet etching process, the upper surface of the p-Al$_{0.45}$Ga$_{0.55}$As etching stopper layer 7 is exposed on both side regions of the mesa structure. After the upper surface of the p-Al$_{0.45}$Ga$_{0.55}$As etching stopper layer 7 is exposed, then the etching in the vertical direction is stopped.

As a result of this additional etching process using the strip-shaped silicon dioxide mask 15a, the laminations of the p-Al$_{0.3}$Ga$_{0.7}$As cladding layer 18 and the p-Al$_{0.45}$Ga$_{0.55}$As cladding layer 19 become the mesa structure which comprises a thick center region 19a, and thin side regions 19b. The thick center region 19a has a thickness of 2 micrometers. The thin side regions 19b have a thickness of 1.3 micrometers. A difference in height or thickness between the thick center region 19a and the thin side regions 19b is 0.7 micrometer. The mesa structure has a uniform bottom width of 3 micrometers. The mesa structure serves as the ridge waveguide structure. The thick center region 19a of the mesa structure serves as the current injection center region of the ridge waveguide structure. The thin side regions 19b of the mesa structure serve as the current non-injection side regions of the ridge waveguide structure.

Figure 10F:
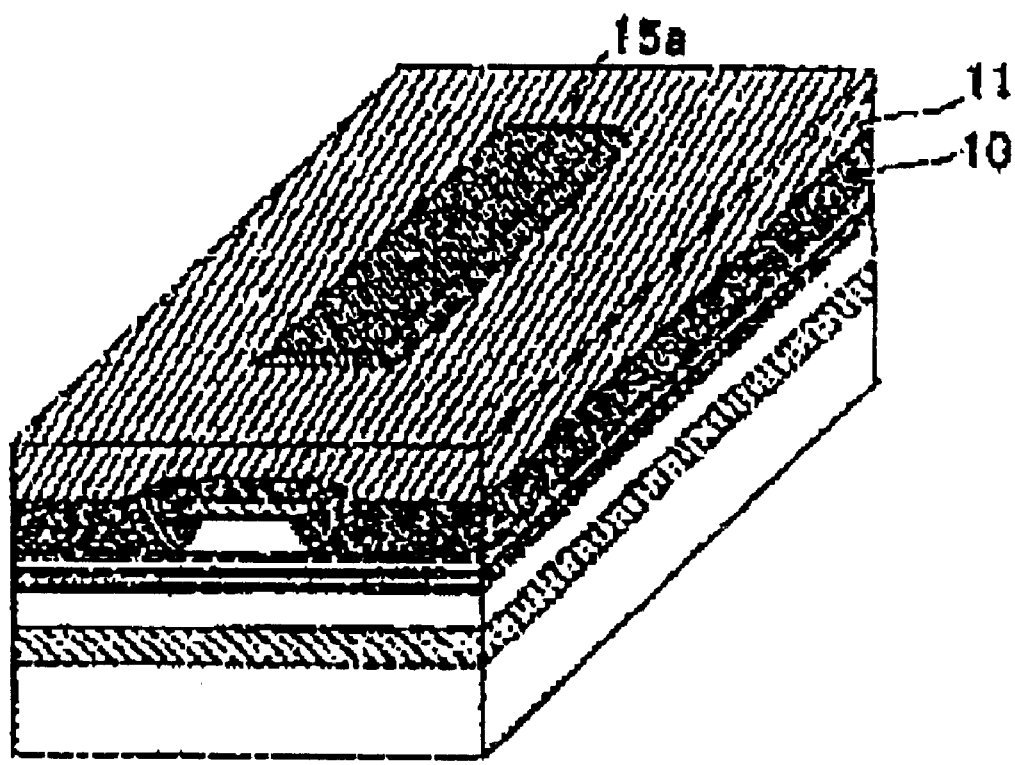

With reference to FIG. 10F, a metal organic vapor phase epitaxy is carried out by using the above stripe-shaped silicon dioxide mask 15a to form current blocking layers 10 and 11, so that both sides of the ridge waveguide structure are bounded with the current blocking layers 10 and 11, and also the upper surfaces of the ridge waveguide structure on the side regions are also bounded with the current blocking layer 10. An upper surface of the current blocking layer 11 is level to an upper surface of the p-GaAs cap layer 9 to form a plane top surface.

Figure 10G:
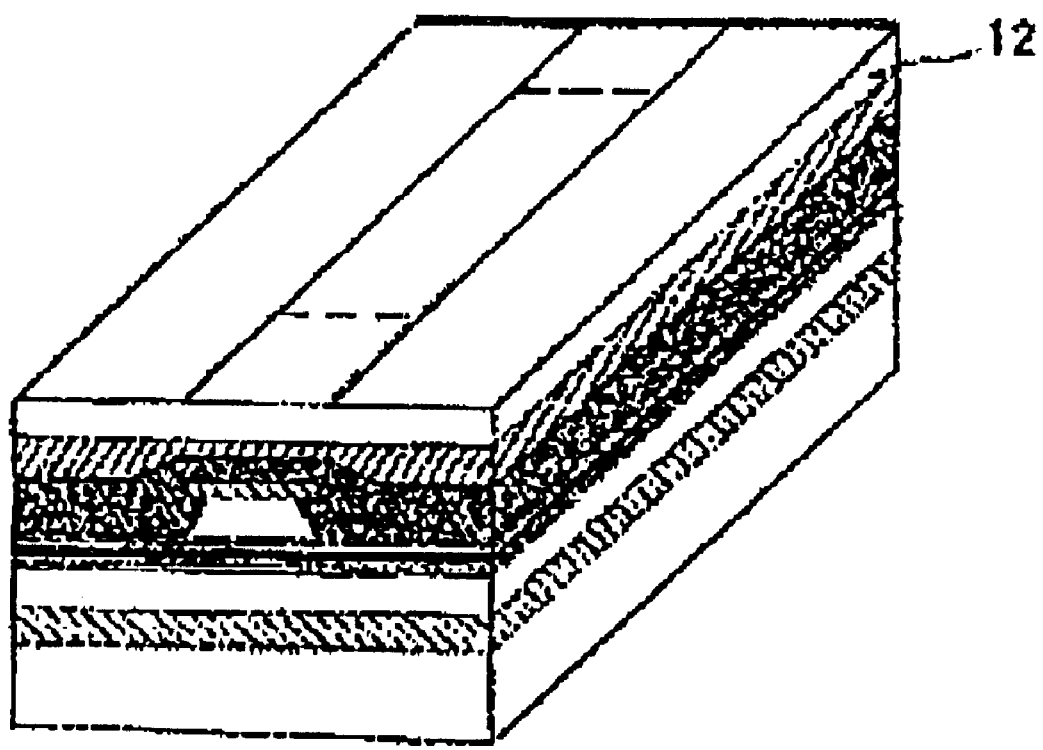

With reference to FIG. 10G, the above stripe-shaped silicon dioxide mask 15a is removed. Another metal organic vapor phase epitaxy is carried out to form a p-GaAs contact layer 12 on an entire plane top surface, for example over the current blocking layer 11 and the p-GaAs cap layer 9.

Figure 10H:
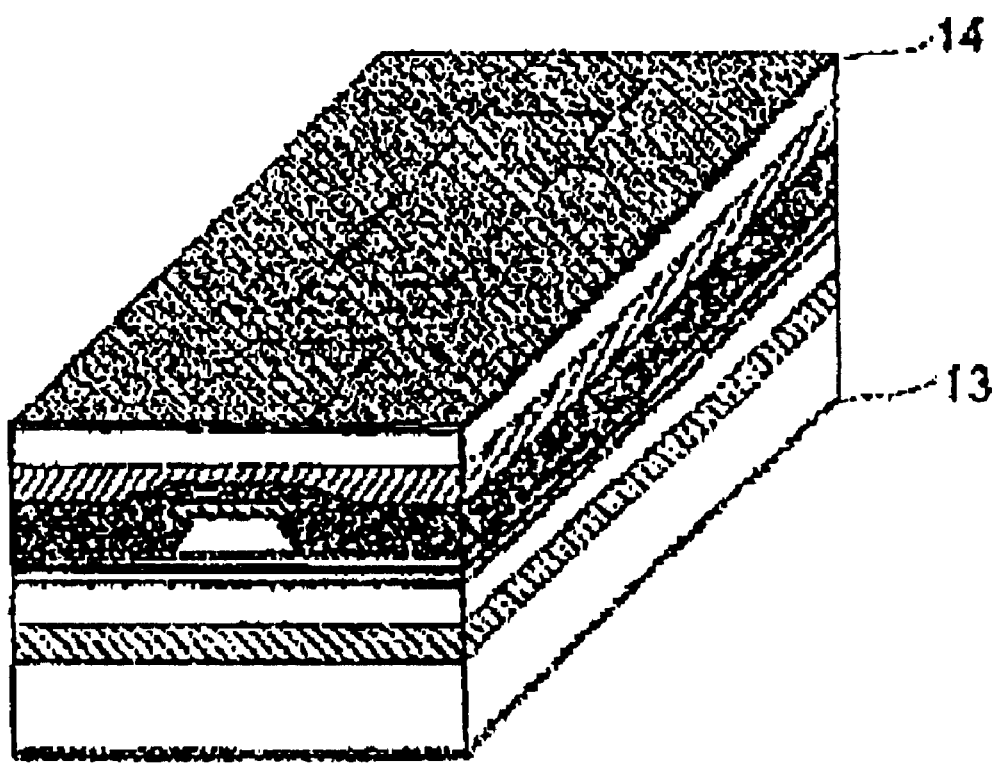

With reference to FIG. 10H, a p-electrode 13 is formed on an entire upper surface of the p-GaAs contact layer 12. A bottom surface of the substrate 1 is polished, so that a thickness of the wafer becomes 80 micrometers, before an n-electrode 14 is formed on an entire bottom surface of the substrate 1.

In accordance with the above first, second and third embodiments, the above improved ridge waveguide structure has a uniform bottom width throughout the current injection region and the current non-injection regions adjacent to the facets and separating the current injection region from the facets, for suppressing the coupling loss in the horizontal waveguide mode at boundaries between the current injection region and the current non-injection regions.

Examinations

In order to investigate the above effects of the semiconductor light emitting devices of the first to third embodiments, the following examinations were made.

The novel semiconductor light-emitting devices having the same structures as described in the above first to third embodiments were prepared, wherein a cavity length was set at 900 micrometers, and each of the current non-injection regions of the ridge waveguide structure has a length of 30 micrometers. Both side walls of the ridge waveguide structure and the upper surfaces of the current non-injection regions are covered by the current blocking layers. The front facet is coated with a low reflectance of 3%. The rear facet is coated with a high reflectance of 95%.

The above novel semiconductor light-emitting devices in the above first to third embodiments will be referred to as first to third novel semiconductor light-emitting devices.

Further, semiconductor light-emitting devices of comparative examples 1–5 were also prepared. A first comparative semiconductor light-emitting device is structurally different from the above first novel semiconductor light-emitting device in that a ridge waveguide structure has a uniform height and a uniform width, and the ridge waveguide structure free of the current non-injection regions adjacent to the facets.

A second comparative semiconductor light-emitting device is structurally different from the above first novel semiconductor light-emitting device in that a ridge waveguide structure has a uniform height and a uniform width, and a p-electrode is selectively provided except on side regions adjacent to the facets, wherein each of the side regions has a length of 30 micrometers in the cavity length direction.

A third comparative semiconductor light-emitting device is structurally different from the above first novel semiconductor light-emitting device in that a ridge waveguide structure has a uniform height and a uniform width, and a cap layer and a p-electrode are selectively provided except on side regions adjacent to the facets, wherein each of the side regions has a length of 30 micrometers in the cavity length direction.

A fourth comparative semiconductor light-emitting device is structurally different from the above first novel semiconductor light-emitting device in that a ridge waveguide structure has differences in both height and width at boundaries between the current injection region and the current non-injection regions, wherein the current non-injection regions are smaller in both height and width than the current injection region.

A fifth comparative semiconductor light-emitting device is structurally different from the above third novel semiconductor light-emitting device in that the ridge waveguide structure free of the current non-injection regions adjacent to the facets.

A plurality of samples were prepared for each type of the above first to third novel semiconductor light-emitting devices and the first to fifth comparative semiconductor light-emitting devices. The samples were measured in threshold current, slope efficiency, maximum optical output, and results under the same conditions for ambient temperature, heat sink temperature, mount wiring conditions etc.

Averaged values for each of the measured parameters are shown on the following table 1.

TABLE 1

|  | Ith (mA) | Slope(mW/mA) | Outmax (mW) | "limitation factor" |
|---|---|---|---|---|
| Comp. Ex. 1 | 30 | 0.8 | 450 | optical break |
| Comp. Ex. 2 | 31 | 0.8 | 460 | optical break |
| Comp. Ex. 3 | 32 | 0.8 | 475 | optical break |
| Comp. Ex. 4 | 35 | 0.75 | 480 | optigal break |
| Comp. Ex. 5 | 28 | 0.83 | 460 | optical break |
| Example 1 | 33 | 0.78 | 510 | optical break |

TABLE 1-continued

|  | Ith (mA) | Slope(mW/mA) | Outmax (mW) | "limitation factor" |
|---|---|---|---|---|
| Example 2 | 30 | 0.8 | 540 | optical break thermal saturation |
| Example 3 | 29 | 0.82 | 560 | thermal saturation |

"Ith" represents the threshold current. "Slope" represents the slope efficiency. "Outmax" represents the maximum optical output, "limitation factor" represents the factor causing the limitation to the maximum optical output. The maximum optical output is limited by optical break and/or thermal saturation.

The first comparative semiconductor light-emitting device was used as a standard for evaluation on the current non-injection effect and the improvement of the maximum optical output. The second, third and fourth comparative semiconductor light-emitting devices have the current non-injection regions providing the current non-injection effect, for which reason the second, third and fourth comparative semiconductor light-emitting devices are slightly improved in the maximum optical output at not more than 7% in comparison with the first comparative semiconductor light-emitting device. The first, second, third and fourth comparative semiconductor light-emitting devices are limited in the maximum optical output by the optical break.

As compared to the first comparative semiconductor light-emitting device, the fifth comparative semiconductor light-emitting device utilizes the same material for the inner cladding layers and the cladding layers for increasing the seeped light quantity into the cladding layer to cause a relative decrease of the confined light quantity in the active region. There is no difference between the first and fifth comparative semiconductor light-emitting devices in critical optical density in the active region at the facets, wherein the critical optical density is defined to be an optical density for causing the optical break. There is, however, a difference between the first and fifth comparative semiconductor light-emitting devices in the optical confinement efficiency for confining the light in the active region. Due to this difference in the optical confinement efficiency, the fifth comparative semiconductor light-emitting device is slightly higher in the maximum optical output than the first comparative semiconductor light-emitting device.

The second comparative semiconductor light-emitting device is higher in threshold current than the first comparative semiconductor light-emitting device. The third comparative semiconductor light-emitting device is higher in threshold current than the second comparative semiconductor light-emitting device. The fourth comparative semiconductor light-emitting device is higher in threshold current than the third comparative semiconductor light-emitting device. The threshold current is high as the obtained current-non-injection effect is high. As the obtained current-non-injection effect is high, a necessary amount of the total current for reaching the threshold minority carrier density in the current non-injection regions adjacent to the facets is also high.

There is substantially no difference in the slope efficiency among the first, second and third comparative semiconductor light-emitting devices because there is substantially no difference in coupling loss in the cavity. The fourth comparative semiconductor light-emitting device has an additional coupling loss in the horizontal mode due to a difference in width of the ridge waveguide structure at boundaries between the current injection region and the current non-injection regions. This additional coupling loss causes the drop of the slope efficiency.

On the other hands, as compared to the first comparative semiconductor light-emitting device, the first novel semiconductor light-emitting device has a small increase in threshold current due to the current non-injection effect and has a small drop in slope efficiency due to the coupling loss in the vertical mode caused by the difference in height between the current injection region and the current non-injection regions. As compared to the fourth comparative semiconductor light-emitting device, the first novel semiconductor light-emitting device are less in the increase of the threshold current and the drop of the slope efficiency. Namely, as compared to the fourth comparative semiconductor light-emitting device, the first novel semiconductor light-emitting device provides the larger effects of suppressing the drop of the slope efficiency and suppressing the temperature increase at the facets. The fourth comparative semiconductor light-emitting device provides only 7% improvement in the maximum optical output with reference to the first comparative semiconductor light-emitting device. The first novel semiconductor light-emitting device provides 13% improvement in the maximum optical output with reference to the first comparative semiconductor light-emitting device.

The first novel semiconductor light-emitting device has the single layered ridge waveguide structure. The second novel semiconductor light-emitting device has the double layered ridge waveguide structure comprising the lower and upper cladding layers, wherein the lower cladding layer is lower in doping concentration than the upper cladding layer for obtaining higher current non-injection effect. For this reason, the second novel semiconductor light-emitting device provides 20% improvement in the maximum optical output with reference to the first comparative semiconductor light-emitting device.

The third novel semiconductor light-emitting device also has the double layered ridge waveguide structure comprising the lower and upper cladding layers, wherein the lower cladding layer is lower in doping concentration and higher in refractive index than the upper cladding layer for obtaining higher current non-injection effect. For this reason, the third novel semiconductor light-emitting device provides 24% improvement in the maximum optical output with reference to the first comparative semiconductor light-emitting device.

The firth comparative semiconductor light-emitting device also has the double layered ridge waveguide structure comprising the lower and upper cladding layers, wherein the lower cladding layer is lower in doping concentration and higher in refractive index than the upper cladding layer for obtaining higher current non-injection effect. However, this double layered ridge waveguide structure is free of the current non-injection regions adjacent to the facets For this reason, the third novel semiconductor light-emitting device provides 22% improvement in the maximum optical output with reference to the fifth comparative semiconductor light-emitting device.

The limitation to the maximum optical output of the first novel semiconductor light-emitting device mainly depends on the optical break. The limitation to the maximum optical output of the second novel semiconductor light-emitting device depends on both the optical break and the heat saturation. A half of the total sample number depends on the optical break, and the remaining half of the total sample number depends on the heat saturation. The limitation to the maximum optical output of the third novel semiconductor light-emitting device all depends on the heat saturation.

Figure 11:
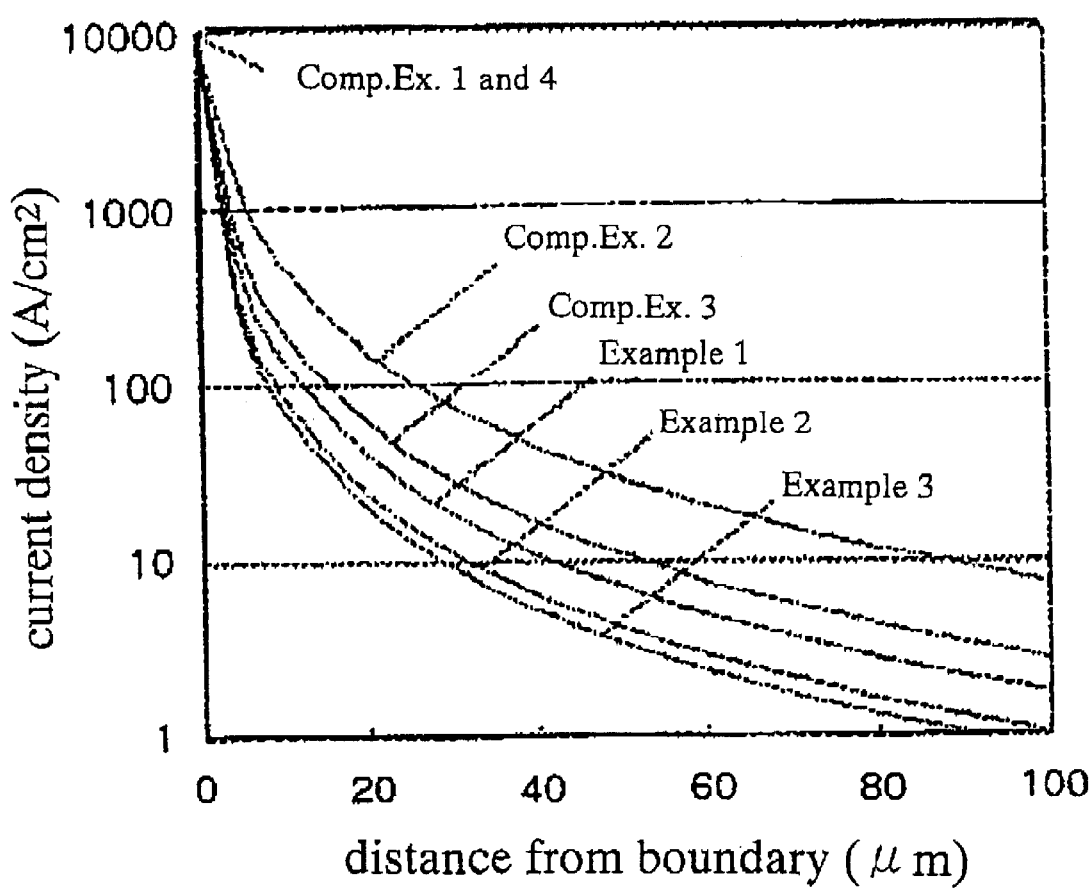
FIG. 11 is a diagram illustrative of variations in calculated current density in the current non-injection region of the ridge waveguide a over distances from boundary between the current injection region and the current non-injection region for each of the first to fourth comparative semiconductor light-emitting devices and of the first to third novel semiconductor light-emitting devices.

FIG. 11 is a diagram illustrative of variations in calculated current density in the current non-injection region of the ridge waveguide over distances from boundary between the current injection region and the current non-injection region for each of the first to fourth comparative semiconductor light-emitting devices and of the first to third novel semiconductor light-emitting devices. The calculation was made by simplification of the system and without boundary conditions at the boundaries between the current injection region and the current non-injection region, and also assumptions that the width of the waveguide and the length of the current non-injection regions would be infinite, and further condition that the current density of the current injection region is about 10 kA/cm$^2$. This supposes 300 mA driving current and 3 micrometers stripe-width of the waveguide. FIG. 11 shows that those devices have differences in sheet resistance to currents which flow in lateral directions through the cladding layer provided between the separate confinement hetero-structure layer and the current blocking layers, and thus those devices have differences in the current density.

The first and fourth comparative semiconductor light-emitting devices are free of the current non-injection regions, for which reasons the first and fourth comparative semiconductor light-emitting devices have no current density curve.

The second comparative semiconductor light-emitting device has a current density of 80 A/cm2 at a position distanced by 30 micrometers from the boundary between the current injection region and the current non-injection region. The third comparative semiconductor light-emitting device has a current density of 30 A/cm2 at a position distanced by 30 micrometers from the boundary between the current injection region and the current non-injection region. The first novel semiconductor light-emitting device has a current density of 20 A/cm2 at a position distanced by 30 micrometers from the boundary between the current injection region and the current non-injection region. The second novel semiconductor light-emitting device has a current density of 13 A/cm2 at a position distanced by 30 micrometers from the boundary between the current injection region and the current non-injection region. The third novel semiconductor light-emitting device has a current density of 9 A/cm2 at a position distanced by 30 micrometers from the boundary between the current injection region and the current non-injection region.

The degree of the improvement in the maximum optical output depends on the current density at the facets, wherein the current density at the facets depends on the sheet resistance. With further reference to the results shown on the above table 1, the recognizable improvement of 5% is obtained at the current density of 30 A/cm2 by the third comparative semiconductor light-emitting device. A further improvement of 13% is obtained at the current density of 20 A/cm2 by the first novel semiconductor light-emitting device. A further more improvement of 20% is obtained at the current density of 13 A/cm2 by the second novel semiconductor light-emitting device. A more over improvement of 24% is obtained at the current density of 9 A/cm2 by the third novel semiconductor light-emitting device.

Under the condition that the current density is less than 10 A/cm2, it is assumed that the critical optical output for causing the optical break exceeds the critical optical output for causing the heat saturation. The necessary length of the current non-injection region in the cavity length direction for the above devices as follows. The necessary length of the current non-injection region of the second comparative semiconductor light-emitting device is 87 micrometers. The necessary length of the current non-injection region of the third comparative semiconductor light-emitting device is 52 micrometers. The necessary length of the current non-injection region of the first novel semiconductor light-emitting device is 41 micrometers. The necessary length of the current non-injection region of the second novel semiconductor light-emitting device is 31 micrometers. The necessary length of the current non-injection region of the third novel semiconductor light-emitting device is 29 micrometers. If the drop of the slope efficiency due to the increase in the length of the non-current injection region is ignored, the above lengths of the current non-injection regions allow providing the non-injection current effects for every the above devices.

The current non-injection current regions have small current densities with non-uniform density distributions, for which reason the current non-injection current regions have larger waveguide loss due to internal absorption as compared to the current injection region. Therefore, as the length of the current non-injection regions becomes long, the waveguide loss becomes large, whereby the threshold current is increased and the slope efficiency is deceased. Those undesirable influences become remarkable if the total length of the current non-injection regions exceeds 10% of the total cavity length. In order to avoid the undesirable influences, it is preferable that the total length of the current non-injection regions is not more than 10% of the total cavity length. If the total cavity length is about 900 micrometers, the length of each of the current non-injection regions is not more than 50 micrometers.

The above novel semiconductor light-emitting devices satisfy the above requirements for the acceptable range in ratio of the total length of the current non-injection regions to the total cavity length as well as for obtaining the high current non-injection effects.

In the foregoing descriptions, the ridge waveguide structure comprises the p-type cladding layer. It is, however, possible that the ridge waveguide structure comprises the n-type cladding layer, provided that the conductivity types of the respective layers are inverted, for example, the n-type contact layer, the p-type current blocking layers.

The above current blocking structure utilizes the reverse-biased p-n junction. However, as long as the optical confinement in the current non-injection regions of the ridge waveguide is obtained, then an n-i-n structure or a p-i-p structure is also available, wherein the current blocking layers are made of an electrically insulating material, for example, a dielectric material or a polyimide. In this case, it is necessary that the current blocking layer is lower in refractive index than the cladding layer of the ridge waveguide structure.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A ridge waveguide structure of a cladding layer in a semiconductor light emitting device, said ridge waveguide structure comprising:

at least a current injection region; and current non-injection regions adjacent to facets and separating said current injection region from said facets, wherein the current non-injection regions are smaller in height than said at least current injection region, and wherein said at least current injection region and said current non-injection regions have a uniform width at least at a lower level than an intermediate level of said ridge waveguide structure.

2. The ridge waveguide structure as claimed in claim 1, wherein said lower level is a bottom level.

3. The ridge waveguide structure as claimed in claim 2, wherein said at least current injection region and said current non-injection regions are substantially identical with each other in width from a bottom level to said intermediate level of said ridge waveguide structure.

4. The ridge waveguide structure as claimed in claim 3, wherein said at least current injection region and said current non-injection regions are substantially identical with each other in width from a bottom level to a top level of said ridge waveguide structure.

5. The ridge waveguide structure as claimed in claim 1, wherein the ridge waveguide structure comprises laminations of lower and upper cladding layers, and the lower cladding layer is lower in doping concentration than the upper cladding layer, so that said lower cladding layer has a uniform thickness and said upper cladding layer on said current non-injection regions is smaller in thickness than said upper cladding layer on the current injection region.

6. The ridge waveguide structure as claimed in claim 1, wherein said current injection region) of said ridge waveguide structure comprises laminations of lower and upper cladding layers, and said current non-injection regions of said ridge waveguide structure comprise the lower cladding layer, and the lower cladding layer is lower in doping concentration than the upper cladding layer.

7. The ridge waveguide structure as claimed in claim 1, wherein the ridge waveguide structure, comprises laminations of lower and upper cladding layers, and said lower cladding layer is higher in refractive index than said upper cladding layer, so that said lower cladding layer has a uniform thickness and said upper cladding layer on said current non-injection regions is smaller in thickness than said upper cladding layer on the current injection region.

8. The ridge waveguide structure as claimed in claim 1, wherein said current injection region of said ridge waveguide structure comprises laminations of lower and upper cladding layers, and said current non-injection regions comprise said lower cladding layer, and said lower cladding layer is higher in refractive index than said upper cladding layer.

9. The ridge waveguide structure as claimed in claim 1, wherein the ridge waveguide structure comprises a single cladding layer.

10. The ridge waveguide structure as claimed in claim 1, wherein a height of said current non-injection regions is in a range of 40% to 70% of a height of said current injection region.

11. The ridge waveguide structure as claimed in claim 1, wherein a total length of said current non-injection regions is not more than 10% of a longitudinal length of said ridge waveguide structure.

12. The ridge waveguide structure as claimed in claim 1, further comprising;

a cap layer in contact with an tipper surface of said at least current injection region; and a current blocking layer in contact with side walls of said ridge waveguide structure and also in contact with upper surfaces of said current non-injection regions.

13. The ridge waveguide structure as claimed in claim 1, wherein side walls of said ridge waveguide structure comprise non-flat surfaces with a curvature in a direction from a bottom to a top of said ridge waveguide structure.

14. The ridge waveguide structure as claimed in claim 13, wherein said non-flat surfaces with said curvature are obtained by an isotropic etching.

15. The ridge waveguide structure as claimed in claim 1, wherein said ridge waveguide structure extends directly over a stripe-shaped selective region of an upper surface of an etching stopper layer.

16. A ridge waveguide structure of a cladding layer in a semiconductor light emitting device, said ridge waveguide structure extending directly over a stripe-shaped selective region of an upper surface of an etching stopper layer, and said ridge waveguide structure comprising:

at least a current injection region; and current non-injection regions adjacent to facets and separating said current injection region from said facets, wherein the current non-injection regions are smaller in height than said at least current injection region, and wherein said at least current injection region and said current non-injection regions are uniform in width from a bottom level to a top level of said ridge waveguide structure, so that side walls of said ridge waveguide structure are continuous and smooth at boundaries between said at least current injection region and said current non-injection side regions.

17. The ridge waveguide structure as claimed in claim 16, wherein the ridge waveguide structure comprises laminations of lower and upper cladding layers, and the lower cladding layer is lower in doping concentration than the upper cladding layer, so that said lower cladding layer has a uniform thickness and said upper cladding layer on said current non-injection regions is smaller in thickness than said upper cladding layer on the current injection region.

18. The ridge waveguide structure as claimed in claim 16, wherein said current injection region of said ridge waveguide structure comprises laminations of lower and upper cladding layers, and said current non-injection regions of said ridge waveguide structure comprise the lower cladding layer, and the lower cladding layer is lower in doping concentration than the upper cladding layer.

19. The ridge waveguide structure as claimed in claim 16, wherein the ridge waveguide structure comprises laminations of lower and upper cladding layers, and said lower cladding layer is higher in refractive index than said upper cladding layer, so that said lower cladding layer has a uniform thickness and said upper cladding layer on said current non-injection regions is smaller in thickness than said upper cladding layer on the current injection region.

20. The ridge waveguide structure as claimed in claim 16, wherein said current injection region of said ridge waveguide structure comprises laminations of lower and upper cladding layers, and said current non-injection regions comprise said lower cladding layer, and said lower cladding layer is higher in refractive index than said upper cladding layer.

21. The ridge waveguide structure as claimed in claim 16, wherein the ridge waveguide structure comprises a single cladding layer.

22. The ridge waveguide structure as claimed in claim 16, wherein a height of said current non-injection regions is in a range of 40% to 70% of a height of said current injection region.

23. The ridge waveguide structure as claimed in claim 16, wherein a total length of said current non-injection regions is not more than 10% of a longitudinal length of said ridge waveguide structure.

24. The ridge waveguide structure as claimed in claim 16, further comprising;
   a cap layer in contact with an upper surface of said at least current injection region; and
   a current blocking layer in contact with side walls of said ridge waveguide structure and also in contact with upper surfaces of said current non-injection regions.

25. The ridge waveguide structure as claimed in claim 16, wherein side walls of said ridge waveguide structure comprise non-flat surfaces with a curvature in a direction from a bottom to a top of said ridge waveguide structure.

26. The ridge waveguide structure as claimed in claim 25, wherein said non-flat surfaces with said curvature are obtained by an isotropic etching.

27. A semiconductor light-emitting device comprising:
   a substrate;
   a first multi-layered structure of a first conductivity type overlying said substrate;
   an active region overlying said first multi-layered structure;
   a second multi-layered structure of a second conductivity type overlying said active region; and
   at least a ridge waveguide structure of said second conductivity type overlying at least a stripe-shaped selective region of an upper surface of said second multi-layered structure, said at least ridge waveguide structure further comprising: at least a current injection region; and current non-injection regions adjacent to facets and separating said current injection region from said facets,
   wherein the current non-injection regions are smaller in height than said at least current injection region, and
   wherein said at least current injection region and said current non-injection regions have a uniform width at least at a lower level than an intermediate level of said ridge waveguide structure.

28. The semiconductor light-emitting device as claimed in claim 27, wherein said lower level is a bottom level.

29. The semiconductor light-emitting device as claimed in claim 28, wherein said at least current injection region and said current non-injection regions are substantially identical with each other in width from a bottom level to said intermediate level of said ridge waveguide structure.

30. The semiconductor light-emitting device as claimed in claim 29, wherein said at least current injection region and said current non-injection regions are substantially identical with each other in width from a bottom level to a top level of said ridge waveguide structure.

31. The semiconductor light-emitting device as claimed in claim 27, wherein the ridge waveguide structure comprises laminations of lower and upper cladding layers, and the lower cladding layer is lower in doping concentration than the upper cladding layer, so that said lower cladding layer has a uniform thickness and said upper cladding layer on said current non-injection regions is smaller in thickness than said upper cladding layer on the current injection region.

32. The semiconductor light-emitting device as claimed in claim 27, wherein said current injection region of said ridge waveguide structure comprises laminations of lower and upper cladding layers, and said current non-injection regions of said ridge waveguide structure comprise the lower cladding layer, and the lower cladding layer is lower in doping concentration than the upper cladding layer.

33. The semiconductor light-emitting device as claimed in claim 27, wherein the ridge waveguide structure comprises laminations of lower and upper cladding layers, and said lower cladding layer is higher in refractive index than said upper cladding layer, so that said lower cladding layer has a uniform thickness and said upper cladding layer on said current non-injection regions is smaller in thickness than said upper cladding layer on the current injection region.

34. The semiconductor light-emitting device as claimed in claim 27,
   wherein said current injection region of said ridge waveguide structure comprises laminations of lower and upper cladding layers, and said current non-injection regions comprise said lower cladding layer, and said lower cladding layer is higher in refractive index than said upper cladding layer.

35. The semiconductor light-emitting device as claimed in claim 27, wherein the ridge waveguide structure comprises a single cladding layer.

36. The semiconductor light-emitting device as claimed in claim 27, wherein a height of said current non-injection regions is in a range of 40% to 70% of a height of said current injection region.

37. The semiconductor light-emitting device as claimed in claim 27, wherein a total length of said current non-injection regions is not more than 10% of a longitudinal length of said ridge waveguide structure.

38. The semiconductor light-emitting device as claimed in claim 27, further comprising;
   a cap layer in contact with an upper surface of said at least current injection region; and
   a current blocking layer in contact with side walls of said ridge waveguide structure and also in contact with upper surfaces of said current non-injection regions.

39. The semiconductor light-emitting device as claimed in claim 27, wherein side walls of said ridge waveguide structure comprise non-flat surfaces with a curvature in a direction from a bottom to a top of said ridge waveguide structure.

40. The semiconductor light-emitting device as claimed in claim 39, wherein said non-flat surfaces with said curvature are obtained by an isotropic etching.

41. The semiconductor light-emitting device as claimed in claim 27, wherein said ridge waveguide structure extends directly over a stripe-shaped selective region of an upper surface of an etching stopper layer.

42. A method of forming a ridge waveguide structure, said method comprising the steps of:
   forming a first etching mask on a first selected region of an upper surface of a cap layer overlying at least a cladding layer, said first selected region being separated by side regions adjacent to opposite edges distanced in a cavity length direction;
   selectively removing said cap layer by using said first etching mask, so that said cap layer remains only on said first selected region, and an upper surface of said at least cladding layer is partially exposed on said side regions adjacent to said opposite edges;
   forming a second etching mask overlying a stripe-shaped longitudinal center region extending through said remaining cap layer and said at least cladding layer, so that said upper surfaces of said remaining cap layer and said at least cladding layer are partially exposed on other side regions adjacent to other opposite edges distanced in a lateral direction perpendicular to said cavity length direction;

selectively removing said remaining cap layer by using said second etching mask, so that said cap layer remains only on a first overlapping region of said first selected region and said stripe-shaped longitudinal center region;

selectively removing said at least cladding layer only on said other side regions by using said second etching mask, so that said at least cladding layer becomes comprising a mesa structure portion on said stripe-shaped longitudinal center region and flat thickness-reduced portions on said other side regions, said mesa structure portion having a first height higher than a second height of said flat thickness-reduced portions;

forming a third etching mask overlying on said first overlapping regions, so that an upper surface of said mesa structure portion is exposed, except under said cap layer on said first overlapping region; and selectively removing said at least cladding layer by using said third etching mask, so that said at least cladding layer remains only on said stripe-shaped longitudinal center region, and said mesa structure portion is selectively reduced in thickness except under said cap layer, whereby said remaining cladding layer comprises a mesa structure having a uniform bottom width, and said mesa structure comprising a current injection region having said first height and current non-injection regions having a third height lower than said first height.

43. The method as claimed in claim 42, wherein said at least cladding layer overlies an etching stopper layer, and said step of selectively removing said at least cladding layer by using said third etching mask comprises an isotropic etching to said at least cladding layer, and an etching depth of said isotropic etching is defined an upper surface of said etching stopper layer.

44. The method as claimed in claim 43, wherein said at least cladding layer comprises laminations of lower and upper cladding layers, and the lower cladding layer is lower in doping concentration than the upper cladding layer, and wherein said isotropic etching is stopped not to etch said lower layer on said stripe-shaped longitudinal center region, so that said lower cladding layer has a uniform thickness and said upper cladding layer on said currant non-injection regions is smaller in thickness than said upper cladding layer on the current injection region.

45. The method as claimed in claim 42, wherein said at least cladding layer comprises laminations of lower and upper cladding layers, and said lower cladding layer is higher in refractive index than said upper cladding layer, and wherein said isotropic etching is stopped not to etch said lower layer on said stripe-shaped longitudinal center region, so that said lower cladding layer has a uniform thickness and said upper cladding layer on said current non-injection regions is smaller in thickness than said upper cladding layer on the current injection region.

46. A method of forming a ridge waveguide structure, said method comprising the steps of:

forming a first etching mask on a stripe-shaped longitudinal center region of an upper surface of a cap layer overlying at least a cladding layer, said stripe-shaped longitudinal center region extending between first opposite edges distanced from each other in a cavity length direction, and said stripe-shaped longitudinal center region being separated by side regions adjacent to second opposite edges, which are parallel to a cavity length direction and which are distanced from each other in a lateral direction perpendicular to said cavity length direction;

selectively removing said cap layer and said at least cladding layer by using said first etching mask, so that said cap layer remains only on said stripe-shaped longitudinal center region, and a thickness of said at least cladding layer on said side regions is reduced, whereby said at least cladding layer becomes comprising a mesa structure portion on said stripe-shaped longitudinal center region and flat thickness-reduced portions on said side regions, said mesa structure portion having a first height higher than a second height of said flat thickness-reduced portions;

forming a second etching mask overlying a first overlapping region of said stripe-shaped longitudinal center region and a first selected region being separated by other side regions adjacent to said first opposite edges distanced in said cavity length direction;

selectively removing said remaining cap layer by using said second etching mask, so that said cap layer remains only on said first overlapping region; and selectively removing said at least cladding layer by using said second etching mask, so that said at least cladding layer remains only on said stripe-shaped longitudinal center region, and said mesa structure portion is selectively reduced in thickness except under said cap layer, whereby said remaining cladding layer comprises a mesa structure having a uniform bottom width, and said mesa structure comprising a current injection region having said first height and current non-injection regions having a third height lower than said first height.

47. The method as claimed in claim 46, wherein said at least cladding layer overlies an etching stopper layer, and said step of selectively removing said at least cladding layer by using said third etching mask comprises an isotropic etching to said at least cladding layer, and an etching depth of said isotropic etching is defined an upper surface of said etching stopper layer.

48. The method as claimed in claim 46, wherein said at least cladding layer comprises laminations of lower and upper cladding layers, and the lower cladding layer is lower in doping concentration than the upper cladding layer, and wherein said isotropic etching is stopped not to etch said lower layer on said stripe-shaped longitudinal center region, so that said lower cladding layer has a uniform thickness and said upper cladding layer on said current non-injection regions is smaller in thickness than said upper cladding layer on the current injection region.

49. The method as claimed in claim 46, wherein said at least cladding layer comprises laminations of lower and upper cladding layers, and said lower cladding layer is higher in refractive index than said upper cladding layer, and wherein said isotropic etching is stopped not to etch said lower layer on said stripe-shaped longitudinal center region, so that said lower cladding layer has a uniform thickness and said upper cladding layer on said current non-injection regions is smaller in thickness than said upper cladding layer on the current injection region.

50. A method of forming a ridge waveguide structure, said method comprising the steps of:

forming a first etching mask on a stripe-shaped longitudinal center region of an upper surface of a cap layer overlying at least a cladding layer, said stripe-shaped longitudinal center region extending between first opposite edges distanced from each other in a cavity length direction, and said stripe-shaped longitudinal center region being separated by side regions adjacent to second opposite edges, which are parallel to a cavity length direction and which are distanced from each other in a lateral direction perpendicular to said cavity length direction;

selectively removing said cap layer by using said first etching mask, so that said cap layer remains only on said stripe-shaped longitudinal center region;

forming a second etching mask overlying a first overlapping region of said stripe-shaped longitudinal center region and a first selected region being separated by other side regions adjacent to said first opposite edges distanced in said cavity length direction;

selectively removing said remaining cap layer and said at least cladding layer by using said second etching mask, so that said cap layer remains only on said first overlapping region, and a thickness of said at least cladding layer on said side regions is reduced, whereby said at least cladding layer becomes comprising a mesa structure portion on said stripe-shaped longitudinal center region and flat thickness-reduced portions on said side regions, said mesa structure portion having a first height higher than a second height of said flat thickness-reduced portions;

further selectively removing said at least cladding layer by using said second etching mask, so that said at least cladding layer remains only on said stripe-shaped longitudinal center region, and said mesa structure portion is selectively reduced in thickness except under said cap layer, whereby said remaining cladding layer comprises a mesa structure having a uniform bottom width, and said mesa structure comprising a current injection region having said first height and current non-injection regions having a third height lower than said first height.

51. The method as claimed in claim 50, wherein said at least cladding layer overlies an etching stopper layer, and said step of selectively removing said at least cladding layer by using said third etching mask comprises an isotropic etching to said at least cladding layer, and an etching depth of said isotropic etching is defined an upper surface of said etching stopper layer.

52. The method as claimed in claim 50, wherein said at least cladding layer comprises laminations of lower and upper cladding layers, and the lower cladding layer is lower in doping concentration than the upper cladding layer, and wherein said isotropic etching is stopped not to etch said lower layer on said stripe-shaped longitudinal center region, so that said lower cladding layer has a uniform thickness and said upper cladding layer on said current non-injection regions is smaller in thickness than said upper cladding layer on the current injection region.

53. The method as claimed in claim 50, wherein said at least cladding layer comprises laminations of lower and upper cladding layers, and said lower cladding layer is higher in refractive index than said upper cladding layer, and wherein said isotropic etching is stopped not to etch said lower layer on said stripe-shaped longitudinal center region, so that said lower cladding layer has a uniform thickness and said upper cladding layer on said current non-injection regions is smaller in thickness than said upper cladding layer on the current injection region.

* * * * *